US012167541B2

(12) United States Patent
Xu et al.

(10) Patent No.: US 12,167,541 B2
(45) Date of Patent: Dec. 10, 2024

(54) METHOD AND SYSTEM FOR TRANSFER PRINTING OF FILMS

(71) Applicant: University of Virginia Patent Foundation, Charlottesville, VA (US)

(72) Inventors: Baoxing Xu, Charlottesville, VA (US); Yue Zhang, Philadelphia, PA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 17/793,910

(22) PCT Filed: Nov. 20, 2020

(86) PCT No.: PCT/US2020/061589
§ 371 (c)(1),
(2) Date: Jul. 19, 2022

(87) PCT Pub. No.: WO2021/154371
PCT Pub. Date: Aug. 5, 2021

(65) Prior Publication Data
US 2023/0051993 A1 Feb. 16, 2023

Related U.S. Application Data

(60) Provisional application No. 62/966,193, filed on Jan. 27, 2020.

(51) Int. Cl.
*H05K 3/20* (2006.01)
*B44C 1/175* (2006.01)

(52) U.S. Cl.
CPC ............ *H05K 3/20* (2013.01); *B44C 1/1752* (2013.01)

(58) Field of Classification Search
None
See application file for complete search history.

(56) References Cited

U.S. PATENT DOCUMENTS

| 4,010,057 A | 3/1977 | Nakanishi |
| 4,436,571 A | 3/1984 | Nakanishi |

(Continued)

FOREIGN PATENT DOCUMENTS

| CN | 107663398 A | 2/2018 |
| EP | 1262531 B1 | 12/2002 |

(Continued)

OTHER PUBLICATIONS

Khang Dahl-Young, et al., "A stretchable form of single-crystal silicon for high-performance electronics on rubber substrates", Science, vol. 311, Jan. 13, 2006, pp. 208-212.

(Continued)

*Primary Examiner* — Joshua D Zimmerman
(74) *Attorney, Agent, or Firm* — Robert J. Decker

(57) ABSTRACT

The capillary transfer technology presented here represents a powerful approach to transfer soft films from surface of liquid onto a solid substrate in a fast and defect-free manner. The fundamental theoretical model and transfer criteria validated with comprehensive experiments and finite element analyses, for the first time provides a quantitative guide and optimization for the choice of material systems, operating conditions and environments for scalable on-demand transfers with high yield. The intrinsically moderate capillary transfer force and externally selectable transfer direction offer robust capabilities for achieving deterministic assembly and surface properties of structures with complex layouts and patterns for potentially broad applications in the fabrication of flexible/stretchable electronics, surface wetting structures and optical devices. Integration of this technology with other advanced manufacturing technologies associated with material self-assembly, growth and layout alignment represents promising future topics and would help (Continued)

create emerging new manufacturing technologies that leverage unique fluidity of liquid environments.

36 Claims, 34 Drawing Sheets

(56) References Cited

U.S. PATENT DOCUMENTS

| | | | |
|---|---|---|---|
| 6,346,313 | B1 | 2/2002 | Cook |
| 2011/0265953 | A1 | 11/2011 | Kroell |
| 2012/0174806 | A1 | 7/2012 | Spoor et al. |
| 2013/0163867 | A1* | 6/2013 | Cincotti ............... G06T 11/001 382/302 |
| 2016/0229213 | A1 | 8/2016 | Neuhaus |
| 2019/0351696 | A1* | 11/2019 | Harnois ................. B41F 7/02 |

FOREIGN PATENT DOCUMENTS

| | | |
|---|---|---|
| GB | 202835 A | 8/1923 |
| JP | 2010076269 A | 4/2010 |

OTHER PUBLICATIONS

Mahenderkar, Naveen K., et al, "Epitaxial lift-off of electrodeposited single-crystal gold foils for flexible electronics", Science, vol. 355, Mar. 17, 2017, pp. 1203-1206.

Kim, Dae-Hyeong, et al., "Epidermal electronics", science, vol. 333, Aug. 12, 2011, pp. 838-843.

Larson, Christina, et al., "Highly stretchable electroluminescent skin for optical signaling and tactile sensing", Science, vol. 351, Mar. 4, 2016, pp. 1071-1074.

Tian, Bozhi, et al., "Macroporous nanowire nanoelectronic scaffolds for synthetic tissues", Nature materials, vol. 11, Nov. 2012, pp. 986-994.

Mickle, Aaron D., et al., "A wireless closed-loop system for optogenetic peripheral neuromodulation", Nature, vol. 565, Jan. 17, 2019, p. 361-365.

Jinno, Hiroaki, et al., "Stretchable and waterproof elastomer-coated organic photovoltaics for washable electronic textile applications", Nature Energy, vol. 2, Published online Sep. 18, 2017, 6 pages.

Zhao, Jie, et al., "Air-stable and freestanding lithium alloy/graphene foil as an alternative to lithium metal anodes", Nature nanotechnology, vol. 12, Published online Jul. 10, 2017, p. 993-999.

Wu, Wenzhuo, et al., "Piezoelectricity of single-atomic-layer $MoS_2$ for energy conversion and piezotronics", Nature, vol. 514, Oct. 23, 2014, 18 pages.

Li, Mo, et al., "Ultra-sensitive NEMS-based cantilevers for sensing, scanned probe and very high-frequency applications", Nature nanotechnology, vol. 2, Published online Jan. 28, 2007, pp. 114-119.

Chen, Xi, et al., "Bacillus spores as building blocks for stimuli-responsive materials and nanogenerators", Nature nanotechnology, vol. 9, Published online Jan. 26, 2014, pp. 137-141.

Carlson, Andrew, et al., "Transfer printing techniques for materials assembly and micro/nanodevice fabrication", Advanced Materials, vol. 24, Published online Aug. 31, 2012, pp. 5284-5318.

Chang, Jan-Kai, et al., "Materials and processing approaches for foundry-compatible transient electronics", Proceedings of the National Academy of Sciences, vol. 114, Published online Jun. 26, 2017, pp. E5522-E5529.

Pirkle, A., et al., "The effect of chemical residues on the physical and electrical properties of chemical vapor deposited graphene transferred to $SiO_2$", Applied Physics Letters, vol. 99, Published online Sep. 23, 2011, pp. 122108-1 to 12208-3.

Suk, Ji Won, et al., "Transfer of CVD-grown monolayer graphene onto arbitrary substrates", ACS nano, vol. 5, Published online Sep. 6, 2011, pp. 6916-6924.

Jeon, Intak, et al., "Janus Graphene: Scalable Self-Assembly and Solution-Phase Orthogonal Functionalization", Advanced Materials, vol. 31, Apr. 10, 2019, p. 1900438-1 to 1900438-7.

Xiao, Peng, et al., "Hydrophilic/Hydrophobic Interphase-Mediated Bubble-like Stretchable Janus Ultrathin Films toward Self-Adaptive and Pneumatic Multifunctional Electronics", ACS nano, vol. 13, Apr. 10, 2019, pp. 4368-4378.

Yan, Jing, et al., "Bacterial biofilm material properties enable removal and transfer by capillary peeling", Advanced Materials, vol. 30, Nov. 2018, p. 1804153-1 to 1804153-20.

Hoffman, Richard L., "A study of the advancing interface: Interface shape in liquid-gas systems", Journal of colloid and interface science, vol. 50, Feb. 1975, pp. 228-241.

Park, Jonghwa, et al., "Tactile-direction-sensitive and stretchable electronic skins based on human-skin-inspired interlocked microstructures", ACS nano, vol. 8, Published online Nov. 12, 2014, p. 12020-12029.

Koh, Kai-Seng, et al., "Quantitative studies on PDMS-PDMS interface bonding with piranha solution and its swelling effect", Micromachines, vol. 3, May 4, 2012, pp. 427-441.

Miyama, Masayo, et al. "Static and dynamic contact angles of water on polymeric surfaces", Langmuir, vol. 13, 1997, pp. 5494-5503.

Kendall, Kevin., "Thin-film peeling-the elastic term", Journal of Physics D: Applied Physics, vol. 8, 1975, pp. 1449-1452.

Masurel, Robin, et al., "The Elastocapillary Ridge as a Non-integer Disclination", Physical Review Letters, vol. 122, Feb. 4, 2019, 5 pages.

Zhao, Menghua, et al., "Geometrical control of dissipation during the spreading of liquids on soft solids", Proceedings of the National Academy of Sciences, vol. 115, Feb. 20, 2018, pp. 1748-1753.

Karpitschka, Stefan, et al., "Droplets move over viscoelastic substrates by surfing a ridge", Nature communications, vol. 6, Aug. 4, 2015, 7 pages.

Jerison, Elizabeth R., et al., "The Deformation of an elastic substrate by a three-phase contact line", Physical review letters, vol. 106, 2011, 4 pages.

Khodaparast, Sepideh, et al., "Water-based peeling of thin hydrophobic films", Physical review letters, vol. 119, Aug. 31, 2017, 11 pages.

Peng, Zhilong, et al., "Peeling behavior of a viscoelastic thin-film on a rigid substrate", International Journal of Solids and Structures, vol. 51, Available online Oct. 22, 2014, pp. 4596-4603.

Wang, Yu, et al., "Electrochemical delamination of CVD-grown graphene film: toward the recyclable use of copper catalyst", ACS nano, vol. 5, Published online Oct. 30, 2011, pp. 9927-9933.

Jeong, Hyunhak, et al., "Highly uniform monolayer graphene synthesis via a facile pretreatment of copper catalyst substrates using an ammonium persulfate solution", RSC advances, vol. 9, Jul. 3, 2019, p. 20871-20878.

WIPO, "International Search Report and Written Opinion of the International Searching Authority", International patent application No. PCT/0S2020/061589, 11 pages, Mar. 11, 2021.

* cited by examiner

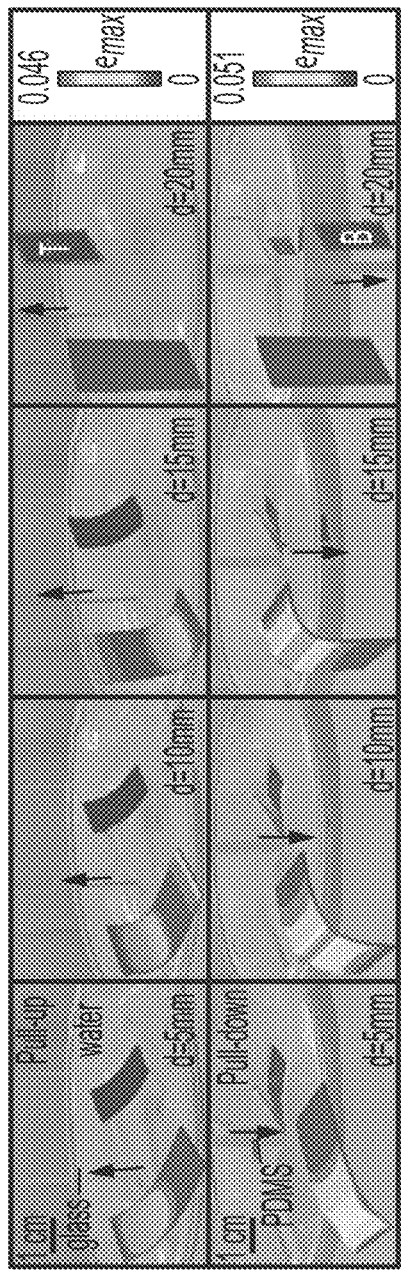
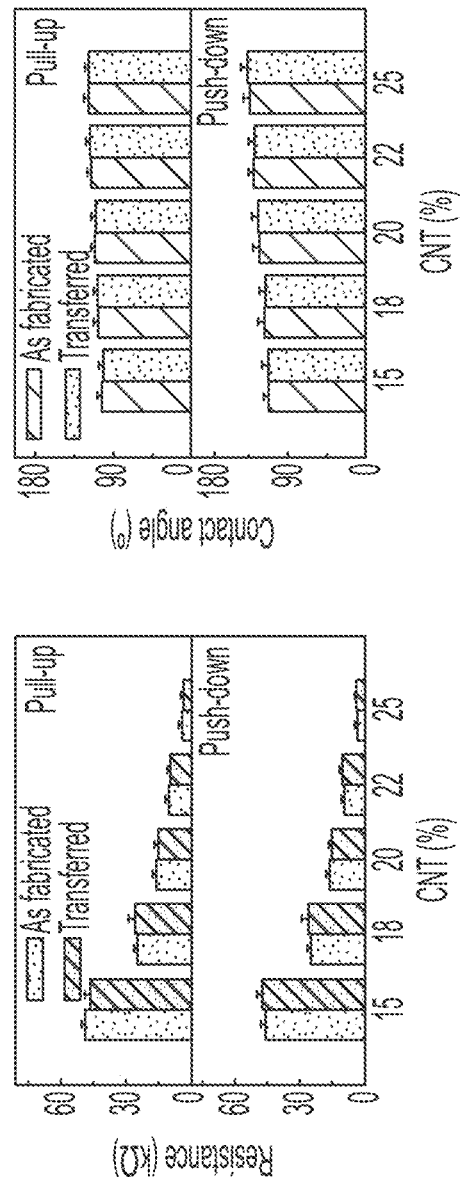
FIG. 4A
FIG. 4B
FIG. 4C

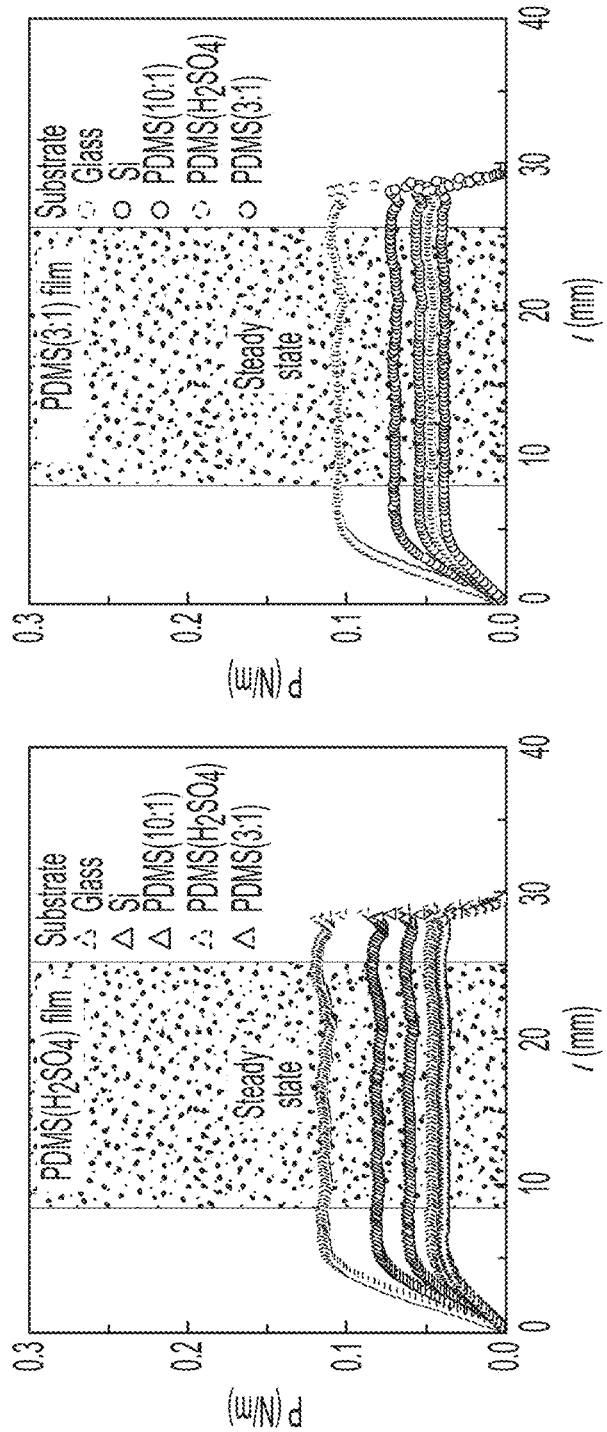
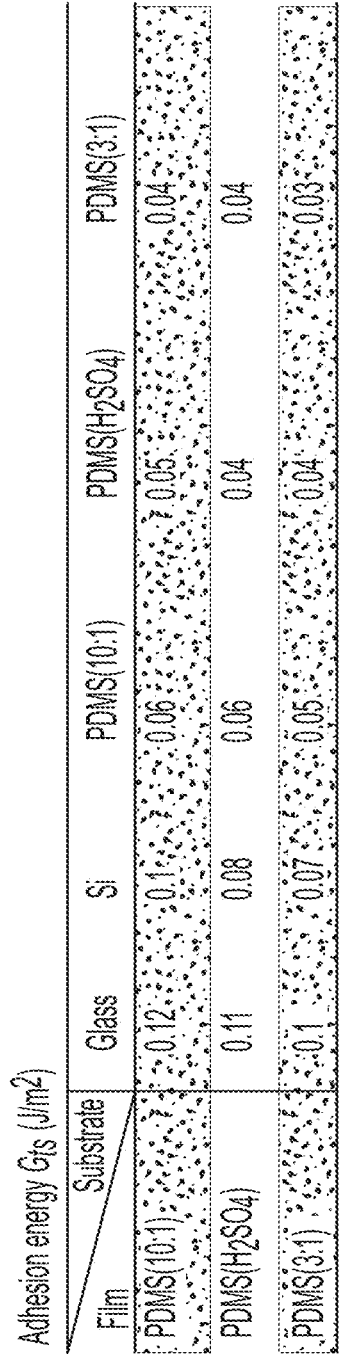
FIG. 10C
FIG. 10D
FIG. 10E

| Samples | E (MPa) | Failure strain | $G_{ts}$ (J/m²) (Smooth on glass) | $G_{ts}$ (J/m²) (Smooth on PDMS) | $G_{ts}$ (J/m²) (Rough on glass) | $G_{ts}$ (J/m²) (Rough on PDMS) |
|---|---|---|---|---|---|---|
| %15 CNT | 1.9 | Null | 0.12 | 0.06 | 0.11 | 0.05 |
| %18 CNT | 2.1 | Null | 0.11 | 0.06 | 0.10 | 0.05 |
| %20 CNT | 2.3 | Null | 0.10 | 0.05 | 0.10 | 0.04 |
| %22 CNT | 2.5 | Null | 0.10 | 0.05 | 0.09 | 0.04 |
| %25 CNT | 2.7 | 0.21 | 0.09 | 0.04 | 0.08 | 0.03 |

METHOD AND SYSTEM FOR TRANSFER PRINTING OF FILMS

CROSS REFERENCE TO RELATED APPLICATIONS

The present application is a national stage filing of International Application No. PCT/US2020/061589, filed Nov. 20, 2020, which claims benefit of priority under 35 U.S.C § 119 (e) from U.S. Provisional Application Ser. No. 62/966,193, filed Jan. 27, 2020, entitled "System and Method for Capillary Transfer of Soft Films"; the disclosures of which are hereby incorporated by reference herein in its entirety.

STATEMENT OF GOVERNMENT INTEREST

This invention was made with government support under Grant No. CMMI-1728149, awarded by the National Science Foundation. The government has certain rights in the invention.

FIELD OF INVENTION

The present disclosure relates generally to a method for transferring films onto substrates using capillary force. More particularly, the present disclosure relates to a method for adhering some sort of film, which can contain a variety of designs and be a variety of materials, onto a substrate using capillary force so as to not deform the film.

BACKGROUND

Films with a low flexural rigidity, referred here to as "soft" films that could be made of a wide variety of materials, not only intrinsically soft materials with a low modulus such as elastomeric/polymeric materials of polydimethylsiloxane (PDMS), but also stiff/brittle materials with micro/nanoscale thickness such as ultrathin silicon membrane (1) and metal foils (2), are the basis for an entire class of wearable technologies in flexible electronics/optoelectronics (3, 4), biomedical devices (5, 6), energy storage and conversion systems (7-9), and micro/nanoelectromechanical systems (10, 11).

Unfortunately, existing technologies that enable a mechanical transfer of these soft films onto receiver substrates for practical applications are based on their as-fabricated, growth or intermediate solid substrates such as glass slides, semiconductor wafers, and native metals. Besides, these processes usually require assistance of external stimuli such as heating (12) or/and chemical etching (13) with sophisticated structural designs and fabrications that help reduce the interfacial energy and facilitate the physical separation of films, and rely largely on trial-and-error methods, which results often in a low yield and inevitable contamination, degradation and/or damage to films (14, 15). Compared with solid native substrates, the liquid phase, an intrinsically deformation-free substrate due to fluidity, provides a unique and tactful platform that helps release residual stress or/and avoid deformation mismatch with surrounding solid constraints during growth, self-assembly and fabrication of materials and structures, and is emerging as a powerful host medium in the preparation of a wide variety of functional films from two-dimensional materials (16), to Janus films (17), and to biofilms (18). Moreover, the fluidity of liquid would allow films to move upwards or downside the liquid substrate, which enabled a selective contact of the two film surfaces with the receiver substrates. However, the conventional transfer approaches and fundamentals of films that are deeply established in the framework of native solid substrates are not applicable for developing a scalable, fast and defect-free transfer technology toward a reliable transferring of film from liquid surface.

There is therefore a need in the art for a superior transfer method and system to provide better transfer of films onto substrates, which is an important initial step in production of various goods such as devices, materials, and components.

There is therefore a need in the art for a faster, cheaper, and more robust method of adhering thin films onto substrates.

SUMMARY OF ASPECTS OF EMBODIMENTS OF THE PRESENT INVENTION

Soft films are the basis for an entire class of wearable technologies in flexible electronics and biomedical devices. The capillary transfer approach disclosed herein establishes a rational route for the fast transfer of soft films from a liquid onto a solid substrate in a well-defined order that allows deterministic assembly of structures with complex layouts and patterns for applications in the fabrication of flexible electronics, surface wetting structures, and optical devices. The developed theoretical models along with validations from extensive experiments and computational analysis provide a fundamental understanding of solid-liquid interactions in response to external mechanical stimuli that can be leveraged in the exploration of emerging fabrication and self-assembly technologies with a broad scope of materials and liquid environments.

Existing transfer technologies in the construction of film-based electronics and devices are deeply established in the framework of native solid substrates. Here, the present inventor reports a capillary approach that enables a fast, robust, and reliable transfer of soft films from liquid in a defect-free manner. This capillary transfer is underpinned by the transfer front of dynamic contact among the receiver substrate, liquid and film and can be well controlled by a selectable moving direction of receiver substrates in a high speed. The present inventor demonstrates in extensive experiments, together with theoretical models and computational analysis, the robust capabilities of the capillary transfer using a versatile set of soft films with a broad material diversity of both film and liquid, surface wetting properties and complex geometric patterns of soft films onto various solid substrates in a deterministic manner.

An aspect of an embodiment of the present invention provides, but is not limited thereto, a capillary approach (related method and system) that enables a fast transfer of soft films from a versatile set of non-corrosive liquid environment in a defect-free manner. This capillary transfer is underpinned by a transfer front that is a dynamic interface of contact among solid receiver substrate, liquid native substrate and transfer film with a small capillary force, and can be well controlled by the moving direction (push-down or pull-up, i.e., advance or retract) of receiver substrates in a high speed, thereby leading to a damage and defect free film delivery with a desirable surface in contact with the receiver substrate. The present inventor demonstrates in extensive experiments, together with theoretical models and computational analysis, the capillary transfer of a versatile set of soft films with a broad material diversity of both film and liquid, thickness, surface wetting properties, and geometric patterns of soft films onto various solid substrates in a well-defined order. With a combination of the push-down and pull-up transfers (i.e., advancement or retraction transfers), we further demonstrate the application capability of capillary transfer in the assembly of multiple-layer structures with a desirable assembly order. The present inventor's approach offers a novel, scalable route for transferring soft films of complex patterns and on-demand surface functions onto substrates, potentially useful for fabrication, assembly and patterning of film-based devices, structures and systems.

An aspect of an embodiment of the present invention provides, but is not limited thereto, a method of transferring a film of a material onto the surface of another material. The technique is intended to allow the manufacture of extremely thin and flexible electronic devices that could be used for wearable technology or in other applications which require the electronics to be flexible. The method could also be applied in other industries and could be used to deposit a wide range of different small films onto many different types of substrates.

An aspect of an embodiment of the present invention provides benefits over other mechanical transfer processes. For example, an aspect of an embodiment of the present invention would allow the film and substrate to be manufactured separately and then combined. For the purpose of electronics manufacture, this could facilitate the manufacture of the film without risking damage to the substrate since they are manufactured separately. If traditional photolithography is used to manufacture the film, this could risk causing damage to the substrate or make it so that certain materials cannot be used as the substrate due to interactions with light or chemicals used in the photolithography process. In an aspect of an embodiment of the present invention, the film could be laid down and patterned on the surface of the water directly and then attached to the substrate. By using the process described in this disclosure, the substrate could be completely removed or retained from the initial manufacture of the film itself. An aspect of an embodiment of the present invention provides a process that allows for more efficient and error-free manufacture compared to current production methods.

An aspect of an embodiment of the present invention provides, but not limited thereto, a transfer printing method for adhering a film onto a substrate. The method may comprise: placing the film on the surface of a liquid so that the film floats or otherwise rests on the surface of the liquid, the film including a proximal edge and a distal edge, wherein the y-axis is defined as perpendicular to the plane of the surface of the liquid, wherein below the plane of the surface of the liquid is the negative y-axis and above the plane of the surface of the liquid is the positive y-axis. The method further comprises: moving the film and the substrate relative to one another until the proximal edge of the film makes contact with the substrate across a transfer front (P) of the substrate; advancing or retracting the substrate at a specified velocity (U), with a specified force (F), relative to the location of the liquid and at a specified substrate angle ($\alpha$) relative to the negative y-axis so that the film elastically deforms onto the advancing or retracting substrate due to capillary force between the liquid and the film; and detaching the film from the liquid and adhering the film onto the advancing or retracting substrate along the transfer front, wherein the film gradually transits across the transfer front among the advancing or retracting substrate, wherein the transfer front is defined as a single line segment or arc wherein the substrate, the film, and the liquid all simultaneously intersect one another and physically contact one another.

An aspect of an embodiment of the present invention provides, but not limited thereto, a capillary transfer technology presented here that represents a powerful approach (method and system) to transfer soft films from surface of liquid onto a solid substrate in a fast and defect-free manner. The fundamental theoretical model and transfer criteria validated with comprehensive experiments and finite element analyses, for the first time provides, but not limited thereto, a quantitative guide and optimization for the choice of material systems, operating conditions and environments for scalable on-demand transfers with high yield. The intrinsically moderate capillary transfer force and externally selectable transfer direction offer robust capabilities for achieving deterministic assembly and surface properties of structures with complex layouts and patterns for potentially broad applications in the fabrication of flexible/stretchable electronics, surface wetting structures and optical devices. Integration of this technology with other advanced manufacturing technologies associated with material self-assembly, growth and layout alignment represents promising future topics and would help create emerging new manufacturing technologies that leverage unique fluidity of liquid environments.

Although example embodiments of the present disclosure are explained in some instances in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It should be appreciated that any of the components or modules referred to with regards to any of the present invention embodiments discussed herein, may be integrally or separately formed with one another. Further, redundant functions or structures of the components or modules may be implemented. Moreover, the various components may be communicated locally and/or remotely with any user/operator/customer/client or machine/system/computer/processor. Moreover, the various components may be in communication via wireless and/or hardwire or other desirable and available communication means, systems and hardware. Moreover, various components and modules may be substituted with other modules or components that provide similar functions.

It should be appreciated that the device and related components discussed herein may take on all shapes along the entire continual geometric spectrum of manipulation of x, y and z planes to provide and meet the environmental, anatomical, and structural demands and operational requirements. Moreover, locations and alignments of the various components may vary as desired or required.

It should be appreciated that various sizes, dimensions, contours, rigidity, shapes, flexibility and materials of any of the components or portions of components in the various embodiments discussed throughout may be varied and utilized as desired or required.

It should be appreciated that while some dimensions are provided on the aforementioned figures, the device may constitute various sizes, dimensions, contours, rigidity, shapes, flexibility and materials as it pertains to the components or portions of components of the device, and therefore may be varied and utilized as desired or required.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, or method steps, even if the other such compounds, material, particles, or method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. All references cited and discussed in this specification are incorporated herein by reference in their entireties and to the same extent as if each reference was individually incorporated by reference.

It should be appreciated that as discussed herein, a subject may be a human or any animal. It should be appreciated that an animal may be a variety of any applicable type, including, but not limited thereto, mammal, veterinarian animal, livestock animal or pet type animal, etc. As an example, the animal may be a laboratory animal specifically selected to have certain characteristics similar to humans (e.g. rat, dog, pig, monkey), etc. It should be appreciated that the subject may be any applicable human patient, for example.

The term "about," as used herein, means approximately, in the region of, roughly, or around. When the term "about" is used in conjunction with a numerical range, it modifies that range by extending the boundaries above and below the numerical values set forth. In general, the term "about" is used herein to modify a numerical value above and below the stated value by a variance of 10%. In one aspect, the term "about" means plus or minus 10% of the numerical value of the number with which it is being used. Therefore, about 50% means in the range of 45%-55%. Numerical ranges recited herein by endpoints include all numbers and fractions subsumed within that range (e.g. 1 to 5 includes 1, 1.5, 2, 2.75, 3, 3.90, 4, 4.24, and 5). Similarly, numerical ranges recited herein by endpoints include subranges subsumed within that range (e.g. 1 to 5 includes 1-1.5, 1.5-2, 2-2.75, 2.75-3, 3-3.90, 3.90-4, 4-4.24, 4.24-5, 2-5, 3-5, 1-4, and 2-4). It is also to be understood that all numbers and fractions thereof are presumed to be modified by the term "about."

The invention itself, together with further objects and attendant advantages, will best be understood by reference to the following detailed description, taken in conjunction with the accompanying drawings.

These and other objects, along with advantages and features of various aspects of embodiments of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings.

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

FIG. 4A provides a photographic depiction alongside a theoretic model of the capillary transfer of PDMS/CNT composite film (thickness in 200 µm) from water surface to glass slide by pull-up transfer and to PDMS slide by push-down transfer.

FIG. 4B graphically illustrates an experimental results comparison of measured electrical resistance of PDMS/CNT composite film before and after transfer using both pull-up and push-down transfer.

FIG. 4C graphically illustrates an experimental results comparison of measured contact angle (θ) (e.g., wettability of the film) of water droplet on the top (smooth) surface (via pull-up transfer) and bottom (rough) surface (via push-down transfer) of composite film before and after transfer. Error bar represents the standard deviation from the mean of 3 independent measurements.

Figure 3:
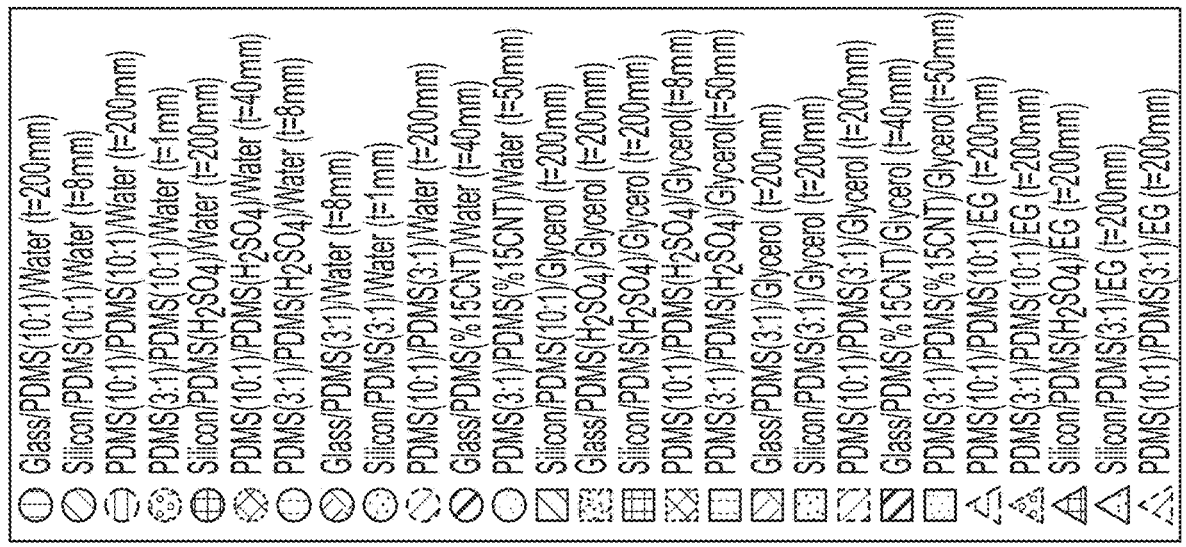
FIG. 3 graphically illustrates experimental results showing phase diagrams of the successful conditions of capillary transfer, which are confirmed on a wide variety of system materials for receiver substrate, soft film, liquid media, film thickness and transfer speed.
Figure 3:
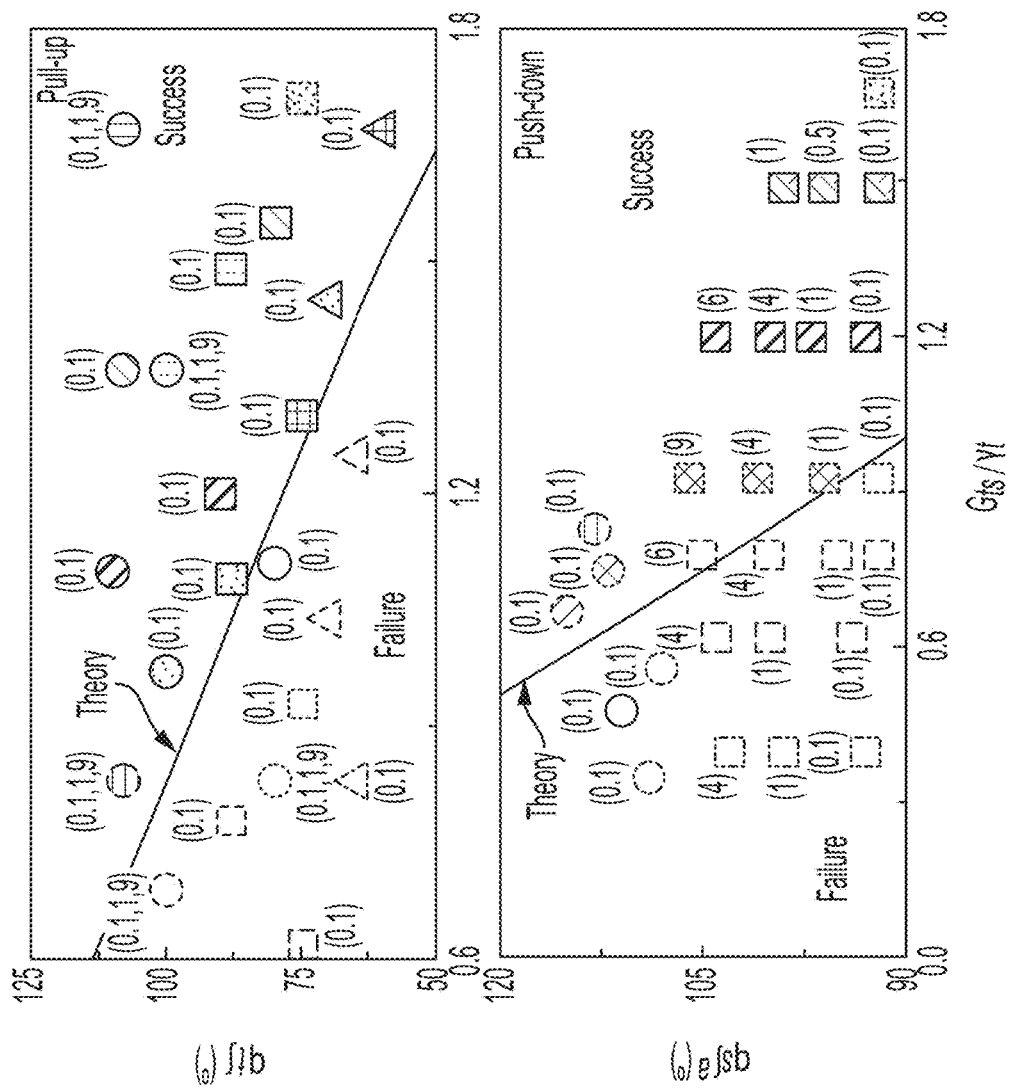

(see FIG. 3 for an analysis without effect of viscous term).

Figure 10A:
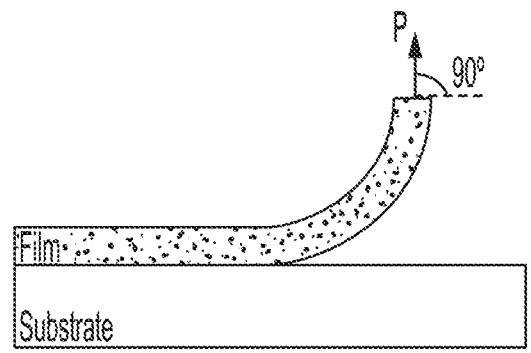

FIG. 10A graphically illustrates the 90-degree peeling test used for measuring the interfacial adhesion energy between film and substrate.

Figure 10B:
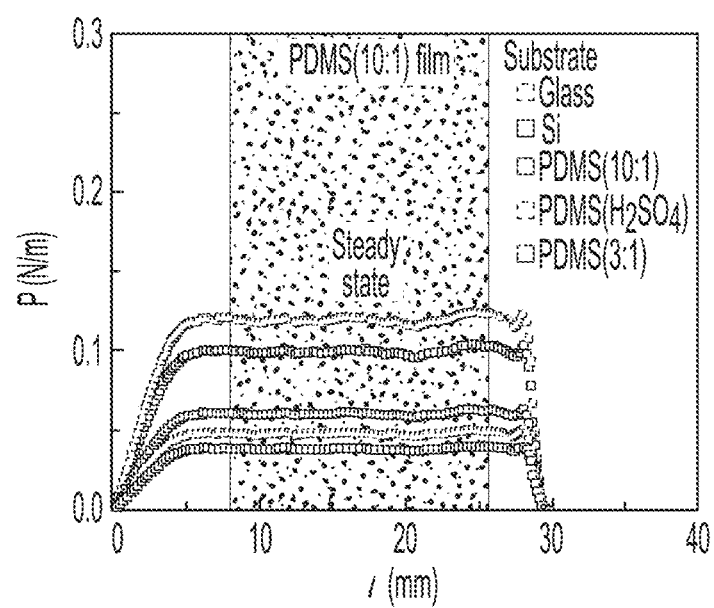

FIG. 10B graphically illustrates the experimentally-measured peeling strength (P) (applied peeling force per unit width)-peeling distance (l) curves obtained from peeling test when peeling PDMS (10:1) film from various substrates.

FIG. 10C graphically illustrates the experimentally-measured peeling strength (P) (applied peeling force per unit width)-peeling distance (l) curves obtained from peeling test when peeling PDMS ($H_2SO_4$) film from various substrates.

FIG. 10D graphically illustrates the experimentally-measured peeling strength (P) (applied peeling force per unit width)-peeling distance (l) curves obtained from peeling test when peeling PDMS (3:1) film from various substrates.

FIG. 10E illustrates a summary of experimentally-measured interfacial adhesion energy $G_{ts}$ between thin film and substrate of various materials.

Figure 11A:
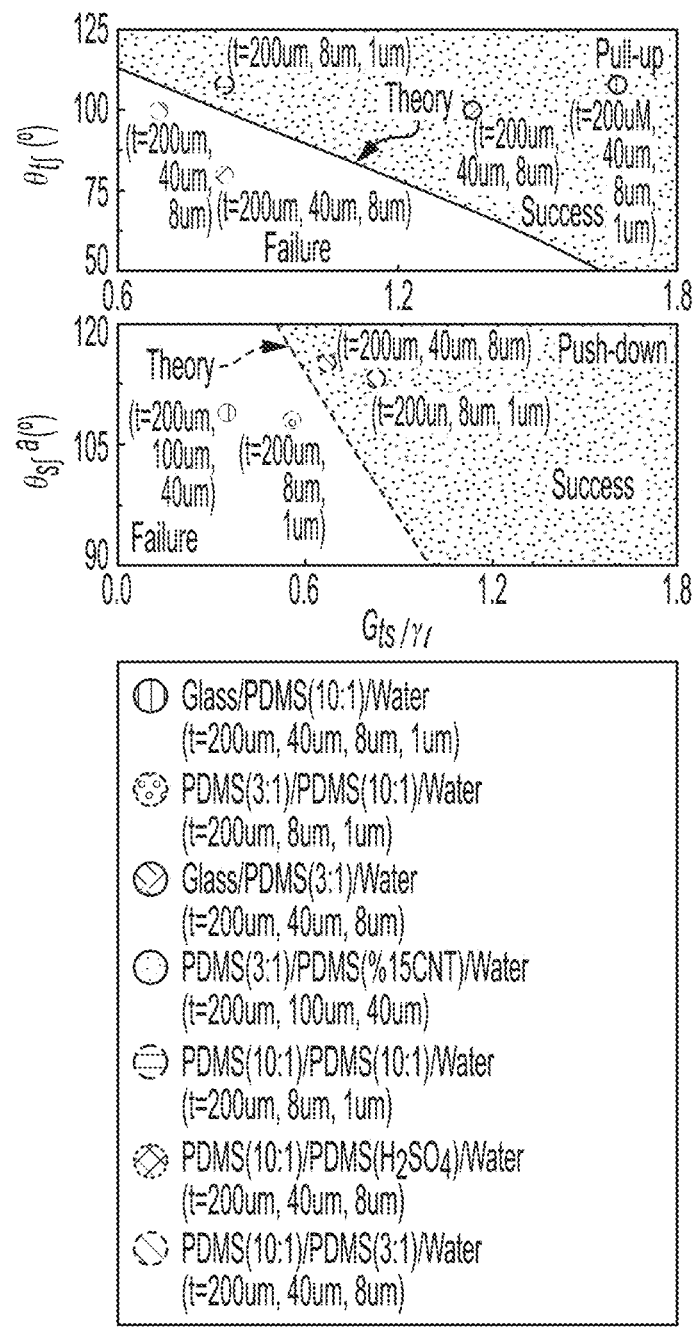

FIG. 11A graphically illustrates a theoretical phase diagram showing the successful conditions of capillary transfer, with additional experimentally-confirmed measurements for a wide variety of materials and thickness for soft film.

Figures 11B, 11C:
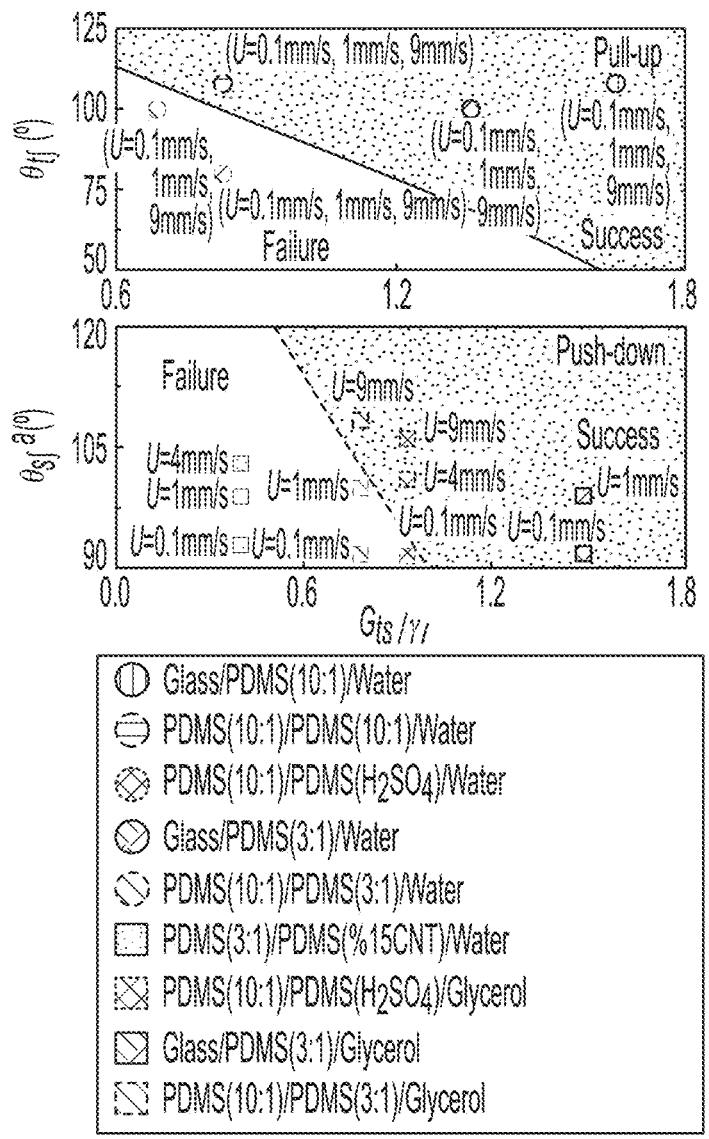

FIG. 11B graphically illustrates experimental and theoretical comparisons of the successful conditions of capillary transfer when the viscous term can be neglected.

FIG. 11C graphically illustrates a comparison of the maximum transfer speed between capillary transfer and existing techniques.

Figure 12A:
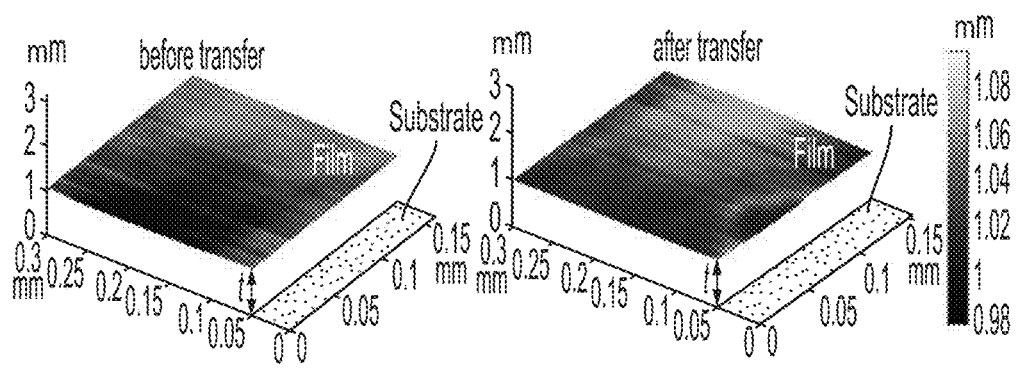

FIG. 12A graphically illustrates the surface topographies of a film with ~ 1 μm thickness before transfer (top) and after transfer (bottom) using pull-up transfer.

Figure 12B:
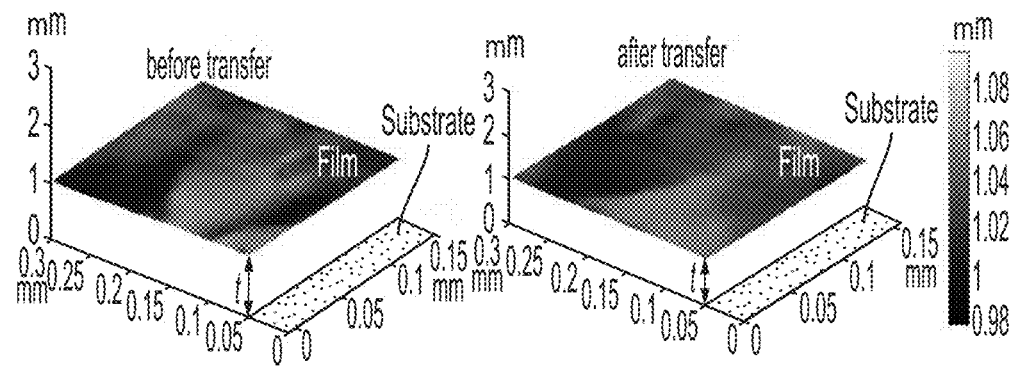

FIG. 12B graphically illustrates the surface topographies of a film with ~ 1 μm thickness before transfer (top) and after transfer (bottom) using push-down transfer.

Figure 13A:
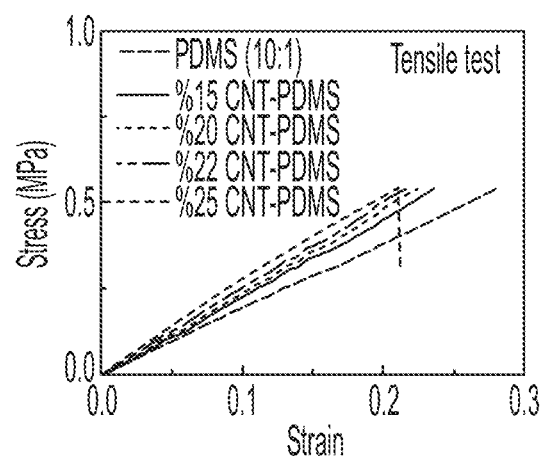

FIG. 13A graphically illustrates uniaxial tensile stress—strain curves of PDMS/CNT composite film with different CNT concentrations, where the initial linear stage was used to extract the Young's modulus E. The failure strain was the strain where the stress begins to drop.

Figure 13B:
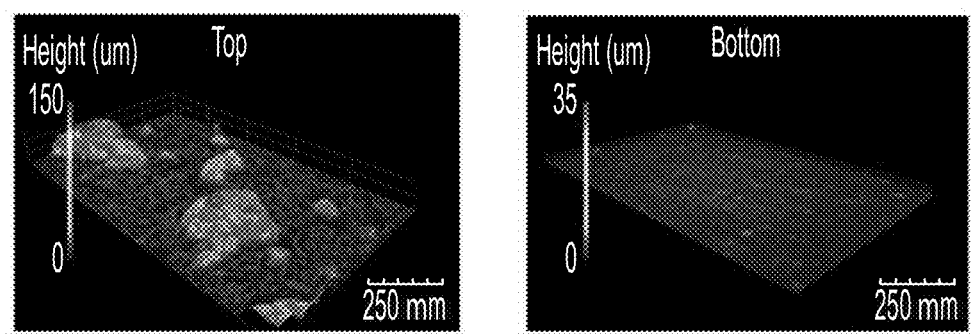

FIG. 13B graphically illustrates the surface roughness of the top and bottom surfaces of PDMS/CNT film measured by the 3D digital light microscope.

Figures 13C, 13D:
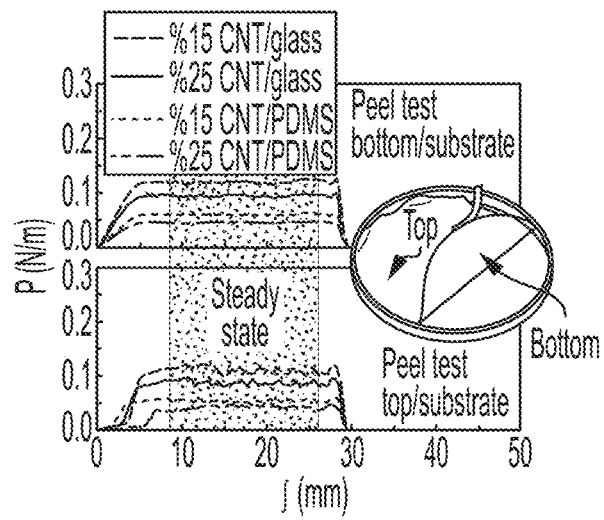

FIG. 13C graphically illustrates the measured peeling strength (P) (peeling force per unit width)-peeling distance (l) curves obtained from peeling tests used to obtain the interfacial adhesion energy between the top and bottom surfaces of PDMS/CNT composite film and substrate.

FIG. 13D illustrates a summary of the measured elastic modulus (E), failure strain and adhesion energy for PDMS/CNT composite film with different CNT concentrations.

Figure 14A:
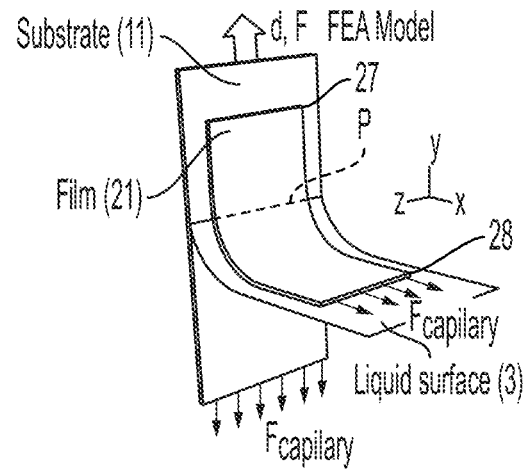

FIG. 14A illustrates a finite element analysis (FEA) model of the capillary transfer process.

Figure 14B:
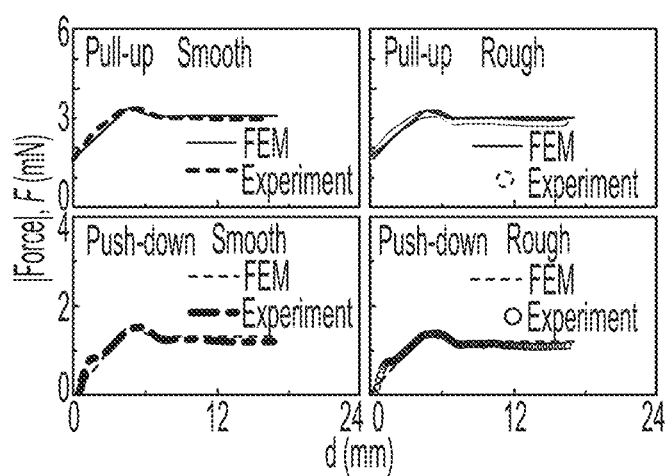

FIG. 14B graphically illustrates experimental and theoretical comparisons of the steady state transfer force from the experiment and simulation in both pull-up and push-down directions and for both smooth and rough surfaces.

Figure 14C:
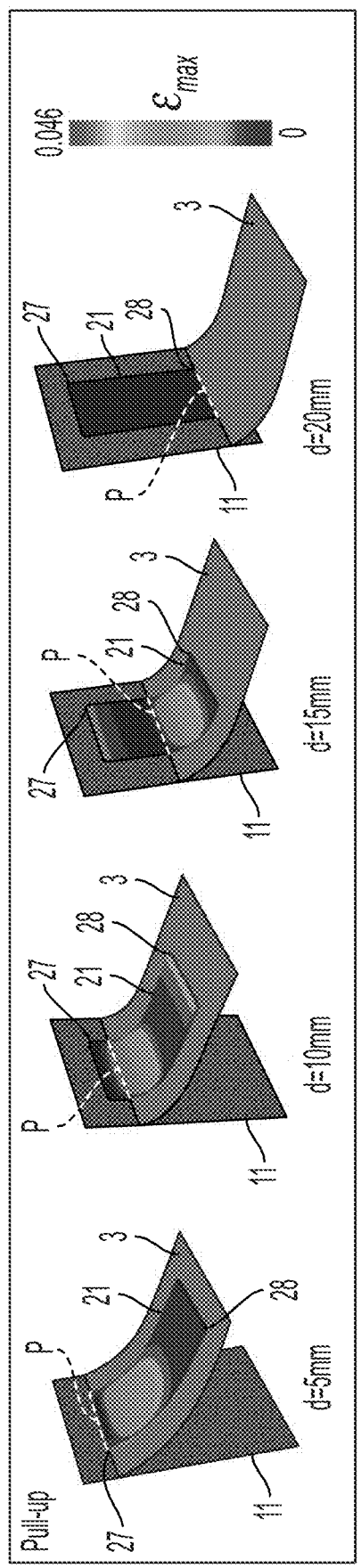

FIG. 14C illustrates FEA snapshots showing deformation strain distribution contour of the film during the pull-up (retraction) transfer process at various stages of transfer completion.

Figure 14D:
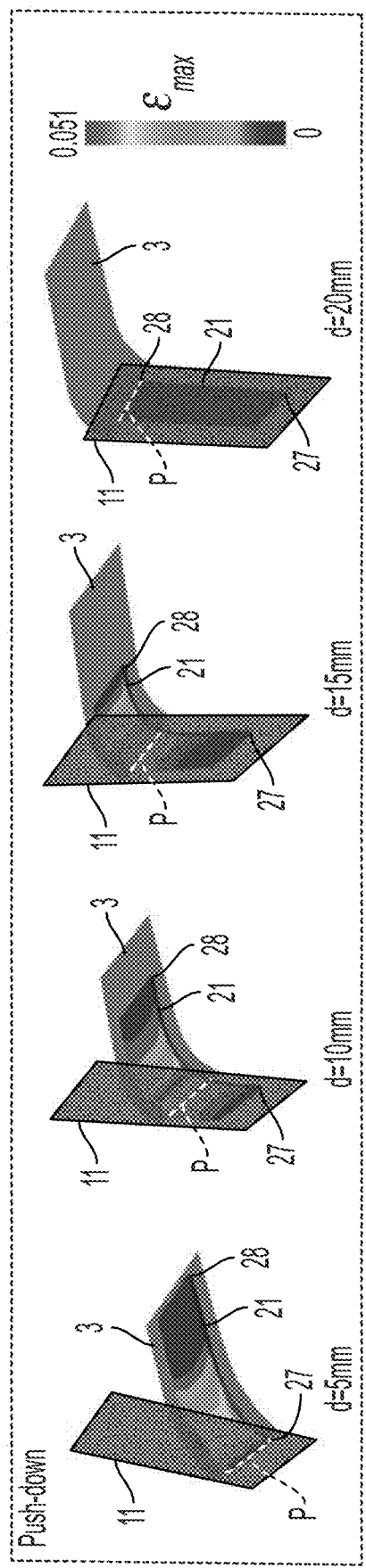

FIG. 14D illustrates FEA snapshots showing deformation strain distribution contour of the film during the push-down (advancement) transfer process at various stages of transfer completion.

Figure 15A:
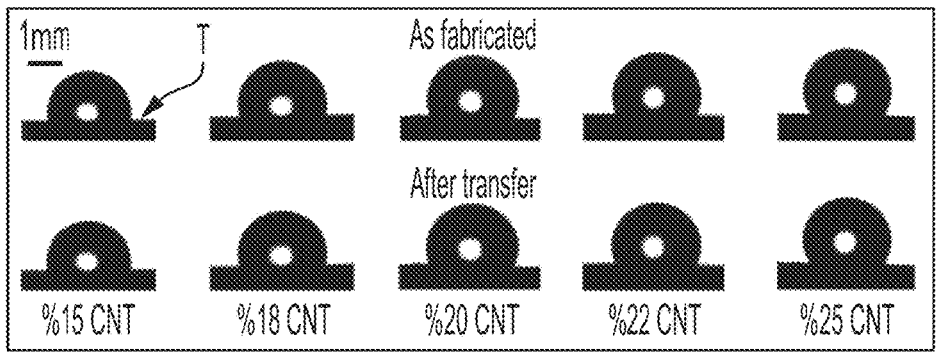

FIG. 15A provides a photographic depiction of water droplets on smooth surfaces of PDMS/CNT composite film before transfer (top) and after transfer (bottom) for different CNT concentrations.

Figure 15B:
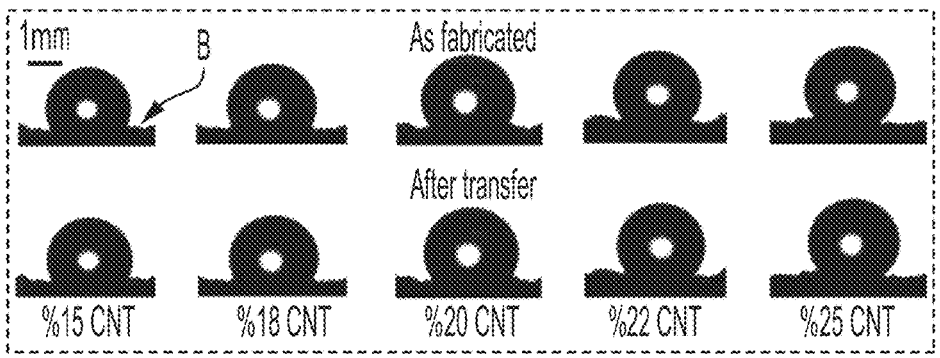

FIG. 15B provides a photographic depiction of water droplets on rough surfaces of PDMS/CNT composite film before transfer (top) and after transfer (bottom) for different CNT concentrations.

Figure 15C:
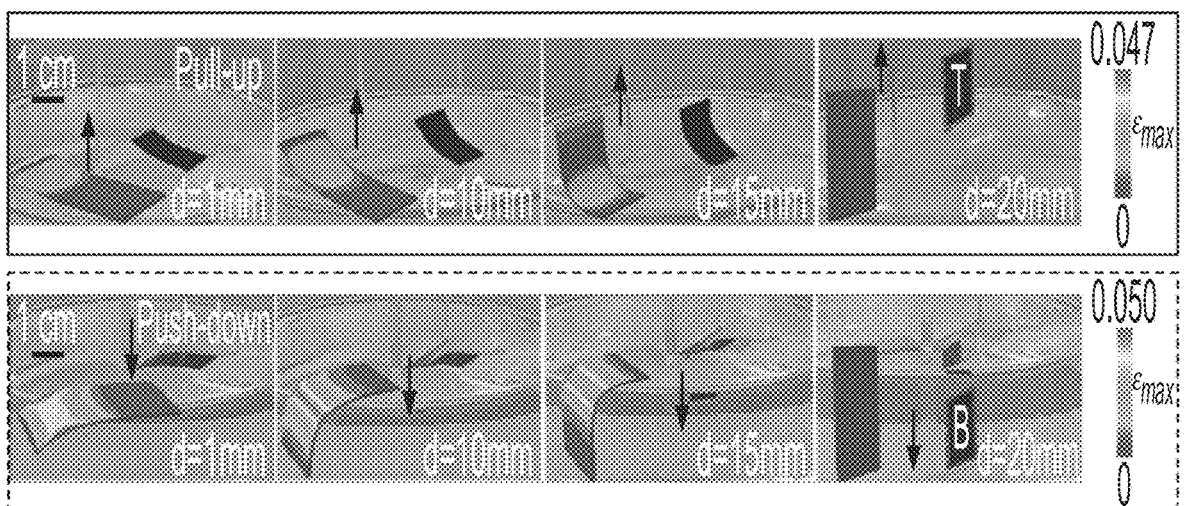

FIG. 15C provides a photographic depiction of experimental results alongside a theoretic model of FEA simulations of both pull-up (top) and push-down (bottom) capillary transfer of PDMS/CNT composite film when the smooth and rough surfaces of film are flipped.

Figure 16A:
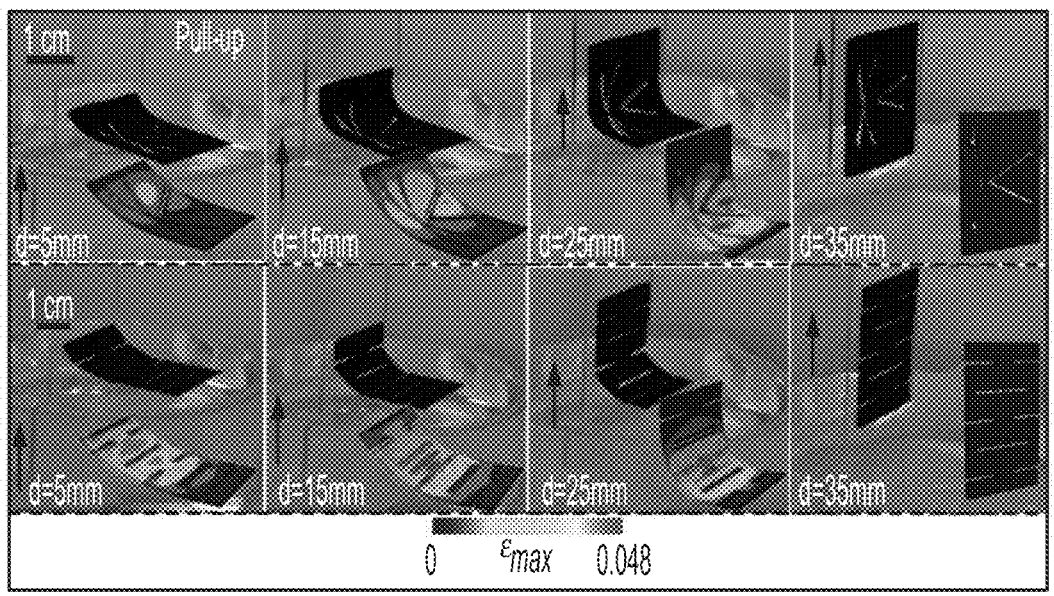

FIG. 16A provides a photographic depiction of experimental results alongside a theoretic model of FEA simulations of the capillary transfer of PDMS/CNT composite film with different patterns in pull-up direction.

Figure 16B:
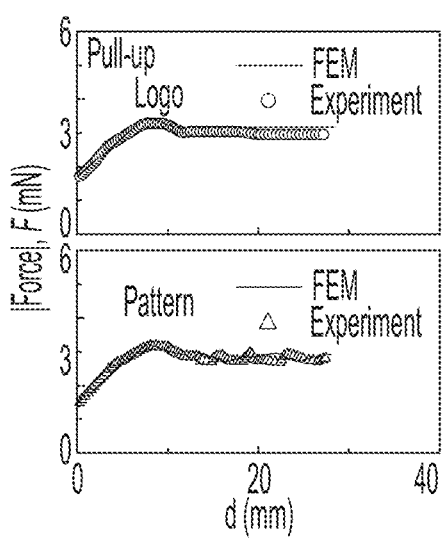

FIG. 16B graphically illustrates experimental and FEA simulation results of the capillary transfer of PDMS/CNT composite film with different patterns in pull-up direction.

Figure 16C:
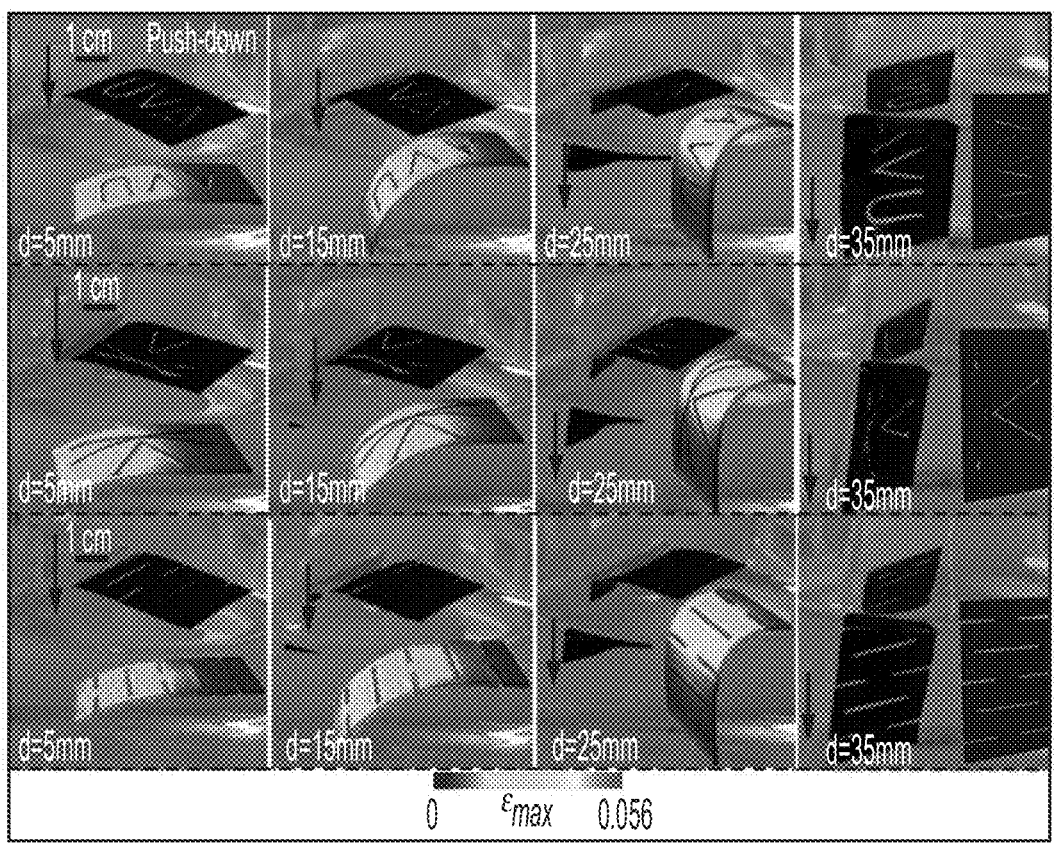

FIG. 16C provides a photographic depiction of experimental results alongside a theoretic model of FEA simulations of the capillary transfer of PDMS/CNT composite film with different patterns in pull-up direction.

Figure 16D:
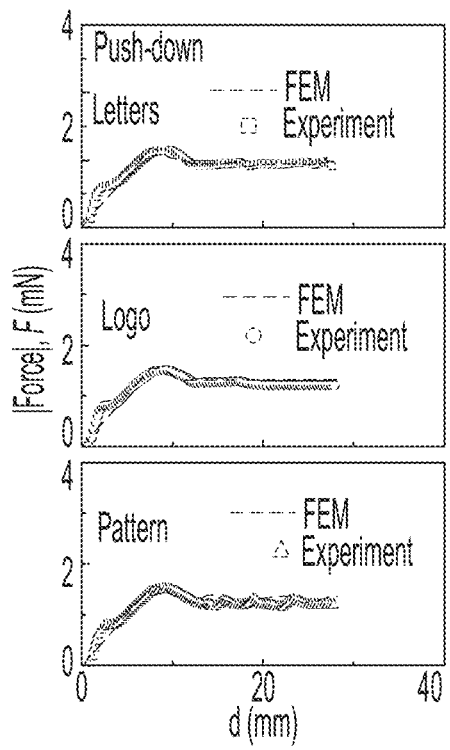

FIG. 16D graphically illustrates experimental and FEA simulation results of the capillary transfer of PDMS/CNT composite film with different patterns in push-down direction.

Figure 16E:
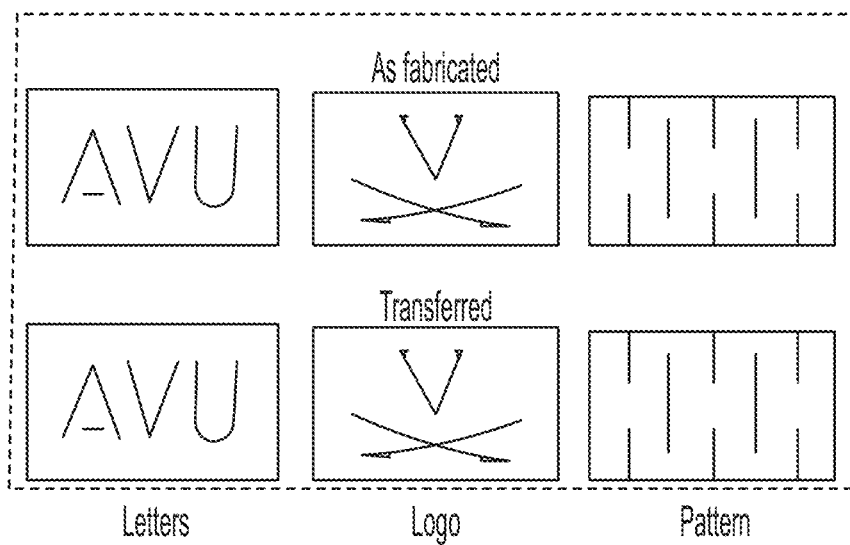

FIG. 16E provides a photographic depiction of imaging characteristics of three patterned films before (upper) and after pull-up transfer (lower).

Figure 17:
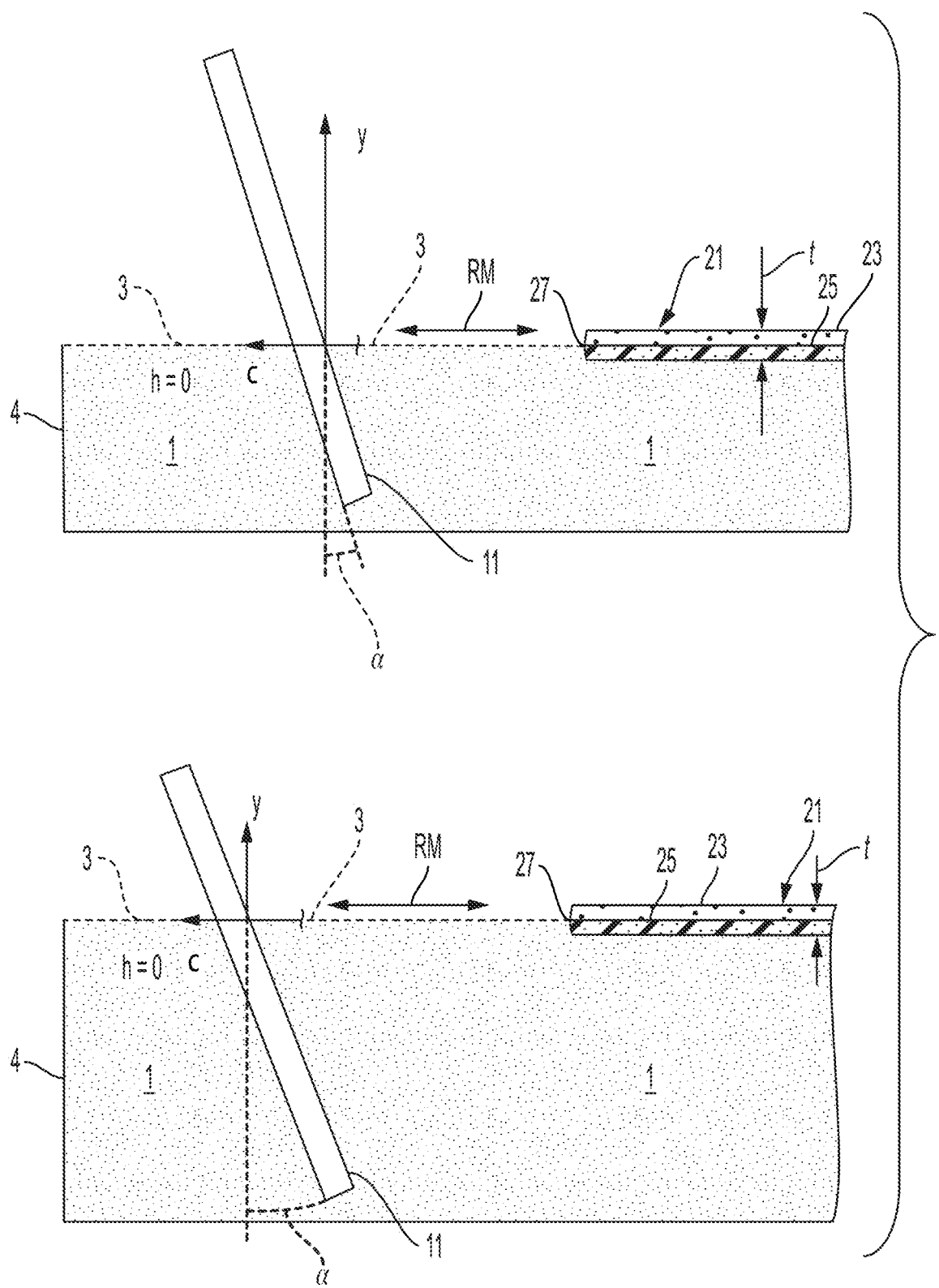

FIG. 17 schematically illustrates a cross sectional view of the film and substrate separated from one another showing the status prior to the time of initial contact between the film and substrate.

DETAILED DESCRIPTION OF EXEMPLARY EMBODIMENTS

Turning to FIG. 17, FIG. 17 schematically illustrates a cross sectional view of the film 21 and substrate 11 separated from one another showing the status prior to the time of initial contact between the film 21 and substrate 11.

Referring to FIGS. 1A, 1B, 1C, 14A, 14C, and 14D, an aspect of an embodiment of the present invention provides, but is not limited thereto, a transfer printing method for adhering a film 21 onto a substrate 11. The method may comprise: placing the film 21 on the surface 3 of a liquid 1 so that the film 21 floats or otherwise rests on the surface 3 of the liquid 1, the film 21 including a proximal edge 27 and a distal edge 28, wherein the y-axis is defined as perpendicular to the plane of the surface 3 of the liquid 1, wherein below the plane of the surface 3 of the liquid is the negative y-axis and above the plane of the surface 3 of the liquid 1 is the positive y-axis. With the film 21 and substrate 11 out of contact with each other (as shown in FIG. 17), the method further comprises: moving the film 21 and the substrate 11 relative to one another (as shown by, for example, the relative movement, RM, arrow of FIG. 17) until initial contact occurs between the proximal edge 27 of the film 21 and the substrate 11 across a transfer front (P) of the substrate 11. Next, the method further comprises, advancing or retracting the substrate 11 at a specified velocity (U), with a specified force (F), relative to the location of the liquid 1 and at a specified substrate angle (α) relative to the negative y-axis so that the film 21 elastically deforms onto the advancing or retracting substrate 11 due to capillary force between the liquid 1 and the film 21; and detaching the film 21 from the liquid and adhering the film 21 onto the advancing or retracting substrate 11 along the transfer front P, wherein the film 21 gradually transits across the transfer front P among the advancing or retracting substrate 11, wherein the transfer front P is defined as a single line segment or arc wherein the substrate 11, the film 21, and the surface 3 of the liquid 1 all simultaneously intersect one another and physically contact one another.

Figure 1A:
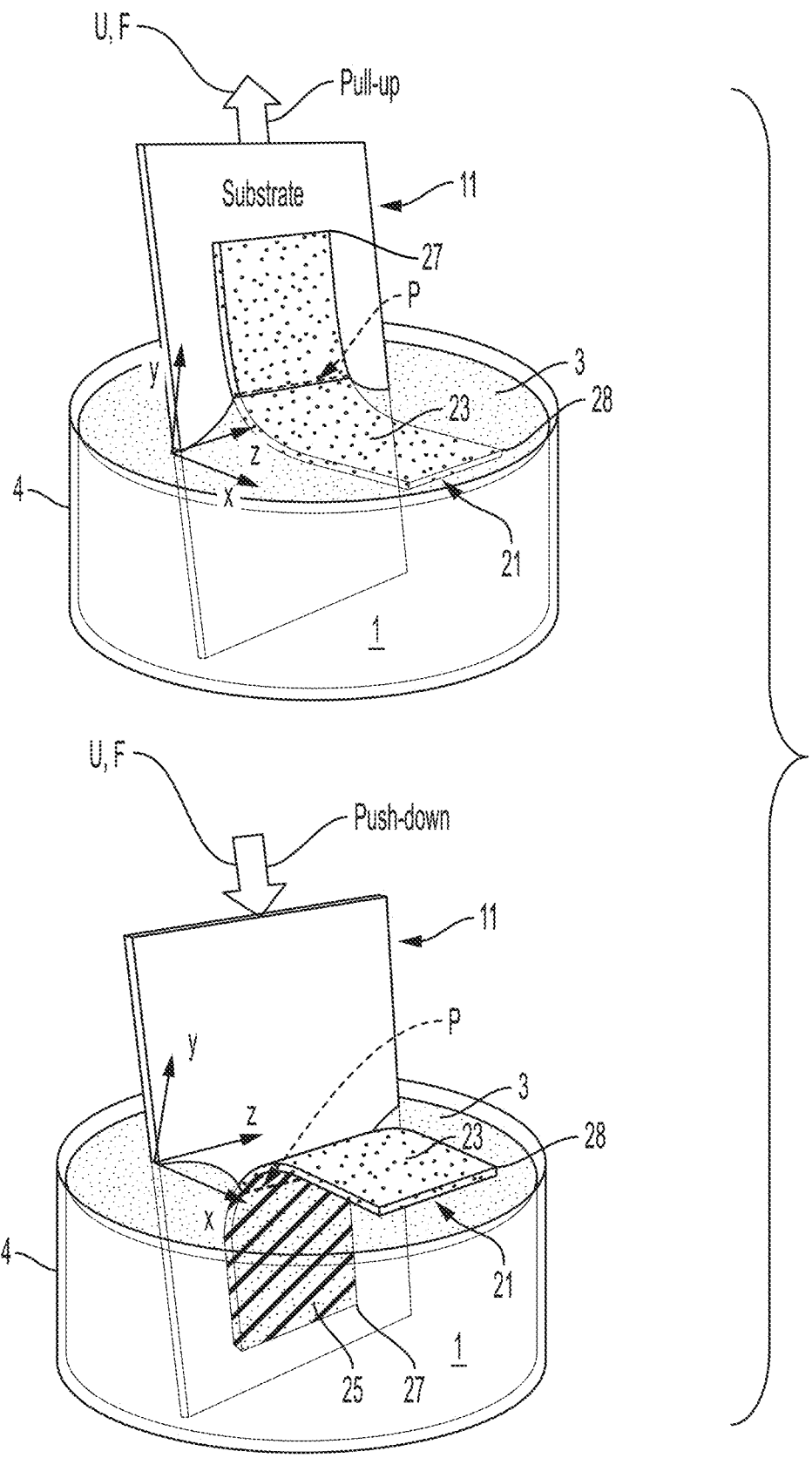
FIG. 1A schematically illustrates the capillary transfer pertaining to the "pull-up" or retracting method (top) and the "push-down" or advancing method (bottom).

FIG. 1A schematically illustrates an aspect of an embodiment of the present invention that includes the "pull-up" or retracting method (top) and the "push-down" or advancing method (bottom). In the pull up (retraction) method, the substrate 11 is pulled out (retracted from) of the liquid 1, which causes film 21 to bend and the bottom surface 25 to adhere to the surface of the substrate 11. In the push down (advancement) method, the substrate 11 is pushed into (advanced into) the liquid 1 of a container, tank, or reservoir 4, which causes film 21 to bend and the top surface 23 to adhere to the surface of the substrate 11. In both methods, the film 21 rests on the surface 3 of the liquid 1 before being adhered to the substrate 11 and a represents the angle of the substrate 11 with respect to the negative y axis. In an embodiment, a system may be configured to apply the "pull-up" (retracting) method and the "push-down" (advancing) method disclosed herein. In an embodiment, the system is provided with conveyor belts, racks, frames, mechanical arms, robotic arms, actuator, cable, lever, linkage, picking mechanism and/or trolley mechanism with the associated processor, controller or servomotor (or other transport means or mechanism or positioning mechanism or means with the associated processor, controller or servomotor) configured to move, position, and place the substrate 11 and film 21 to execute the methods disclosed herein. Moreover, in an embodiment, the system is provided with conveyor belts, racks, frames, mechanical arms, robotic arms, actuator, cable, lever, linkage, picking mechanism and/or trolley mechanism with the associated the processor, controller or servomotor (or other transport means or mechanism or positioning mechanism or means with the associated processor, controller or servomotor) configured to move, positon, and place the separation layer 51, transfer printed substrate 61, subsequent film 41. In an embodiment, the substrate 11, film 21, separation layer 51, transfer printed substrate 61, and/or subsequent film 41 may be moved, positioned, and placed manually to execute the methods disclosed herein.

Still referring to FIG. 1A, FIG. 1A schematically illustrates the capillary transfer. Upon the motion of the receiver substrate in an either pull-up (retracted from) or push-down (advanced into) direction (a) under a force F at a velocity U, the film (thickness t) will detach from the liquid surface and gradually transit across the contact location among substrate (e.g., line segment, arc, or other shape), soft film and liquid (referred to as the transfer front, denoted as 'P') to the substrate, until the entire film is transferred onto the substrate. The location of transfer front 'P' remains unchanged during the transfer process. After a successful transfer, with the pull-up (retracting) transfer, the bottom surface of film in initial contact with liquid will be in contact with the substrate and the top surface will be exposed to air; by contrast, after a successful transfer with the push-down (advancing) transfer, the top surface of film will be in contact with the substrate and the bottom surface of film will be exposed to liquid.

Figure 1B:
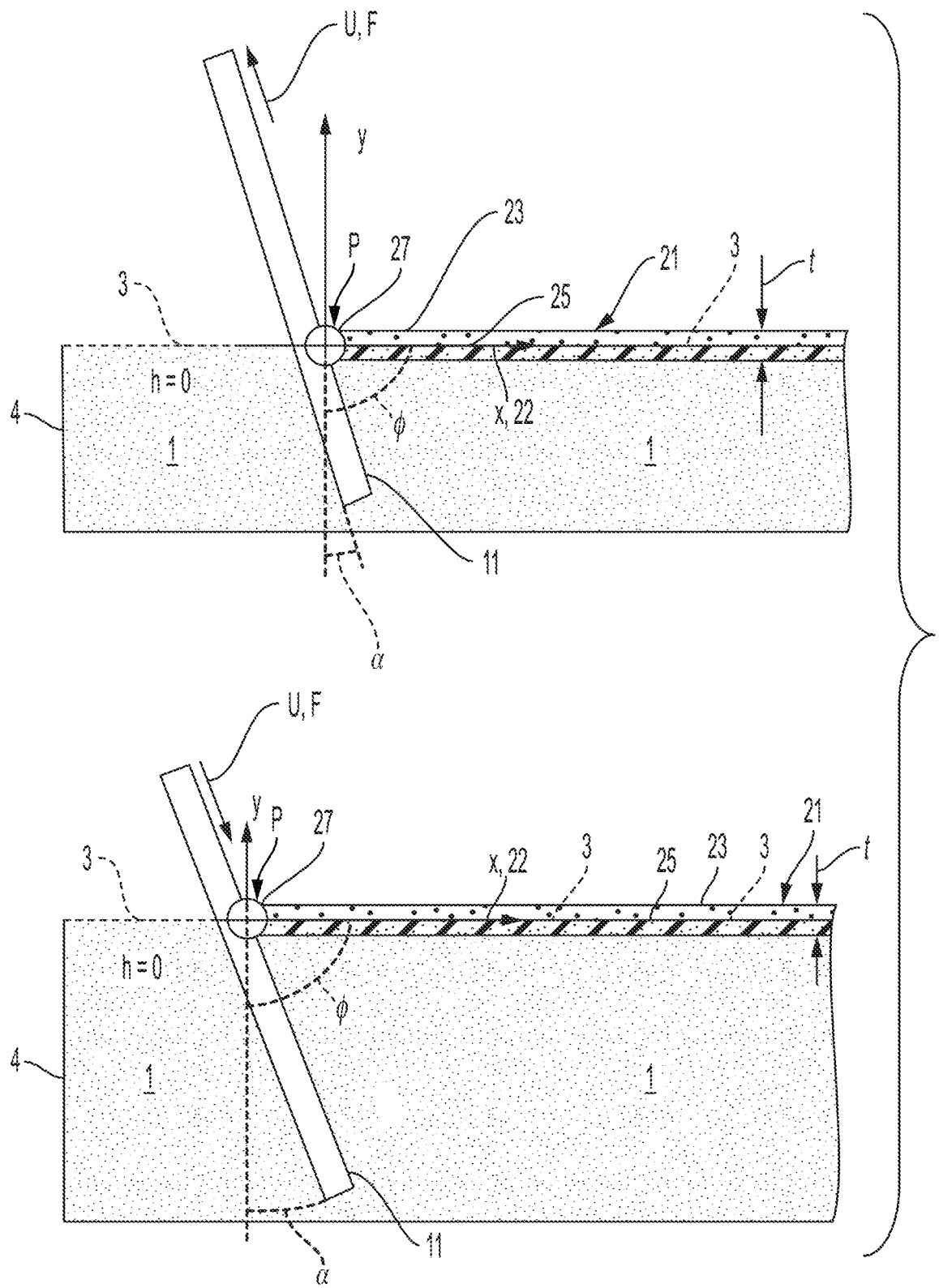
FIG. 1B schematically illustrates a cross sectional view of the capillary-elastic analysis at the transfer front 'P' showing the condition at the time of initial contact between the film and substrate, before any deformation of the film occurs.

FIG. 1B schematically illustrates (top and bottom) an aspect of an embodiment of the present invention that shows a cross-section view of the position of the parts at the time when the film 21 first makes contact with the substrate 11, but before any bending of the film 21 begins. The film rests on the surface 3 of the liquid 1 and makes contact with the substrate 11 along the transfer front P. α represents the angle of the substrate 11 with respect to the negative y axis.

Figure 1C:
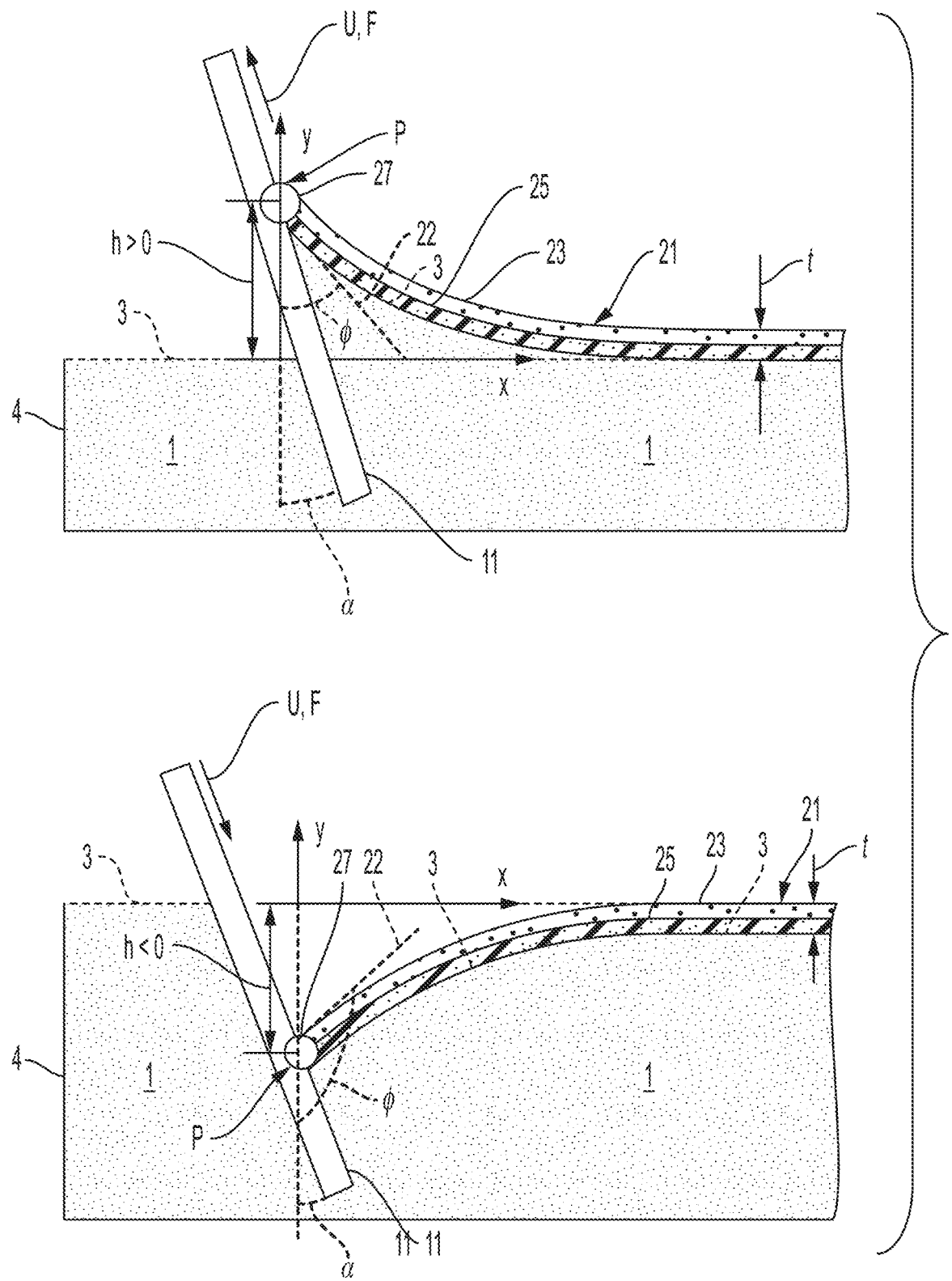
FIG. 1C schematically illustrates a cross-sectional view of the position of the parts at the time when the film begins to bend after making contact with the substrate.

FIG. 1C schematically illustrates an aspect of an embodiment of the present invention that shows a cross-section view of the position of the parts at the time when the film 21 begins to bend after making contact with the substrate 11. The film rests on the surface 3 of the liquid 1 and makes contact with the substrate 11 along the transfer front P. If the pull-up (retracting) method is used (top) then the film 21 will bend upwards, and if the push-down (advancing) method is used (bottom) then the film 21 will bend downwards. In both methods, the tangential direction 22 of the bent film 21 will form angle Φ with respect to the negative y axis and h reflects the vertical distance between the transfer front P and the original surface 3 of the liquid 1. α represents the angle of the substrate 11 with respect to the negative y axis.

Still referring to FIG. 1C, FIG. 1C schematically illustrates a cross sectional view of the theoretical model for the capillary-elastic analysis at the transfer front 'P'. At the transfer front, the film will be bent by the capillary force and the consequent p and h is the tangential direction of the bent film at the transfer front and the height of the transfer front 'P', respectively. For the pull-up (retracting) transfer, the film needs to be bent upwards (h>0) by the capillary force; for the push-down (advancing) transfer, the film needs to be bent downwards (h<0). h=0 suggests the capillary force is small enough and cannot bend the film, and the film cannot be transferred to the substrate, which corresponds to its maximum bending stiffness.

Figure 1D:
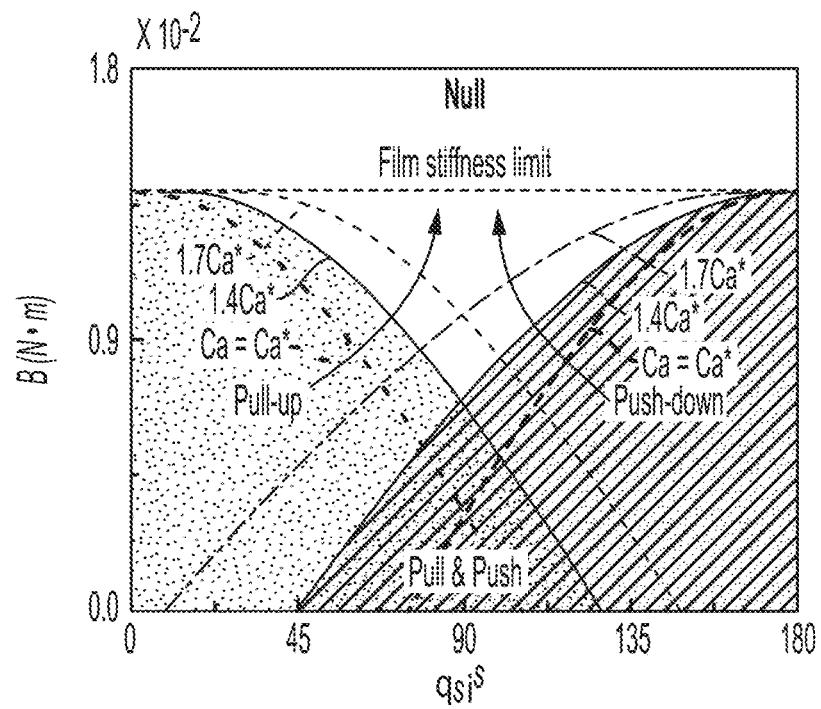
FIG. 1D graphically illustrates the phase diagram of the two transfer directions with respect to materials (bending stiffness of soft film B, the static contact angle of substrate to the liquid $\theta_{sl}^s$) and loading conditions (capillary number Ca that depends on substrate moving velocity), where Ca*=0.001.

FIG. 1D graphically illustrates the phase diagram of the two transfer directions with respect to materials (bending stiffness of soft film B, the static contact angle of substrate to the liquid $\theta_{sl}^s$) and loading conditions (capillary number Ca that depends on substrate moving velocity), where Ca*=0.001. The two respective shaded areas suggest conditions for the push-down and pull-up directions. The overlapping shaded area is the condition where both directions are feasible, and the non-shaded area is the condition where the film cannot be transferred. The black dotted line corresponds to the limit of maximum bending stiffness of film for which transfer can be accomplished.

Figure 2A:
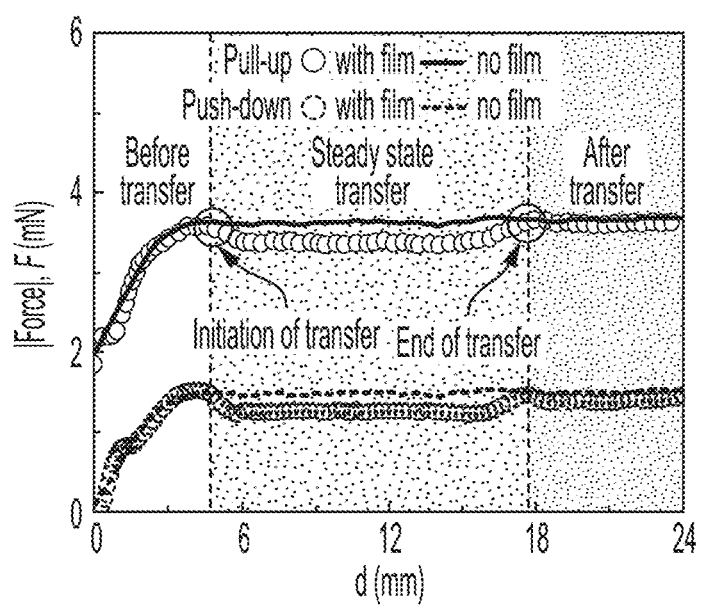
FIG. 2A graphically illustrates experimental results showing the variation of magnitude of the transfer force (F) with the moving displacement of substrate (d) during the capillary transfer process with and without film in both pull-up (solid line) and push-down (dashed line) directions.

FIG. 2A graphically illustrates experimental results showing the variation of magnitude of the transfer force (F) with the moving displacement of substrate (d) during the capillary transfer process with and without film in both pull-up (solid line) and push-down (dashed line) directions. The direction of force is upward in pull-up transfer and downward in push-down transfer. In the pull-up and push-down experiment, the substrate is glass and PDMS slide, respectively. In both experiments, the liquid bath is water, and the film is PDMS film slightly dyed for visualization.

Figure 2B:
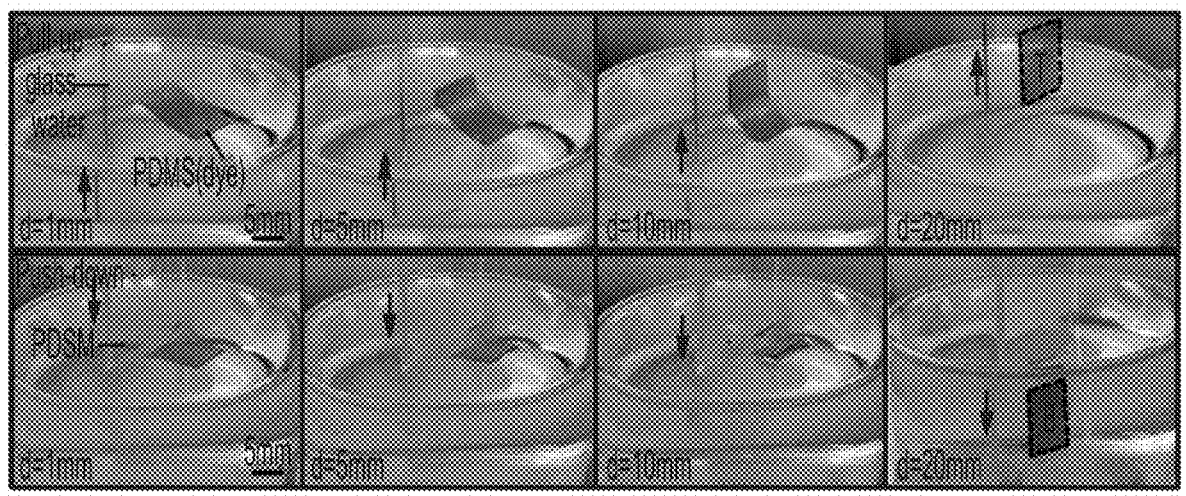
FIG. 2B provides a photographic depiction of the capillary transfer experiments at a series of displacements in both pull-up and push-down directions.

FIG. 2B provides a photographic depiction of the capillary transfer experiments at a series of displacements in both pull-up and push-down directions. After the pull-up transfer, the bottom surface of film in contact with water adheres to the substrate and the top surface (marked with "T") is exposed to air. For the push-down transfer, the bottom surface of film in contact with water (marked with "B") is exposed to air.

Figure 2C:
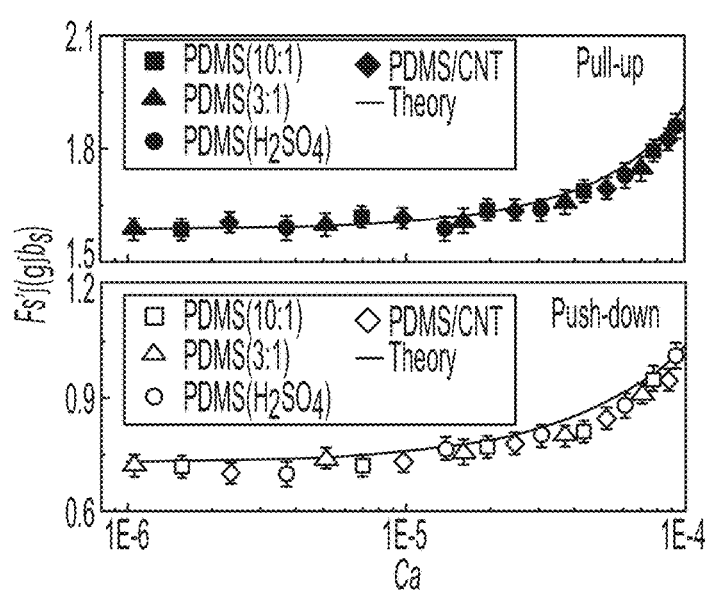
FIG. 2C graphically illustrates an experimental result comparison of the steady state transfer force of film normalized by the liquid surface tension ($\gamma_l$) and substrate width ($b_s$), $F_s'/\gamma_l b_s$, as a function of the capillary number Ca between the theoretical calculations and experimental measurements for a wide variety of soft film materials in both pull-up and push-down transfers.

FIG. 2C graphically illustrates an experimental result comparison of the steady state transfer force of film normalized by the liquid surface tension ($\gamma_l$) and substrate width ($b_s$), $F_s'/\gamma_l b_s$, as a function of the capillary number Ca between the theoretical calculations and experimental measurements for a wide variety of soft film materials in both pull-up and push-down transfers. $F_s'/\gamma_l b_s = 2 \cos((\theta_{sl}^s - k_\varepsilon \cdot Ca)^{1/3})$ for pull-up transfer, and $$F_s'/\gamma_l b_s = \left(-2 + \frac{b_t}{b_s}\right)\cos\left((\theta_{sl}^s + k_\varepsilon \cdot Ca)^{1/3}\right)$$

for push-down transfer. The error bar represents the standard deviation from the mean of three independent experiments.

FIG. 3 graphically illustrates experimental results showing phase diagrams of the successful conditions of capillary transfer, which are confirmed on a wide variety of system materials for receiver substrate, soft film, liquid media, film thickness and transfer speed. In the theoretical diagram, the curve for the top graph (for pull-up) and the curve for the bottom graph (for push-down) represent the theoretical predictions on critical condition of successful transfer for pull-up and push-down directions, respectively. The symbols represent the experimental results, where the open symbol denotes a failure of transfer, and the solid symbol denotes a successful transfer; the shading and shapes of the symbols denote material types of solid substrate/film and liquid environment, respectively. EG represents the ethylene glycol, and the ratio of base polymer to cure agent in PDMS, addition of CNTs to PDMS (weight %), and surface treatment by $H_2SO_4$ are given in bracket. The transfer speed U is highlighted with the bracket ( ) and the unit is mm/s. For each case of transfer, the experiment was repeated 10 times. The transfer was considered to be successful if the successful rate was larger than 50%, and otherwise it was considered to fail.

FIG. 4A provides a photographic depiction alongside a theoretic model of the capillary transfer of PDMS/CNT composite film (thickness in 200 μm) from water surface to glass slide by pull-up transfer and to PDMS slide by push-down transfer. The pull-up transfer yields the top surface (marked with "T") of composite film exposed to air for use. By contrast, the push-down transfer yields the bottom surface (marked with "B") of composite film exposed for use. Inset is the finite element analysis (FEA) plane strain distribution on the film during both transfer processes, which is far smaller than its maximum failure strain (>20%).

FIG. 4B graphically illustrates an experimental results comparison of measured electrical resistance of PDMS/CNT composite film before and after transfer using both pull-up and push-down transfer. The error bars represent the standard deviation from the mean of three independent measurements.

FIG. 4C graphically illustrates an experimental results comparison of measured contact angle (θ) (e.g., wettability of the film) of water droplet on the top (smooth) surface (via pull-up transfer) and bottom (rough) surface (via push-down transfer) of composite film before and after transfer. Error bar represents the standard deviation from the mean of three independent measurements.

Figure 4F:
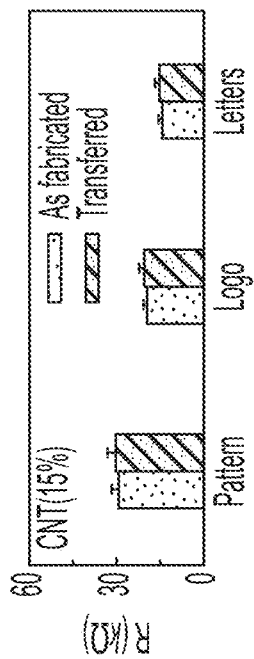
FIG. 4F graphically illustrates an experimental results comparison of measured electrical resistance of composite film with three different patterns before and after transfer.
Figure 4E:
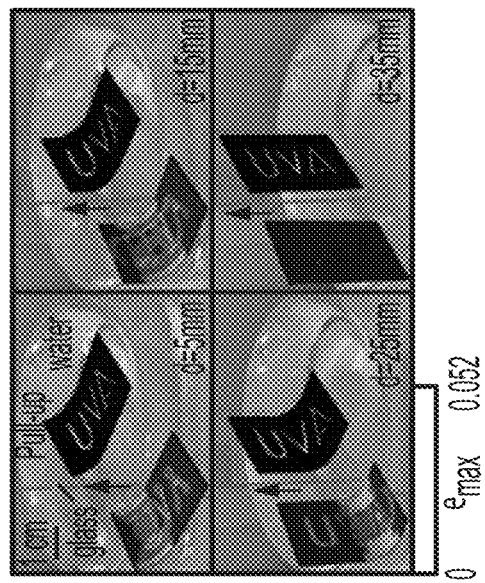
FIG. 4E provides a photographic depiction alongside a theoretic model of the deformation during the capillary transfer process of PDMS/CNT composite film with 'UVA' letters pattern.
Figure 4G:
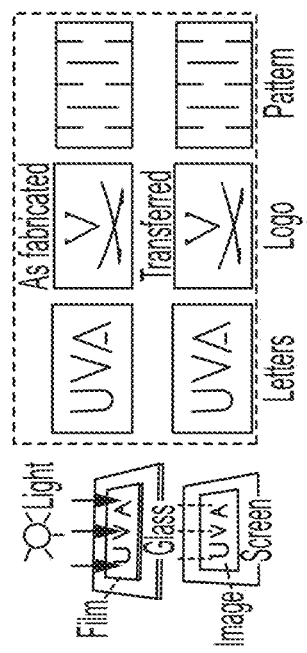
FIG. 4G illustrates the optical imaging method (left) and provides a photographic depiction of imaging characteristics of three patterned films before and after pull-up transfer (right).
Figure 4D:
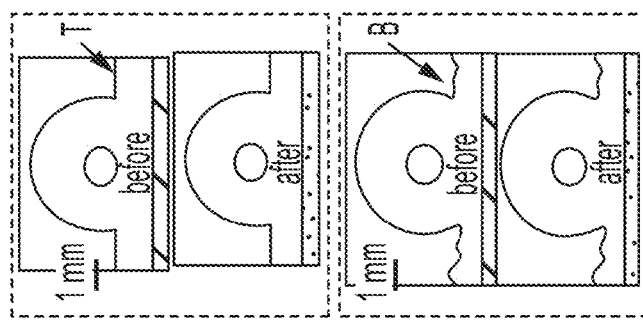
FIG. 4D provides a photographic depiction of water droplets on the top of a smooth surface (top images, marked with "T") and on the top of a rough surface (bottom images, marked with "B") of PDMS/CNT.

FIG. 4D provides a photographic depiction of water droplets on the top of a smooth surface (top images, marked with "T") and on the top of a rough surface (bottom images, marked with "B") of PDMS/CNT. Depictions are provided for both surfaces of the droplet before and after film transfer.

FIG. 4E provides a photographic depiction alongside a theoretic model of the deformation during the capillary transfer process of PDMS/CNT composite film with 'UVA' letters pattern.

FIG. 4F graphically illustrates an experimental results comparison of measured electrical resistance of composite film with three different patterns before and after transfer. The error bars represent the standard deviation from the mean of three independent measurements.

FIG. 4G illustrates the optical imaging method (left) and provides a photographic depiction of imaging characteristics of three patterned films before and after pull-up transfer (right).

Figure 4H:
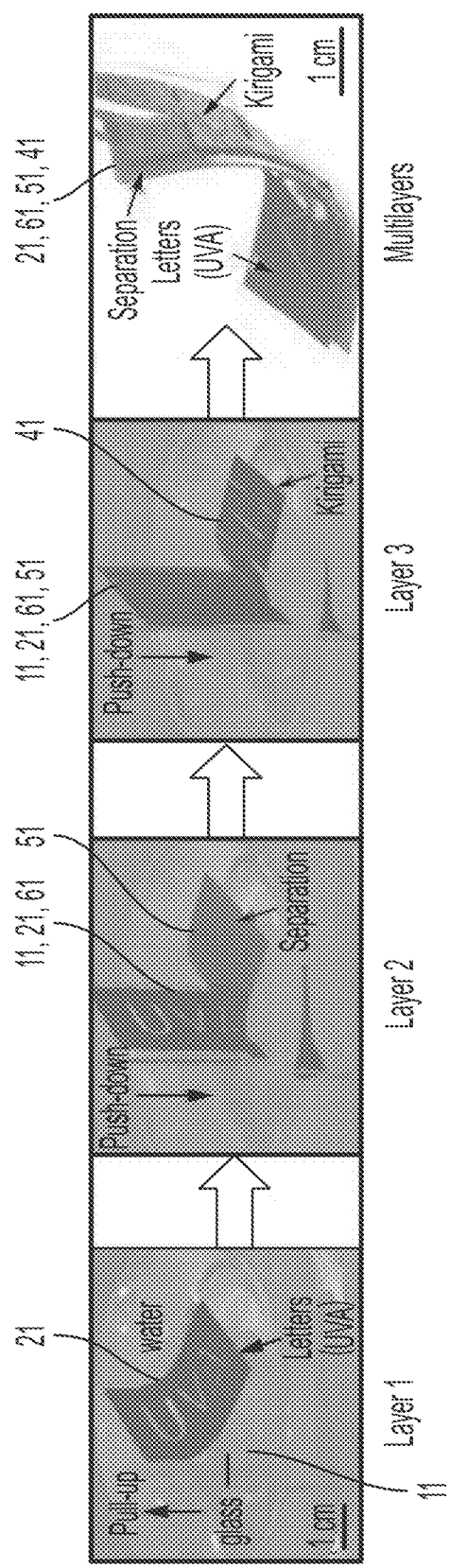
FIG. 4H provides a photographic depiction of the assembly of multilayered soft film structures by combination of push-down and pull-up capillary transfer. The transfer generates a composite layered structure with two different surface patterns after removing the composite layer from the substrate.

FIG. 4H provides a photographic depiction of the assembly of multilayered soft film structures by combination of push-down and pull-up capillary transfer. The transfer generates a composite layered structure with two different surface patterns after removing the composite layer from the substrate 11. For example, in an embodiment, after the film 21 bends and adheres to the surface of the substrate 11 (far most left panel) then additional processing can be implemented. For example, in a next step, a separation layer 51 is placed on the surface of the liquid 1 bends and adheres to (via implementing the process discussed in FIGS. 1A-1C) the surface of the film 21 that has already been adhered to the substrate 11 (second panel from the left). The already printed/adhered film 21 may be referred to as "transfer printed substrate" 61 which includes the film 21 that has already been printed/adhered onto the substrate 11. Thereafter, in a next step, a subsequent film 41 bends and adheres to (via implementing the process discussed in FIGS. 1A-1C) the surface of the separation layer 51 that has already been adhered onto the film 21 (panel second from the right). Further yet, the substrate 11 can be removed (far right panel) leaving only the film 21, separation 51 and subsequent film 41. In an embodiment the film 21, separation 51 and subsequent film 41 may be flexible compared to a rigid substrate 11 (now removed).

Still referring to FIG. 4I1, in an embodiment, after the film 21 bends and adheres to the surface of the substrate 11 (far most left panel) then additional processing can be implemented. For example (without using a separation layer 51) a subsequent film 41 is placed on the surface of the liquid 1 bends and adheres to (via implementing the process discussed in FIGS. 1A-1C) the surface of the film 21 that has already been adhered to the substrate 11 (second panel from the right). The already printed/adhered film 21 may be referred to as "transfer printed substrate" 61 which includes the film 21 that has already been printed/adhered onto the substrate 11. Further yet, the substrate 11 can be removed (far right panel) leaving only the film 21 and subsequent film 41 (without utilization of a of separation layer 51). In an embodiment the film 21 and subsequent film 41 may be flexible compared to a rigid substrate 11 (now removed).

Figure 5A:
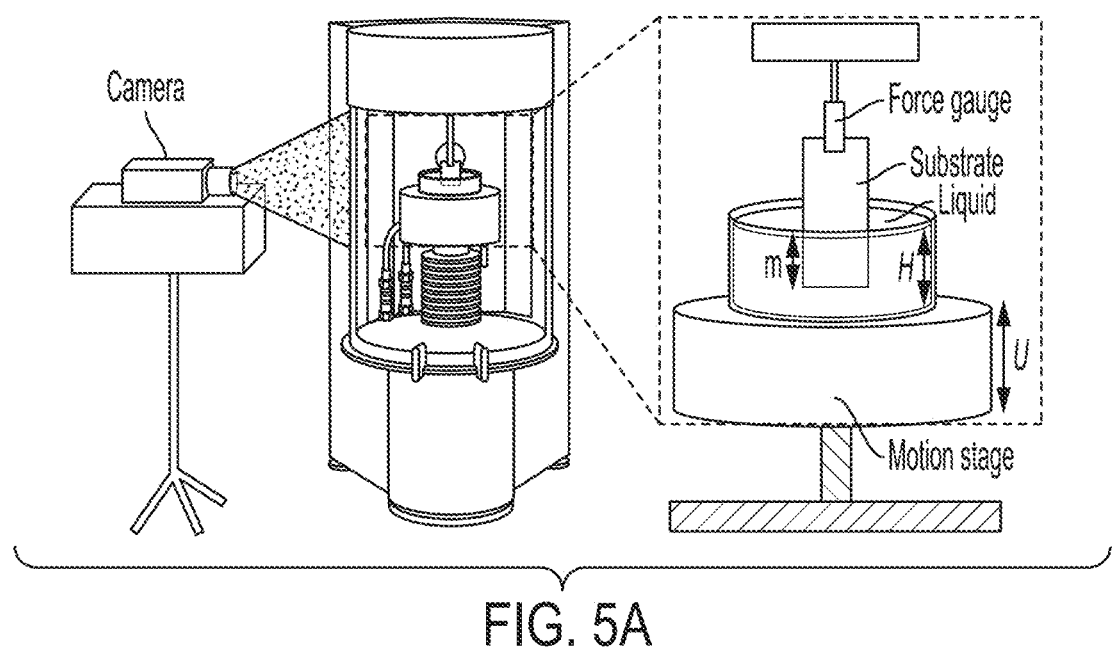
FIG. 5A illustrates the tensiometer setup for measuring the dynamic contact angle of substrate to liquid. m is the immersion depth of substrate into liquid, H is the depth of liquid bath and U is the moving velocity of motion stage.

FIG. 5A illustrates the tensiometer setup for measuring the dynamic contact angle of substrate to liquid. M is the immersion depth of substrate into liquid, H is the depth of liquid bath and U is the moving velocity of motion stage.

Figure 5B:
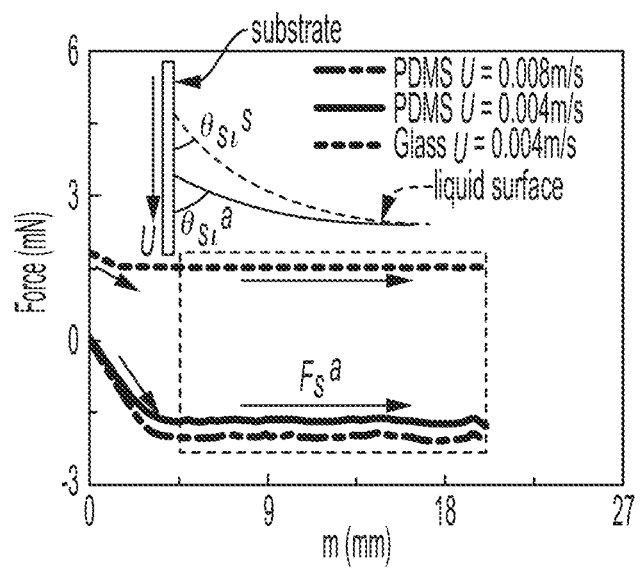
FIG. 5B graphically illustrates the variation of the measured capillary force with the immersion depth m of solid substrate moving downwards into the liquid at a velocity U. The advancing dynamic contact angle $\theta_{sl}^{\alpha}$ between substrate and liquid can be determined via $\cos \theta_{sl}^{\alpha} = F_s^{\alpha}/\gamma_l L_p$, where $F_s^{\alpha}$ is the equilibrium force of substrate moving downwards and negative value means the direction of force is downwards, $\gamma_l$ is the liquid surface tension and $L_p$ is the perimeter of substrate.

FIG. 5B graphically illustrates the variation of the measured capillary force with the immersion depth m of solid substrate moving downwards into the liquid at a velocity U. The advancing dynamic contact angle $\theta_{sl}^\alpha$ between substrate and liquid can be determined via cos $\theta_{sl}^\alpha = F_s^\alpha / \gamma_l L_p$, where $F_s^\alpha$ is the equilibrium force of substrate moving downwards and negative value means the direction of force is downwards, $\gamma_l$ is the liquid surface tension and $L_p$ is the perimeter of substrate.

Figure 5C:
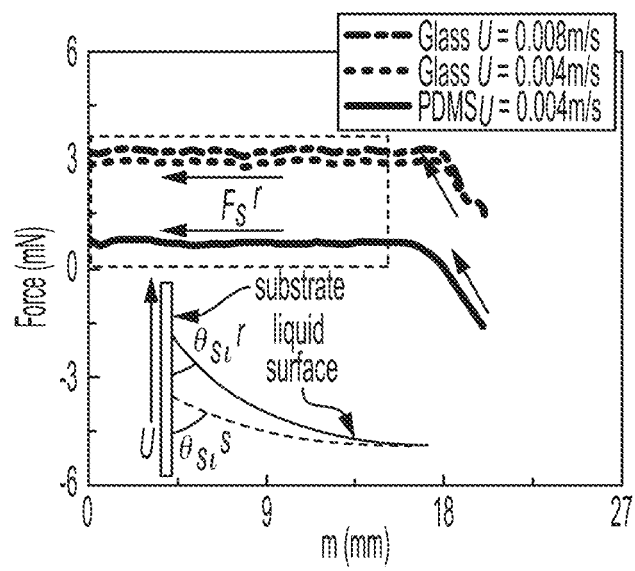
FIG. 5C graphically illustrates the variation of the measured capillary force with immersion depth m of solid substrate moving upwards out of the liquid at a velocity U. The receding dynamic contact angle $\theta_{sl}^{r}$ between substrate and water can be determined via $\cos \theta_{sl}^{r} = F_s^{r}/\gamma_l L_p$, where $F_s^{r}$ is the equilibrium force of substrate moving upwards.

FIG. 5C graphically illustrates the variation of the measured capillary force with immersion depth m of solid substrate moving upwards out of the liquid at a velocity U. The receding dynamic contact angle $\theta_{sl}^r$ between substrate and water can be determined via cos $\theta_{sl}^r = F_s^r / \gamma_l L_p$, where $F_s^r$ is the equilibrium force of substrate moving upwards.

Figure 6A:
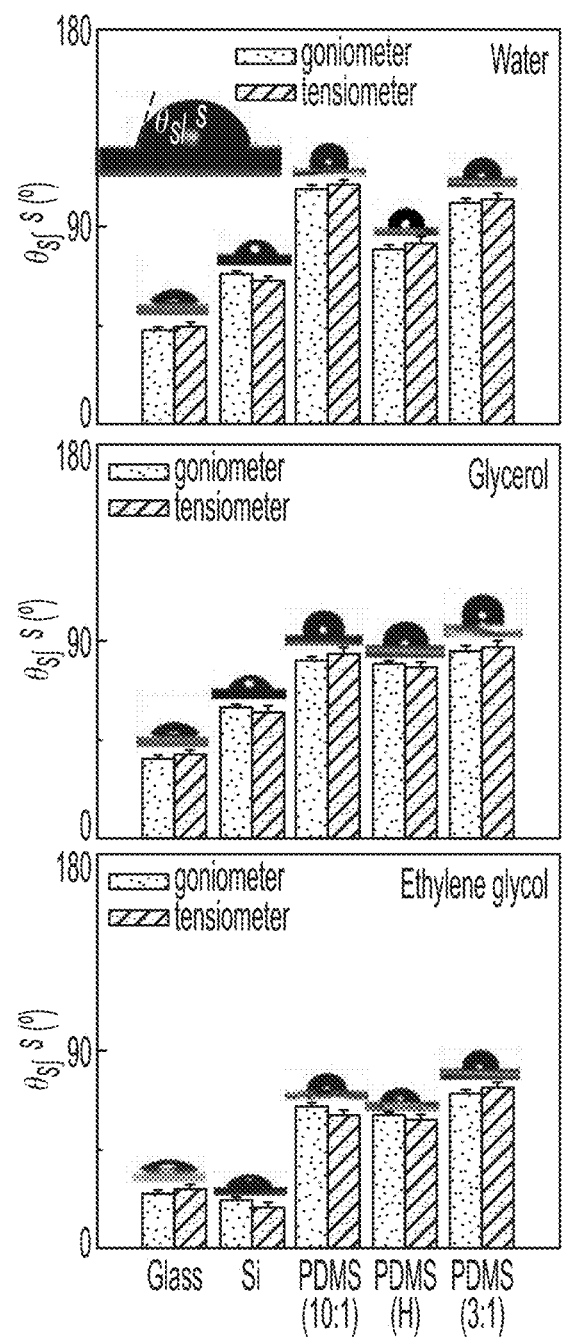
FIG. 6A graphically illustrates measurements of static contact angle $\theta_{sl}^{s}$ of liquid droplets on solid surfaces of different materials.

FIG. 6A graphically illustrates measurements of static contact angle $\theta_{sl}^s$ of liquid droplets on solid 90-degree surfaces of different materials. The error bars represent the standard deviation from the mean of three independent experiments. In the measurement using a tensiometer, the static contact angle $\theta_{sl}^s$ is determined by $$\cos\theta_{sl}^s = \frac{\cos\theta_{sl}^a + \cos\theta_{sl}^r}{2}.$$

Figure 6B:
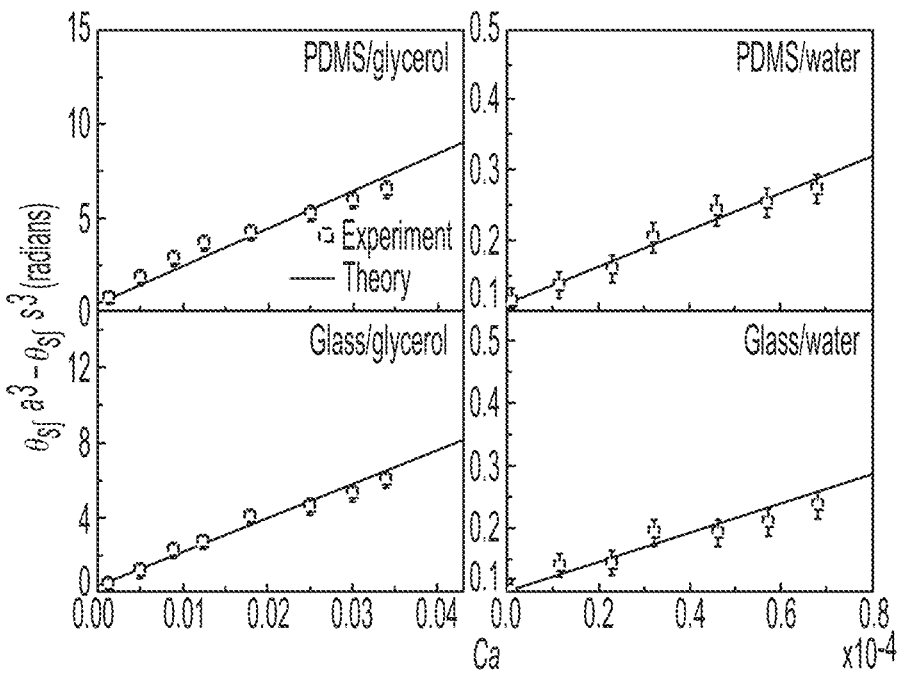
FIG. 6B graphically illustrates experimental and theoretical comparisons of the dependence of advancing contact angle $\theta_{sl}^{\alpha}$ on the capillary number Ca, where $Ca=\mu U/\gamma_l, \mu$ is the liquid viscosity and U is the moving velocity of substrate.

FIG. 6B graphically illustrates experimental and theoretical comparisons of the dependence of advancing contact angle $\theta_{sl}^{\alpha}$ on the capillary number Ca, where Ca=μU/γ$_l$·μ is the liquid viscosity and U is the moving velocity of substrate. Error bars represent the standard deviation from the mean of three independent experiments. The relation between $\theta_{sl}^{\alpha}$ and Ca is described by the equation $(\theta_{sl}^{a})^3 - (\theta_{sl}^{s})^3 = k_\varepsilon \cdot Ca$, and $k_\varepsilon = 5.5 \times 10^8$ for PDMS substrate/glycerol liquid, $k_\varepsilon = 3.2 \times 10^8$ for PDMS substrate/water liquid, $k_\varepsilon = 4.9 \times 10^8$ for glass substrate/glycerol liquid and $k_\varepsilon = 2.8 \times 10^8$ for glass substrate/water liquid are determined by fitting the experiment results.

Figure 6C:
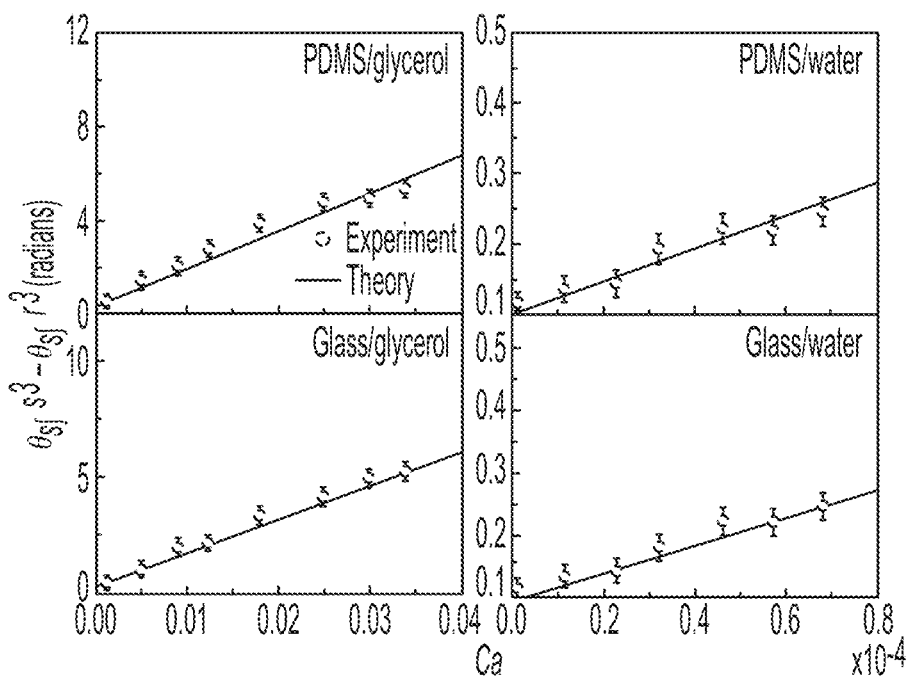
FIG. 6C graphically illustrates experimental and theoretical comparisons of the dependence of receding contact angle $\theta_{sl}^{r}$ on the capillary number Ca.

FIG. 6C graphically illustrates experimental and theoretical comparisons of the dependence of receding contact angle $\theta_{sl}^{r}$ on the capillary number Ca. Error bars represent the standard deviation from the mean (n=3). The relation between $\theta_{sl}^{r}$ and Ca is described by the equation $(\theta_{sl}^{s})^3 - (\theta_{sl}^{r})^3 = k_\varepsilon \cdot Ca$, and $k_\varepsilon$ $2.1 \times 10^8$ for PDMS substrate/glycerol liquid, $k_\varepsilon = 1.4 \times 10^8$ for PDMS substrate/water liquid, $k_\varepsilon = 1.9 \times 10^8$ for glass substrate/glycerol liquid and $k_\varepsilon = 1.1 \times 10^8$ for glass substrate/water liquid are determined by fitting the experiment results.

Figure 7A:
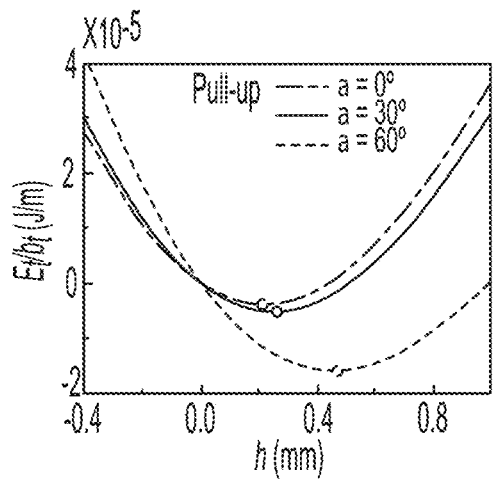
FIG. 7A graphically illustrates the total deformation energy of films ($E_t$) during a steady-state capillary transfer under different transfer angles (α) for pull-up transfer.

FIG. 7A graphically illustrates the total deformation energy of films ($E_t$) during a steady-state capillary transfer under different transfer angles (α) for pull-up transfer. The dot highlights the minimization of $E_t$ and its corresponding h, a is defined to be positive and negative when the moving substrate is oriented relative to the vertical (−y) direction in the counterclockwise and clockwise way, respectively.

Figure 7B:
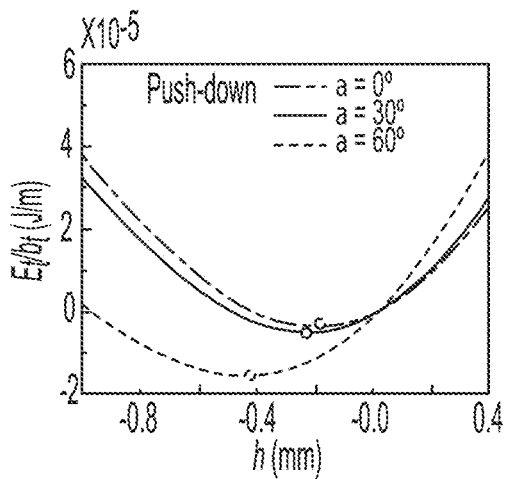
FIG. 7B graphically illustrates the total deformation energy of films ($E_t$) during a steady-state capillary transfer under different transfer angles (α) for push-down transfer.

FIG. 7B graphically illustrates the total deformation energy of films ($E_t$) during a steady-state capillary transfer under different transfer angles (α) for push-down transfer. The dot highlights the minimization of $E_t$ and its corresponding h, α is defined to be positive and negative when the moving substrate is oriented relative to the vertical (−y) direction in the counterclockwise and clockwise way, respectively.

Figure 7C:
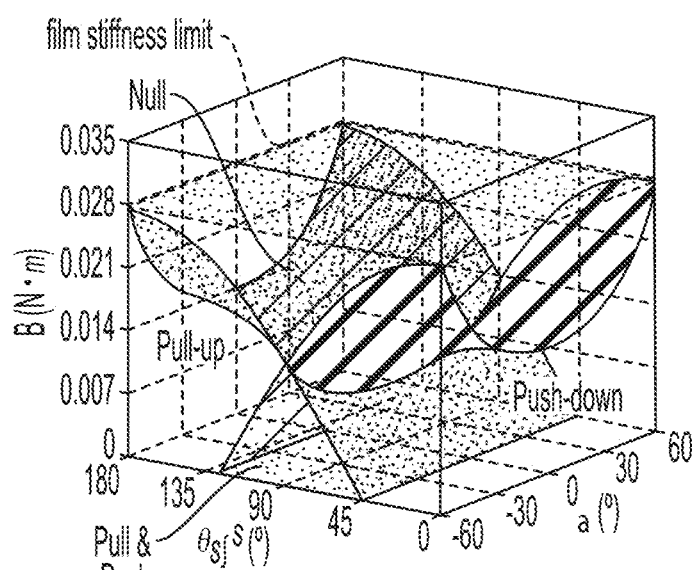
FIG. 7C graphically illustrates a three-dimensional theoretical phase diagram for determination of capillary transfer direction with the effect of α.

FIG. 7C graphically illustrates a three-dimensional theoretical phase diagram for determination of capillary transfer direction with the effect of α.

Figure 8A:
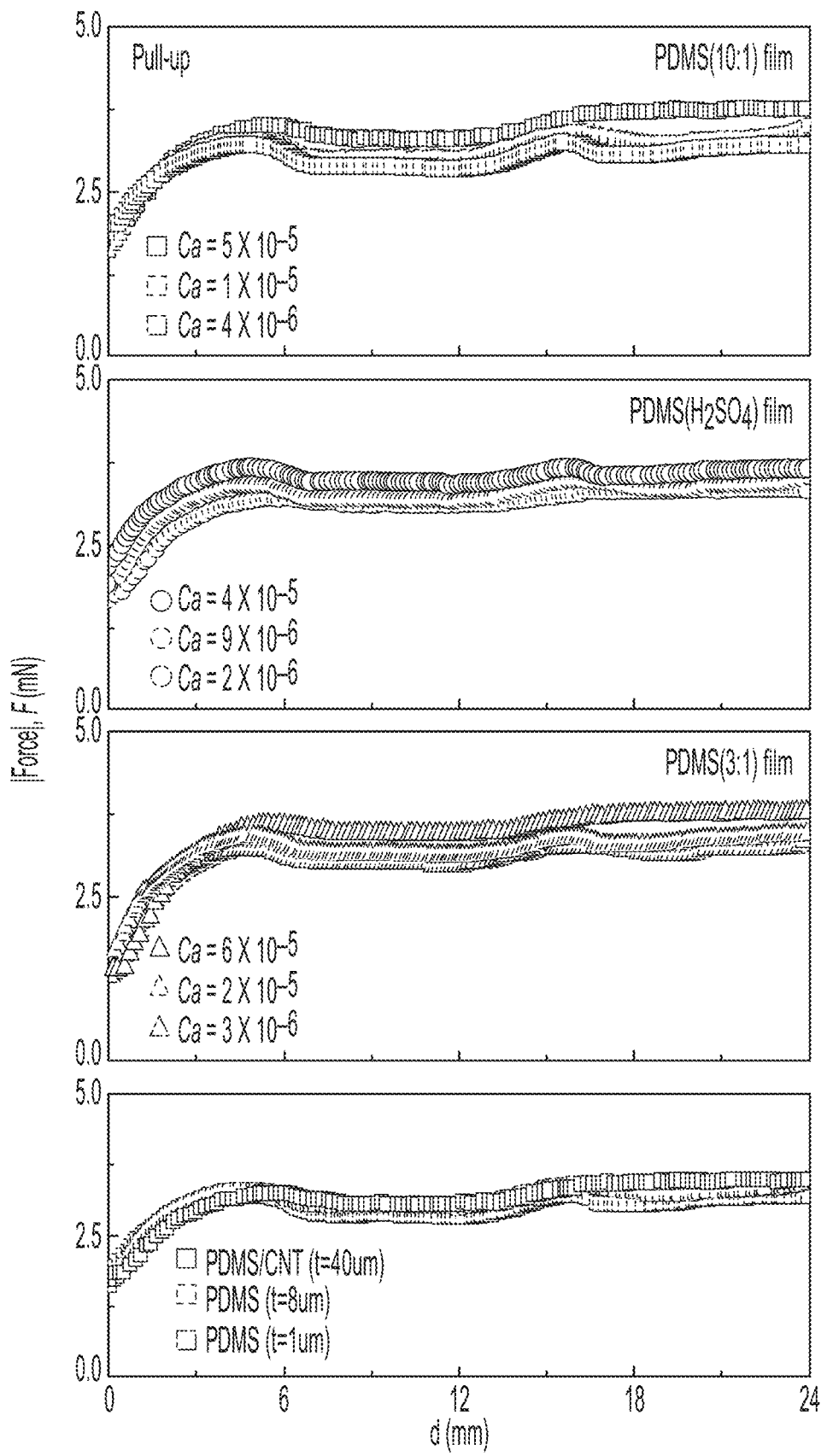
FIG. 8A graphically illustrates experimental and theoretical comparisons of variations in magnitude of transfer force with displacement during capillary transfer experiments for different soft film materials, film thickness and transfer velocities (denoted by capillary number Ca) in pull-up transfer.

FIG. 8A graphically illustrates experimental and theoretical comparisons of variations in magnitude of transfer force with displacement during capillary transfer experiments for different soft film materials, film thickness and transfer velocities (denoted by capillary number Ca) in pull-up transfer.

Figure 8B:
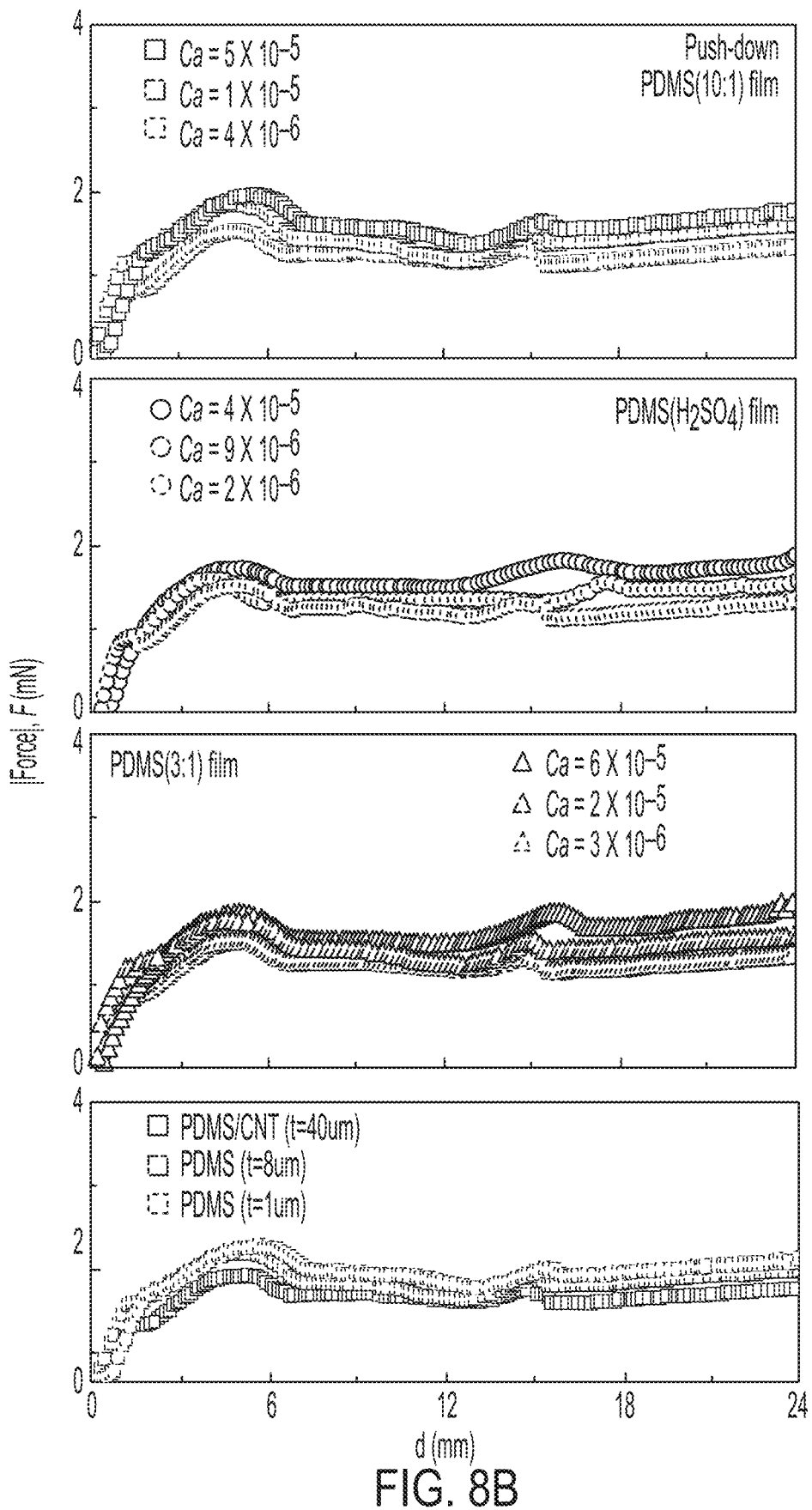
FIG. 8B graphically illustrates experimental and theoretical comparisons of variations in magnitude of transfer force with displacement during capillary transfer experiments for different soft film materials, film thickness and transfer velocities (denoted by capillary number Ca) in push-down transfer.

FIG. 8B graphically illustrates experimental and theoretical comparisons of variations in magnitude of transfer force with displacement during capillary transfer experiments for different soft film materials, film thickness and transfer velocities (denoted by capillary number Ca) in push-down transfer.

Figure 8C:
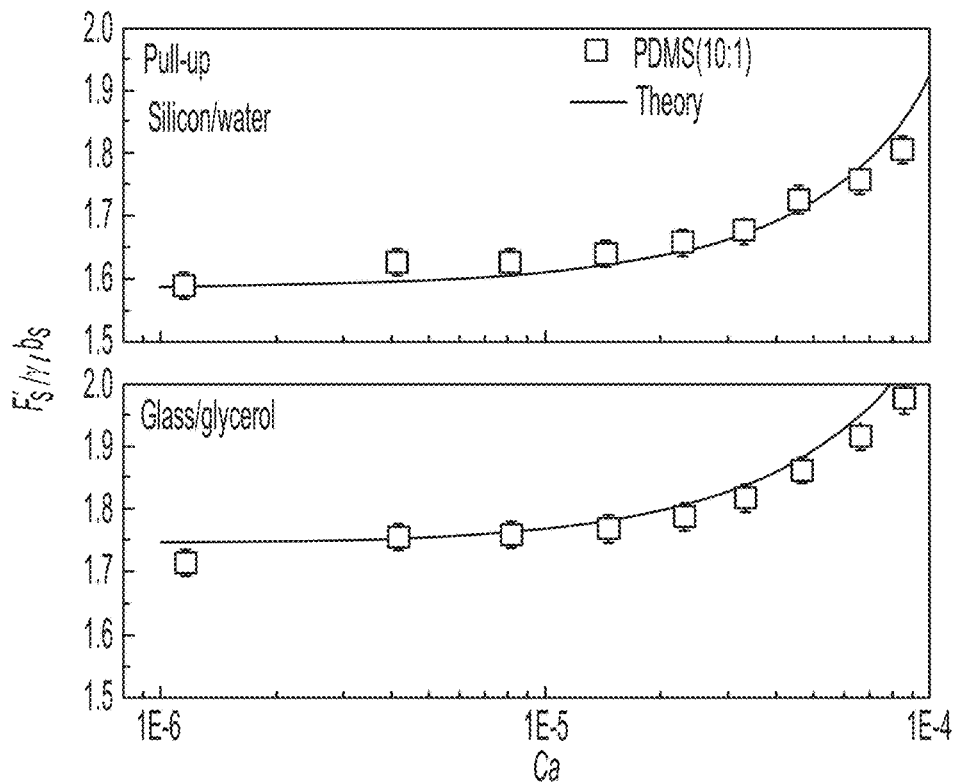
FIG. 8C graphically illustrates experimental and theoretical comparisons of the steady state transfer force normalized by the liquid surface tension ($\gamma_l$) and substrate width ($b_s$), $F_s'/\gamma_l b_s$, as a function of capillary number Ca for different substrate and liquid materials in pull-up direction.

FIG. 8C graphically illustrates experimental and theoretical comparisons of the steady state transfer force normalized by the liquid surface tension (γ$_l$) and substrate width (b$_s$), $F_s'/\gamma_l b_s$, as a function of capillary number Ca for different substrate and liquid materials in pull-up direction. Error bars represent the standard deviation from the mean of three independent experiments.

Figure 8D:
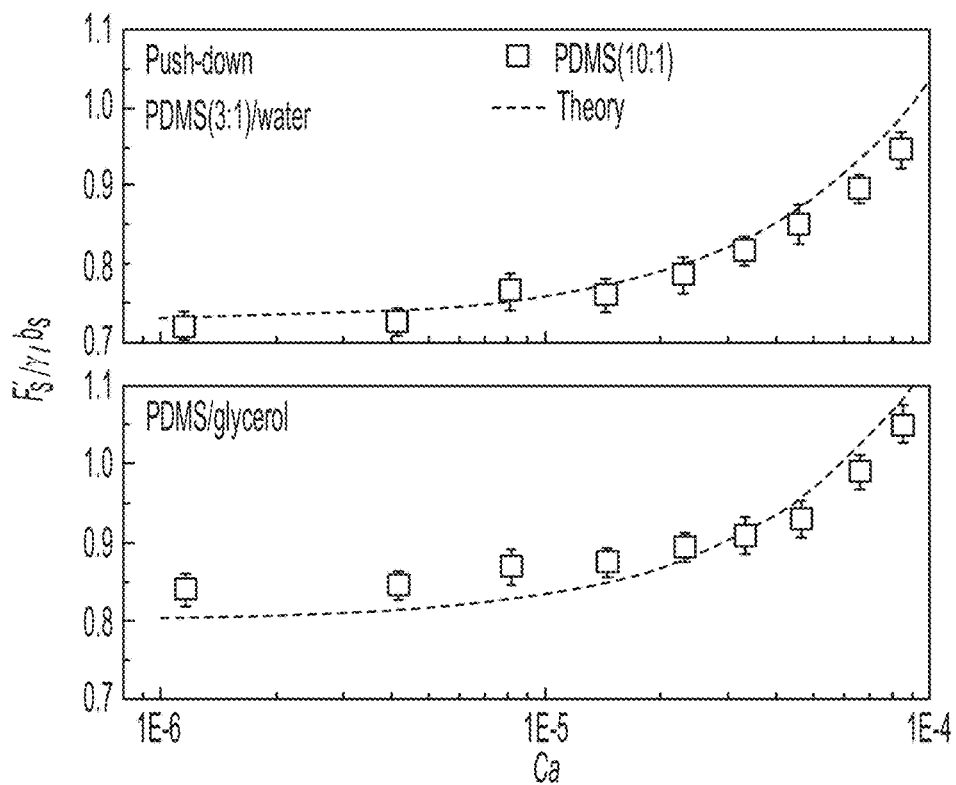
FIG. 8D graphically illustrates experimental and theoretical comparisons of the steady state transfer force normalized by the liquid surface tension ($\gamma_l$) and substrate width ($b_s$), $F_s'/\gamma_l b_s$, as a function of capillary number Ca for different substrate and liquid materials in push-down direction.

FIG. 8D graphically illustrates experimental and theoretical comparisons of the steady state transfer force normalized by the liquid surface tension (γ$_l$) and substrate width (b$_s$), $F_s'/\gamma_l b_s$, as a function of capillary number Ca for different substrate and liquid materials in push-down direction. Error bars represent the standard deviation from the mean of three independent experiments.

Figure 8E:
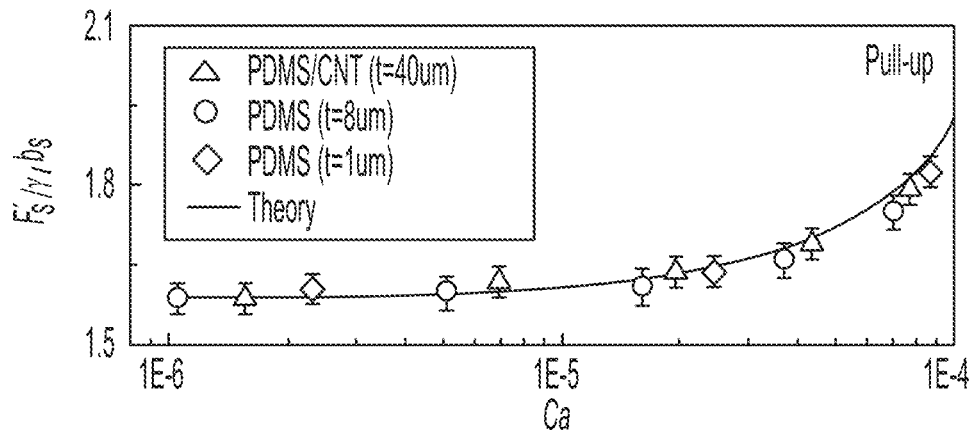
FIG. 8E graphically illustrates experimental and theoretical comparisons of the normalized steady state transfer as a function of capillary number Ca for different film thickness in pull-up transfer.

FIG. 8E graphically illustrates experimental and theoretical comparisons of the normalized steady state transfer as a function of capillary number Ca for different film thickness in pull-up transfer.

Figure 8F:
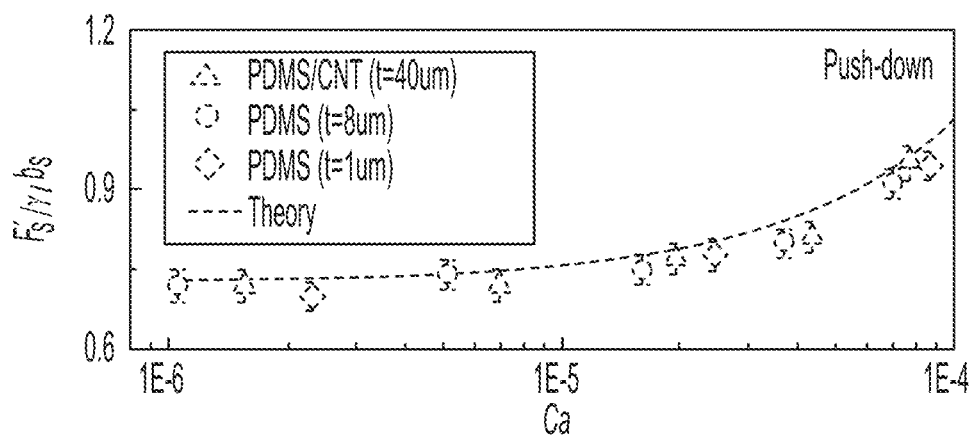
FIG. 8F graphically illustrates experimental and theoretical comparisons of the normalized steady state transfer as a function of capillary number Ca for different film thickness in push-down transfer.

FIG. 8F graphically illustrates experimental and theoretical comparisons of the normalized steady state transfer as a function of capillary number Ca for different film thickness in push-down transfer.

Figure 9A:
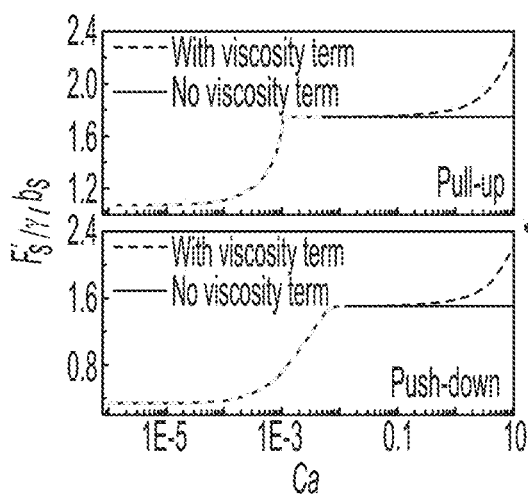
FIG. 9A graphically illustrates for pull-up transfer (top) and push-down transfer (bottom) the comparison between the magnitude of steady state transfer force normalized by the liquid surface tension ($\gamma_l$) and substrate width ($b_s$).

FIG. 9A graphically illustrates for pull-up transfer (top) and push-down transfer (bottom) the comparison between the magnitude of steady state transfer force normalized by the liquid surface tension (γ$_l$) and substrate width $$(b_s). \frac{F_s}{\gamma_l b_s} = 2\cos\left((\theta_{sl}^s - k_\varepsilon \cdot Ca)^{1/3}\right) + \frac{b_t}{b_s}\left(-G_{ts}/\gamma_l + \cos\theta_{tl} + 1\right) +$$

$$\frac{b_t}{b_s} Ca \frac{L}{H} \text{ (pull-up transfer) and } \frac{F_S}{\gamma_l b_s} = \left(-2 + \frac{b_t}{b_s}\right)\cos\left((\theta_{sl}^s + k_\varepsilon \cdot Ca)^{1/3}\right) +$$

$$\frac{b_t}{b_s}(-G_{ts} + \gamma_l) + \frac{b_t}{b_s} Ca \frac{L}{H} \text{(push-down transfer)}$$

with the consideration of liquid viscosity term normalized by $$(\gamma_l b_s), \text{ and } \frac{F_s}{\gamma_l b_s} 2\cos\left((\theta_{sl}^s - k_\varepsilon \cdot Ca)^{1/3}\right) + \frac{b_t}{b_s}\left(-G_{ts}/\gamma_l + \cos\theta_{tl} + 1\right) \text{ (pull-up)}$$

$$\text{and } \frac{F_s}{\gamma_l b_s} = \left(-2 + \frac{b_t}{b_s}\right)\cos\left((\theta_{sl}^s + k_\varepsilon \cdot Ca)^{1/3}\right) + \frac{b_t}{b_s}(-G_{ts} + \gamma_l) \text{ (push-down)}$$

without the effect of liquid viscosity term as a function of the capillary number (Ca).

Figure 9B:
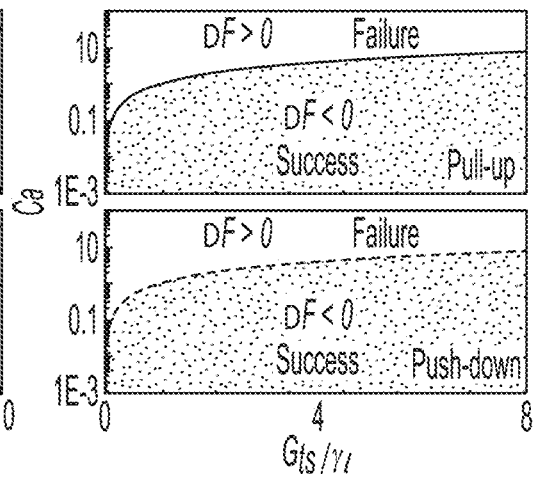
FIG. 9B graphically illustrates a theoretical diagram showing the successful criterion of capillary transfer with the effect of viscous term $$b_t\left(\mu U \frac{L}{H}\right)$$

FIG. 9B graphically illustrates a theoretical diagram showing the successful criterion of capillary transfer with the effect of viscous term $$b_t\left(\mu U \frac{L}{H}\right)$$

(see FIG. 3 for an analysis without effect of viscous term).

FIG. 10A graphically illustrates the 90-degree peeling test used for measuring the interfacial adhesion energy between film and substrate.

FIG. 10B graphically illustrates the experimentally-measured peeling strength (P) (applied peeling force per unit width)-peeling distance (l) curves obtained from peeling test when peeling PDMS (10:1) film from various substrates. The interfacial adhesion energy $G_{ts}$ can be calculated via $G_{ts}=P_{ss}$, where $P_{ss}$ is the average peeling strength at the steady state.

FIG. 10C graphically illustrates the experimentally-measured peeling strength (P) (applied peeling force per unit width)-peeling distance (l) curves obtained from peeling test when PDMS ($H_2SO_4$) film from various substrates. The interfacial adhesion energy $G_{ts}$ can be calculated via $G_{ts}=P_{ss}$, where $P_{ss}$ is the average peeling strength at the steady state.

FIG. 10D graphically illustrates the experimentally-measured peeling strength (P) (applied peeling force per unit width)-peeling distance (l) curves obtained from peeling test when peeling PDMS (3:1) film from various substrates. The interfacial adhesion energy $G_{ts}$ can be calculated via $G_{ts}=P_{ss}$, where $P_{ss}$ is the average peeling strength at the steady state.

FIG. 10E illustrates a summary of experimentally-measured interfacial adhesion energy $G_{ts}$ between thin film and substrate of various materials.

FIG. 11A graphically illustrates a theoretical phase diagram showing the successful conditions of capillary transfer, with additional experimentally-confirmed measurements for a wide variety of materials and thickness for soft film.

FIG. 11B graphically illustrates experimental and theoretical comparisons of the successful conditions of capillary transfer when the viscous term can be neglected.

FIG. 11C graphically illustrates a comparison of the maximum transfer speed between capillary transfer and existing techniques.

FIG. 12A graphically illustrates the surface topographies of a film with ~ 1 μm thickness before transfer (top) and after transfer (bottom) using pull-up transfer.

FIG. 12B graphically illustrates the surface topographies of a film with ~ 1 μm thickness before transfer (top) and after transfer (bottom) using push-down transfer.

FIG. 13A graphically illustrates uniaxial tensile stress—strain curves of PDMS/CNT composite film with different CNT concentrations, where the initial linear stage was used to extract the Young's modulus E. The failure strain was the strain where the stress begins to drop.

FIG. 13B graphically illustrates the surface roughness of the top and bottom surfaces of PDMS/CNT film measured by the 3D digital light microscope.

FIG. 13C graphically illustrates the measured peeling strength (P) (peeling force per unit width)-peeling distance (l) curves obtained from peeling tests used to obtain the interfacial adhesion energy between the top and bottom surfaces of PDMS/CNT composite film and substrate. The top and bottom film surface means the surface exposed to air, and the surface in contact with substrate in the film fabrication process, respectively, as shown in the inset. These two surfaces have different surface morphology, leading to different adhesion energy.

FIG. 13D illustrates a summary of the measured elastic modulus (E), failure strain and adhesion energy for PDMS/CNT composite film with different CNT concentrations. The failure strain of film with CNT concentration smaller than 25% is larger than 0.21.

FIG. 14A illustrates an FEA model of the capillary transfer process. The film 21 was considered elastic with elastic modulus (E) obtained from the tension experiments described above (FIG. 13). The interaction between film 21 and substrate 11 was modeled using cohesive zone model with cohesive energy parameters obtained from the peeling test described above (FIG. 13). A constant velocity loading was applied to the free end of the substrate 21 in an either upward or downward direction to simulate the pull-up and push-down processes, and at the same time, the force F and displacement d was output during this process. Distributed forces were applied to the other ends of film 21 and substrate 11 opposite to the moving direction to simulate the capillary interactions between film 21 and liquid (e.g., liquid surface 3), and between substrate 11 and liquid (e.g., liquid surface 3). The film 21 is shown having a proximal edge 27 and distal edge 28 and also shown is the transfer front P.

FIG. 14B graphically illustrates experimental and theoretical comparisons of the steady state transfer force from the experiment and simulation in both pull-up and push-down directions and for both smooth and rough surfaces.

FIG. 14C illustrates FEA snapshots showing deformation strain distribution contour of the film during the pull-up (retraction) process at various stages of transfer completion (going from left to right viewing the illustration). The film 21 having a proximal edge 17 and distal edge 28 whereby the film 21 starts out resting or floating on the surface 3 of the liquid. Also shown is the transfer front P where the substrate 11, the film 21, and the surface 3 of the liquid all simultaneously intersect one another and physically contact one another.

FIG. 14D illustrates FEA snapshots showing deformation strain distribution contour of the film during the push-down (advancement) transfer process at various stages of transfer completion (going from left to right viewing the illustration). The film 21 having a proximal edge 17 and distal edge 28 whereby the film 21 starts out resting or floating on the surface 3 of the liquid. Also shown is the transfer front P where the substrate 11, the film 21, and the surface 3 of the liquid all simultaneously intersect one another and physically contact one another.

FIG. 15A provides a photographic depiction of water droplets on smooth surfaces of PDMS/CNT composite film before transfer (top) and after transfer (bottom) for different CNT concentrations.

FIG. 15B provides a photographic depiction of water droplets on rough surfaces of PDMS/CNT composite film before transfer (top) and after transfer (bottom) for different CNT concentrations.

FIG. 15C provides a photographic depiction of experimental results alongside a theoretic model of FEA simulations of both pull-up (top) and push-down (bottom) capillary transfer of PDMS/CNT composite film when the smooth and rough surfaces of film are flipped.

FIG. 16A provides a photographic depiction of experimental results alongside a theoretic model of FEA simulations of the capillary transfer of PDMS/CNT composite film with different patterns in pull-up direction.

FIG. 16B graphically illustrates experimental and FEA simulation results of the capillary transfer of PDMS/CNT composite film with different patterns in pull-up direction.

FIG. 16C provides a photographic depiction of experimental results alongside a theoretic model of FEA simulations of the capillary transfer of PDMS/CNT composite film with different patterns in pull-up direction.

FIG. 16D graphically illustrates experimental and FEA simulation results of the capillary transfer of PDMS/CNT composite film with different patterns in push-down direction.

FIG. 16E provides a photographic depiction of imaging characteristics of three patterned films before (upper) and after pull-up transfer (lower).

EXAMPLES

Practice of an aspect of an embodiment (or embodiments) of the invention will be still more fully understood from the following examples and experimental results, which are presented herein for illustration only and should not be construed as limiting the invention in any way.

Example and Experimental Results

Mechanics and mechanism of capillary transfer: The working principle of this capillary transfer technology is illustrated in FIG. 1A, where one end of receiver substrate is submerged in the liquid bath to form the initial contact line among substrate, soft film and liquid, referred to as the transfer front ('P'). Upon the motion of the substrate in an either pull-up or push-down direction, the film will detach from the liquid surface and gradually transit onto the substrate across the transfer front that remains unchanged, until the entire film is transferred onto the substrate. After the transfer, with the pull-up direction, the bottom surface of film 21 will be in contact with the substrate 11 and the top surface 23 is exposed to air; by contrast, with the push-down direction, the top surface will be in contact with the substrate and the bottom surface of the film is exposed to air. At the initial state of transfer with the substrate moving velocity U, the soft film will be mechanically bent at the transfer front by the capillary force (FIG. 1B), and the bending deformation depends on the bending stiffness of the film, wettability of substrate and film to liquid, and transfer velocity U. With a negligible elongation and local deformation of the soft film at the transfer front (see Theoretical Model Analysis in Materials and Methods), the geometric profile of the bent soft film is $$y = he^{-x\sqrt{\frac{\rho g}{\gamma_l}}},$$

where $\gamma_l$ and $\rho$ are the surface tension and density of liquid, respectively.

$$h = \sqrt{\frac{\gamma_l}{\rho g}} \cot\phi$$

is the height of the transfer front relative to the liquid surface and $\phi$ represents the tangential direction of the bent film at the transfer front with respect to the vertical (−y) direction. The pull-up transfer requires that the transfer front must be above the liquid surface to allow the film to pass by moving upwards, and we have h>0 associated with the bending upwards of the film (i.e. $\phi$<90°); by contrast, the push-down transfer requires the transfer front to be below the liquid surface to allow the film to pass by moving downwards, and we have h<0 associated with bending downwards of the film (i.e. $\phi$>90°). h=0 suggests that the capillary force is too small to bend the film ($\phi$=90°), and the film cannot be transferred to the substrate, which corresponds to the limit of flexural rigidity. The essential deformation of the film reflects the energy balance between elastic bending deformation ($E_{bending}$) and solid-liquid interaction ($E_{surface}$) and can be quantified through the total energy $E_t = E_{bending} + E_{surface}$, where $$E_{bending} = \int \frac{1}{2}\left(\frac{Bb_t}{12}\right)\left(y''/(1+y'^2)^{\frac{3}{2}}\right)^2 (1+y'^2)^{\frac{1}{2}} dx,$$

$$E_{surface} = -\gamma_l \cos\theta_{sl}^d b_t \frac{h}{\cos\alpha}, \text{ where } B = Et^3$$

is the bending stiffness of film, E, t and $b_t$ are the elastic modulus, thickness and width of film, respectively; $\gamma_l$ is the surface tension of liquid, a is the direction of substrate relative to the vertical (−y) direction, and $\theta_{sl}^d$ is the dynamic contact angle of substrate to the liquid. Further, define the advancing and receding contact angle of substrate to liquid $\theta_{sl}^\alpha$, and $\theta_{sl}^r$, respectively, and the moving velocity of substrate relative to liquid U, when the substrate is pushed down into the liquid, we will have $\theta_{sl}^d = \theta_{sl}^\alpha$, and the rate dependence of $\theta_{sl}^\alpha$ is described by the equation $(\theta_{sl}^\alpha)^3 - (\theta_{sl}^s)^3 = k_e \cdot Ca$, (19) where $$Ca = \frac{\mu U}{\gamma l}$$

is the capillary number, $\mu$ is the liquid viscosity and $\theta_{sl}^s$ is the static contact angle of substrate to liquid. $k_e$ depends on the slip length and for example $k_e=3.2\times10^8$ for liquid water and PDMS substrate (FIGS. 5 and 6B). Similarly, when the substrate is pulled up out of the liquid, we will have $\theta_{sl}^d = \theta_{sl}^r$, and $(\theta_{sl}^s)^3 - (\theta_{sl}^r)^3 = k_e \cdot Ca$, where $k_e = 1.1\times10^8$ for liquid water and glass substrate (FIGS. 5 and 6C). The minimization of total energy $E_t$ will be utilized to determine h that helps predict the transfer direction by adjusting the properties of soft film, liquid environment, and transfer substrate (FIG. 1C). A large $\alpha$ will lead to a small minimum total energy $E_t$ with an increased magnitude of the height h (FIGS. 7A and B) and is beneficial for achieving a successful transfer by both pull-up and push-down transfers. FIG. 7C summarizes the effect of these transfer conditions on the selection of transfer directions. These theoretical phase diagrams show that a more hydrophobic transfer substrate and a higher capillary number Ca will be beneficial for the push-down transfer. By contrast, a more hydrophilic transfer substrate will be beneficial for the pull-up transfer.

As an example, the glass with a hydrophilic surface and PDMS with a hydrophobic surface were chosen as model transfer substrates to demonstrate the pull-up and push-down transfer of a PDMS soft film (slightly dyed for visualization) with thickness t about 200 μm from a liquid water bath at the speed of 0.1 mm/s, respectively. At the beginning, the magnitude of transfer force for both push-down and pull-up transfers shows an increase with the increase of displacement (FIG. 2A). Once the film transfer initiates, it decreases until the onset of a steady state stage with a constant magnitude. At the end of transfer, the force gradually recovers back to that of initial transfer. Compared with their corresponding transfer force—displacement curves without film transfer, the drop of the transfer force for both transfer directions at the steady state stages is observed and reflects the effect of film on the interaction between substrate and liquid. Upon completion, successful transfers of PDMS films onto both the glass and PDMS substrates via pull-up and push-down transfers respectively are obtained (FIG. 2B). More importantly, with the pull-up transfer, the bottom surface of PDMS film in initial contact with water (labeled "B") adheres to the substrate and the top surface (labeled "T") is exposed to air; with the push-down transfer, the bottom surface of film is exposed to air instead. Similar results are obtained in the transfer for different film materials, thicknesses, and moving velocities (FIGS. 8A and B), which are in good agreement with theoretical predictions in FIG. 1D. We further predict the transfer force $F_s$ at the steady state process. At Ca<0.01, where the effect of viscosity can be neglected (FIG. 9), they are simplified to $F_s = 2b_s\gamma_l \cos((\theta_{sl}^s - k_e \cdot Ca)^{1/3}) + b_t(-G_{ts} + \gamma_l \cos\theta_{tl} + \gamma_l)$ for pull-up transfer and $F_s = (-2b_s\gamma_l + b_t\gamma_l)\cos((\theta_{sl}^s + k_e \cdot Ca)^{1/3}) + b_t(-G_{ts} + \gamma_l)$ for push-down transfer, where $G_{ts}$ is the adhesion energy between soft film and transfer substrate and can be measured from a separate peeling test (FIG. 10); $b_s$ is the width of transfer substrate. These theoretical predictions of transfer force in both pull-up and push-down transfers show remarkable agreement with experimental measurements for a wide variety of film materials with different stiffness, thickness and surface wettability, transfer substrates and liquids under a series of moving velocities of transfer substrate (FIG. 2C and FIG. 8). Similar to the transfer force with film, the force without the transfer of film during the pull-up and push-down processes of substrate can also be obtained and they are $F_s = 2b_s\gamma_l \cos\theta_{sl}^r$ for pull-up and $F_s = -2b_s\gamma_l \cos\theta_{sl}^\alpha$ for push-down, which agrees well with experiments (FIG. 2A).

Design diagrams for pull-up and push-down capillary transfer: Once the transfer direction of pull-up or push-down is determined, a successful transfer requires a continuous pass of film across the whole transfer front. The difference in the magnitude of transfer force ΔF between with and without the transfer of film at the steady state of transfer process is a straightforward and sufficient factor to formulate the criterion that guides the success of capillary transfer along both directions. For example, if ΔF<0, the pass of film across the transfer front is an energy favorable process, and the transfer will succeed, and otherwise, the transfer will fail. For pull-up and push-down transfer, with the neglected effect of viscosity (Ca<0.01), we will have $\Delta F = b_t(-G_{ts} + \gamma_l \cos\theta_{tl} + \gamma_l)$ for pull-up transfer and $\Delta F = b_t(-G_{ts} + \gamma_l \cos\theta_{sl}^a + \gamma_l)$ for push-down transfer. Besides, for the push-down transfer, a successful transfer requires the transfer energy $(-G_{ts} + \gamma_l \cos\theta_{sl}^a + \gamma_l) < 0$. As a consequence, when the transferred film is pulled out of the liquid bath with the substrate together under the same transfer angle and speed, the transfer energy is $-(-G_{ts} + \gamma_l \cos\theta_{sl}^a + \gamma_l)$, and apparently it is >0, suggesting that the transferred film will keep in good contact with the substrate without detachment. FIG. 3 provides the theoretical phase diagrams on the successful criterion of pull-up and push-down transfer with confirmation of experiments on a wide variety of system materials for soft films, film thickness, transfer substrates and liquid media. In particular, the experiments show that the success for both transfers is independent of film thickness in a range from hundreds of micrometers to 1 μm, and agree well with theoretical analysis (FIG. 3 and FIG. 11A). In addition, compared with the pull-up transfer, because of the dependence on capillary number Ca of $\theta_{sl}^a$, the success of push-down transfer will be enhanced by an increased Ca (FIG. 3 and FIG. 11B). More importantly, take the capillary number Ca=0.01, the transfer speed can be three orders of magnitude higher than conventional transfer methods (FIG. 11C) and could be even higher after optimization of systemic parameters such as $G_{ts}/\gamma_l$ (FIG. 9). Such high transfer speed is further demonstrated in FIG. 11, and its dependence with transfer directions also agrees well with theoretical predictions. We should note that the trapped liquid between substrate and film might exist after both transfers, and the resultant deformation of films due to its subsequent drying out is far less than its elastic strain limit and can be neglected even for the film down to 1 μm in thickness. Such negligible deformation is also confirmed with the almost same surface topography of the film before transfer and after 24 hours of transfer (FIG. 12). Harnessing capillary transfer to achieve on-demand transfer and assembly of soft films: This capillary transfer has many potential applications that enable assembly of film structures with on-demand surface patterns and properties. To illustrate these capabilities, we performed extensive experiments on transfer of conductive composite solid and patterned films at the transfer speed of 0.1 mm/s. FIG. 4A demonstrates a transfer of PDMS/CNT composite film (200 μm in thickness) onto glass substrate by the pull-up transfer and onto PDMS substrate by push-down transfer at the transfer speed of 1 mm/s (Ca=1.4×10$^{-5}$). The pull-up transfer yields the top surface (labeled "T") of PDMS/CNT composite film exposed to air for use. By contrast, the push-down transfer yields the bottom surface (labeled "B") of PDMS/CNT composite film exposed to air for use. In parallel, we performed (FEA that reproduced the transfer process (see FIGS. 13 and 14). The transfer force at the steady state transfer process shows good agreement with experiments (FIG. 14). More importantly, the FEA strain analysis (inset in FIG. 4A) shows that the mechanical deformation is not only far smaller than the failure strain of film during both pull-up and push-down transfer processes (elastic limit of film ~10%, FIG. 13), but will also fully recover with zero strain after successful transfer onto both substrates, suggesting that both transfers will not cause any potential damage during transfer process or leave any residual strain to the film after transfer. To further confirm the negligible mechanical deformation of film after transfer, we measured and compared the electrical resistance of PDMS/CNT composite film as fabricated and after transfer. Remarkable consistence between them is obtained after both transfers (FIG. 4B). When the concentration of CNTs in composite films changes, this consistence is maintained. In particular, when the CNT concentration is as high as 25%, it leads to an electrical resistance down to ~4 kΩ due to formation of CNTs networks in the film. Such very sensitive microstructures to mechanical deformation remains, as supported by unchanged electrical resistance after transfer onto substrates by either pull-up or push-down transfer, indicating potential applications in transfer of flexible/stretchable electronic devices with very fine microstructures (20). We further compared the surface wettability of as-fabricated and after-transferred films by measuring the contact angle of water droplet on both film surfaces with a series of CNT concentration. The contact angle of PDMS/CNT composite film remains unchanged after transfer in both directions (FIG. 4C), independent of CNT concentrations. Although the measured contact angles in both film surfaces are different because of surface roughness that is obtained in the preparation of composite films in an open Petri dish (FIG. 13B), they remain unchanged after the capillary transfer onto substrates (FIG. 4D and FIG. 15A, B). The unaffected electrical function and surface wettability of films also indicates that the mechanical deformation associated with the drying out of possibly trapped water between film and substrate after transfer can be neglected, consistent with theoretical analysis and surface morphology on the characterization of PDMS thin film (FIG. 12). When the smooth and rough surface of composite film is switched on the water surface, this composite film is also successfully transferred onto substrates (FIG. 15C). Accordingly, the film surface is also flipped over with rough and smooth surface exposed to air after pull-up and push-down transfer, respectively, and the electrical resistance and surface wettability of the film remain after transfer (FIG. 4B-D). These demonstrations on the same film but an opposite surface side in contact with the substrate indicate that the capillary transfer approach can be well applied to achieve desirable surface functions of films such as Janus films by solely controlling the direction of transfer.

To demonstrate the capability of capillary transfer for films with complex and delicate patterns, three PDMS/CNT composite films with 'UVA' letters, logo and kirigami patterns respectively have been made and successfully transferred to a glass and PDMS substrate from a water surface using both pull-up and push-down methods (FIG. 4E and FIG. 16A-D). Besides, FEA results confirm that the maximum strain in the patterned films is much smaller than the elastic limit (>10%) of film materials during the entire transfer processes and the deformation also fully recovers after completion of transfer, indicating a successful transfer and preservation of the complex and delicate patterns and structures onto substrates. The electrical resistance was measured and remains the same before and after transfer (FIG. 4F and FIG. 16E), which proves that both the pattern and function of the film were not changed by the transfer process. Comparison of imaging characteristics of these three patterned films before and after transfer further confirms that the fidelity of these patterns is precisely maintained (FIG. 4G and FIG. 16E). The capability of capillary transfer in assembly of multilayered soft film structures is demonstrated by rationally selecting and combining these two directions of push-down and pull-up transfer (FIG. 4I1). The PDMS/CNT composite film with 'UVA' pattern was first transferred from water surface to glass slide using the pull-up transfer. Next, a PDMS layer (dyed in purple) was transferred onto the film substrate with the UVA pattern through the push-down transfer. Afterward, the PDMS/CNT composite film with kirigami structure was transferred onto this dyed PDMS layer, generating a composite layered structure with two different surface patterns after peeling from the substrate.

Materials and Methods

Materials. In the fabrication of PDMS film, PDMS (Sylgard 184, Dow Corning Corp.) with 10:1 (otherwise stated) of base polymer to cure agent was first mixed and degassed. The mixture was then poured into a Petri dish and placed in 150° C. oven for 1 hour to cure. In the fabrication of PDMS/CNT composite film, PDMS with 10:4 base polymer to hexane (n-Hexane, anhydrous, 95%, Sigma-Aldrich) was first mixed and then followed by the addition of multiwalled carbon nanotubes (CNT, 8-15 nm in diameter, 10-15 μm in length, 95%, NanoAmor Inc.). The PDMS-Hexane/CNTs mixture was placed in an ultrasonicator for at least 12 hours with 40 kHz to achieve a homogeneous distribution of CNTs. Afterward, the PDMS curing agent was added to cure the mixture at 80° C. for 1 hour. In the fabrication of patterned PDMS/CNT film, a mold with desired pattern (letters, logo and kirigami patterns) was first fabricated using the 3D printer (Objet Connex 500, Stratasys Inc.), and then the printed mold was pressed onto the liquid PDMS/CNT mixture before the cure. After the cure, the mold was removed and the patterned film was left in the Petri dish.

Chemical treatment was conducted to tune the surface wettability of as-fabricated PDMS film by utilizing Piranha solution that introduces OH group at the surface of PDMS film and modifies the wettability (21). Dilution of 50% hydrogen peroxide (Sigma Aldrich) to 30% with DI water was carried out in a beaker, and then followed by the addition of 98% sulfuric acid (Acros Organics) in a volume ratio of 3:1. The as-prepared Piranha solution was then poured on PDMS films in Petri dish and then soaked for 15-30 mins that depend on the desired wettability. After that, films were rinsed by DI water and finally dried in air.

Characterization of surface wettability. In the measurement of static contact angle $\theta_{sl}^s$, a liquid droplet with volume ~3 μL was first pipetted onto the target surface of solid material. The image of the profile of the liquid droplet was then captured using the goniometer system (Ramé-Hart 200-00). Afterward, the analysis software, DROPimage Standard, was used to process the image to obtain $\theta_{sl}^s$. The measurement of dynamic contact angles between solid substrate and liquid was conducted in tensiometer (Krüss K100) (FIG. 5A), detailed below. The substrate was held by the force gauge of the tensiometer and was pushed down into or pulled up out of the liquid bath in depth H with a velocity U. During the push-down process that corresponds to the push-down transfer, the contact angle between substrate and liquid increases from the static contact angle $\theta_{sl}^s$, until approaching a new equilibrium contact angle which is the advancing dynamic contact angle $\theta_{sl}^a$ (FIG. 5B). Simultaneously, the variation of capillary force with the moving displacement of substrate is also recorded, and at the new equilibrium steady state stage, the capillary force is $F_s^a$. The $\theta_{sl}^a$ can be determined via cos $\theta_{sl}^a$ $F_s^a/\gamma_l L_p$, where $\gamma_l$ is the liquid surface tension and $L_p$ is the perimeter of the substrate. By contrast, during the pull-up process that corresponds to the pull-up transfer, the contact angle decreases from the static contact angle $\theta_{sl}^s$ to a new equilibrium contact angle which corresponds to the receding dynamic contact angle $\theta_{sl}^r$ (FIG. 5C). The $\theta_{sl}^r$ is determined via cos $\theta_{sl}^r = F_s^r/\gamma_l L_p$, where $F_s^r$ is the equilibrium force during the pull-up process. The force is negative when its direction is downward and is positive when it is upward. In addition, the static contact angle $\theta_{sl}^s$ measured from the goniometer system (Ramé-Hart 200-00) can be confirmed from dynamic contact angles via $$\cos\theta_{sl}^s = \frac{\cos\theta_{sl}^a + \cos\theta_{sl}^r}{2}. \tag{22}$$

Capillary transfer experiments. In the capillary transfer experiments, a clean substrate was first submerged in the liquid and was in contact with one end of the desired film to form the contact line (referred to as the transfer front), where the film was placed in the liquid surface with the help of soluble tape and could also be printed directly. Then the substrate was held by the force gauge of the tensiometer (Kruss K100) to be either pulled up out of or pushed down into the liquid bath in the vertical direction (α=0°) with a velocity U. During the motion of substrate, if the transfer was successful, the film would pass across the transfer front, and was gradually transferred onto the moving substrate. If the transfer failed, the film could not pass across the transfer front, and would stay on the liquid surface. During the transfer process, the magnitude of transfer force F and moving displacement d were recorded by the tensiometer. The transfer process was recorded by the high-resolution camera placed near the tensiometer. For each transfer, the experiment was repeated 10 times under the same condition. The transfer was considered to be successful if the successful rate was larger than 50%, and otherwise it failed.

Measurement of interfacial adhesion energy. The peeling test was performed in dry air to measure the adhesion energy $G_{ts}$ at the interface between film and substrate. A layer of film with thickness in 200 μm was first adhered on the target receiver substrate. The as-prepared specimen was firmly attached on the moving stage of the tensiometer with a double-sided tape (Kapton). The film was peeled off from the substrate at one end with 90° peeling angle. During the peeling process, the peeling strength P (applied peeling force per unit of film width) and displacement/were recorded (FIG. 10). The interfacial adhesion energy $G_{ts}$ was calculated via $G_{ts}=P_{ss}$, where the effect of elastic tension deformation of film on the peeling can be neglected with thickness about 200 μm, (23) and $P_{ss}$ is the averaged value of the peeling strength at the steady state.

Characterization of PDMS/CNT composite films. Uniaxial tensile test was performed to measure the Young's modulus E of film. The test specimen was 100 mm in overall length, 30 mm in overall width, and 1 mm in thickness. The initial linear stage of the tensile stress—strain curves was used to extract the Young's modulus E (FIG. 13A). The failure strain was defined where the stress began to drop. In addition, during the curing process of PDMS/CNTs solution, because the bottom side was in contact with the Petri dish but the top side was exposed to air, this manufacturing process led to a rough top surface and a relatively smooth bottom surface of PDMS/CNTs film, as confirmed by the Hiroc RH-8800 3D digital light microscope (FIG. 13B). Peeling test was performed to measure the adhesion energy $G_{ts}$ of both top (rough) and bottom (smooth) surfaces of PDMS/CNTs composite film with substrate (FIG. 13C), and the measured interfacial adhesion energy is summarized in FIG. 13D.

Theoretical model and analysis. At the initial state of transfer with the substrate moving velocity U, the essential deformation of the soft film at the transfer front (i.e. contact line among substrate, film and liquid) (24-27) results from the energy competition among the elastic bending deformation ($E_{bending}$) of the soft film, the elastic elongation (stretching) deformation of the soft film ($E_{elongation}$), and the solid-liquid capillary interaction ($E_{surface}$) can be quantified through the minimization of total energy via $E_t = E_{bending} + E_{elongation} + E_{surface}$, where $$E_{bending} = \int_0^{L(1+\varepsilon)} \frac{Bb_t}{24} k^2 ds \text{ and } E_{surface} = -\gamma_l \cos\theta_{sl}^d b_t \sqrt{\frac{\gamma_l}{\rho g}} \cot\phi/\cos\alpha;$$

$$B = Et^3$$

is the bending stiffness of the soft film, E, t and $b_t$ are the elastic modulus, thickness and width of the soft film, respectively; $\varepsilon$ is the elongation (stretching) strain, k is the local curvature and L is the length of the soft film; $\gamma_l$ is the surface tension of liquid, $\rho$ is the liquid density, $\phi$ is the tangential direction of the bent soft film at the transfer front with respect to the vertical (−y) direction (FIG. 1A), and $\alpha$ is the direction of substrate relative to the vertical (−y) direction; $\theta_{sl}^d$ is the dynamic contact angle of the substrate to the liquid, and $\theta_{tl}$ is the contact angle of the soft film to the liquid. When the soft film begins to be transferred from the liquid surface, it could be stretched by the capillary force (per unit width) $\gamma_l \cos\theta_{tl}$ and/or viscous force (per unit width)

$$\mu U \frac{L}{H},$$

where $\mu$ is the liquid viscosity, U is the transfer velocity (i.e. substrate moving velocity) and H is the depth of liquid bath (FIG. 5A). The elongation strain of the soft film can be obtained, which is $$\varepsilon = \left| \frac{\gamma_l \cos\theta_{tl} + \mu U \frac{L}{H}}{Et} \right|$$

and the resultant elastic elongation energy is $$E_{elongation} = (Lb_t t)\left(\frac{1}{2}\varepsilon^2 E\right) = \frac{\left(\gamma_l \cos\theta_{tl} + \mu U \frac{L}{H}\right)^2 Lb_t}{2Et}.$$

Consider the surface tension of water $\gamma_l = 0.072$ N/m, surface wettability of PDMS film $\theta_{tl}$ (~110°), transfer speed U(<700 mm/s, i.e. the capillary number Ca<1×10$^{-2}$, where the effect of viscosity can be neglected), the water viscosity (~0.001 Pa·s) and the PDMS film with modulus E (~2 MPa) and thickness t (~200 µm) used in our experiments, the elongation energy per unit width $$E_{elongation}/b_t = \frac{\left(\gamma_l \cos\theta_{tl} + \mu U \frac{L}{H}\right)^2 L}{2Et}$$

is ~10$^{-7}$ J/m. Besides, consider the capillary length $$\sqrt{\frac{\gamma_l}{\rho g}} \simeq 3 \text{ mm,}$$

the interfacial energy per unit width $$E_{surface}/b_t = -\gamma_l \cos\theta_{sl}^d \sqrt{\frac{\gamma_l}{\rho g}} \cot\phi/\cos\alpha \text{ is} \sim 10^{-4} \text{ J/m.}$$

Therefore, in comparison with the interfacial energy per unit width, the contribution of elongation energy $E_{elongation}$ can be neglected, and the deformation of the soft film at the transfer front at the initial state of transfer is dominated by the competition between elastic bending deformation ($E_{bending}$) and solid-liquid capillary interaction $(E_{surface})$, $$\text{where } E_{bending} = \int_0^L \frac{Bb_t}{24} k^2 ds = \int \frac{1}{2}\left(\frac{Bb_t}{12}\right)\left(y''/(1+y'^2)^{\frac{3}{2}}\right)^2 (1+y'^2)^{\frac{1}{2}} dx$$

due to the negligible $\varepsilon$. As a result, the profile of the soft film at the transfer front can be characterized by the geometric analysis with bending deformation via $$y = \sqrt{\frac{\gamma_l}{\rho g}} \cot\phi e^{-x\sqrt{\frac{\rho g}{\gamma_l}}}.$$

At the steady state transfer process, the energy principle is further formulated to calculate the magnitude of the transfer force. Consider a small motion distance of substrate $\Delta d$, the work done by the transfer force is $\Delta E^F = F_s \Delta d$, where $F_s$ is the magnitude of steady state transfer force. The associated change of the interfacial energy in the pull-up transfer is $\Delta E_{surface} = 2(\gamma_l \cos\theta_{sl}^r) b_s \Delta d + (-G_{ts} + \gamma_l \cos\theta_{tl} + \gamma_l) b_t \Delta d$, where $G_{ts}$ is the adhesion energy between thin film and substrate, $\theta_{tl}$ is the contact angle of film to liquid, $b_t$ is the width of film and $b_s$ is the width of substrate. For the push-down transfer, the associated change of interfacial energy is $\Delta E_{surface} = -2(\gamma_l \cos\theta_{sl}^\alpha) b_s \Delta d + (-G_{ts} + \gamma_l \cos\theta_{sl}^\alpha + \gamma_l) b_t \Delta d$. Because the bending profile of the soft film keeps unchanged during the steady state transfer, the elastic bending energy remains constant, and the associated variation of the elastic deformation energy $\Delta E_{deformation}$ only results from the elongation (stretching) deformation of the soft film, which is $$\Delta E_{deformation} = -\left(\gamma_l \cos\theta_{tl} + \mu U \frac{L}{H}\right)^2 b_t \Delta d/2Et.$$

The dissipated energy due to the viscous effect of liquid is $$\Delta E_D = \mu U b_t \frac{L}{H} \Delta d \quad (28).$$

Therefore, the energy balance at the steady state transfer of film requires $\Delta E^F = \Delta E_{surface} + \Delta E_D + \Delta E_{deformation}$. Based on the above analysis, the contribution of elastic elongation energy can be neglected in comparison with the interfacial energy, and the energy balance becomes $\Delta E^F = \Delta E_{surface} + \Delta E_D$. As a result, we have the transfer force $$F_s = 2b_s\gamma_l\cos\theta_{sl}^r + b_t(-G_{ts} + \gamma_l\cos\theta_{tl} + \gamma_l) + \mu U b_t \frac{L}{H} =$$

$$2b_s\gamma_l\cos((\theta_{sl}^s - k_\varepsilon \cdot Ca)^{1/3}) + b_t(-G_{ts} + \gamma_l\cos\theta_{tl} + \gamma_l) + \mu U b_t \frac{L}{H}$$

$$F_s = -2b_s\gamma_l\cos\theta_{sl}^a + b_t(-G_{ts} + \gamma_l\cos\theta_{tl}^a + \gamma_l) + \mu U b_t \frac{L}{H} =$$

$$(-2b_s\gamma_l + b_t\gamma_l)\cos((\theta_{sl}^s - k_\varepsilon \cdot Ca)^{1/3}) + b_t(-G_{ts} + \gamma_l) + \mu U b_t \frac{L}{H}$$

for push-down transfer. At the capillary number $Ca<1\times10^{-2}$, the effect of viscosity of liquid on the steady state transfer force $F_s$ can be neglected (FIG. 9), and they are simplified to $F_s=2b_s\gamma_l \cos((\theta_{sl}^s-k_\varepsilon \cdot Ca)^{1/3})+b_t(-G_{ts}+\gamma_l \cos \theta_{tl}+\gamma_l)$ for pull-up transfer and $F_s=(-2b_s\gamma_l+b_t\gamma_l)\cos((\theta_{sl}^s+k_\varepsilon \cdot Ca)^{1/3})+b_t(-G_{ts}+\gamma_l)$ for push-down transfer. Similarly, the force with substrate only during the pull-up and push-down processes can also be obtained, and they are $F_s=2b_s\gamma_l \cos \theta_{sl}^r$ for pull-up and $F_s=-2b_s\gamma_l \cos \theta_{sl}^\alpha$ for push-down direction. Therefore, the difference of the transfer force, $\Delta F$, between with and without the transfer of film at the steady state of transfer process is $$\Delta F = b_t(-G_{ts} + \gamma_l\cos\theta_{tl} + \gamma_l) + b_t\left(\mu U \frac{L}{H}\right)$$

for pull-up transfer, and $$\Delta F = b_t(-G_{ts} + \gamma_l\cos\theta_{sl}^a + \gamma_l) + b_t\left(\mu U \frac{L}{H}\right)$$

for push-down transfer. When the contribution from the viscosity of liquid $$b_t\left(\mu U \frac{L}{H}\right)$$

is neglected (FIG. 9), $\Delta F=b_t(-G_{ts}+\gamma_l \cos \theta_{tl}+\gamma_l)$ for pull-up transfer, and $\Delta F=b_t(-G_{ts}+\gamma_l \cos \theta_{sl}^\alpha +\gamma_l)$ for push-down transfer. In addition, if liquid is trapped between film and substrate after transfer, the resultant capillary force (per unit area) exerted on the film by its subsequent evaporation could be estimated via $$\left|\frac{\gamma_l\cos\theta_{tl}}{t}\right|,$$

and can be neglected on the film deformation. For example, consider the liquid water, $\gamma_l=0.072$ N/m, surface wettability of PDMS film $\theta_{tl}(\sim 110°)$ and Young modulus E ($\sim 2$ MPa) measured in our experiments, the capillary force is $\sim 19$ KPa for PDMS film with thickness t=$\sim 1$ μm and $\sim 100$ Pa for PDMS film with thickness t=$\sim 200$ μm, which will lead to $\sim 0.9\%$ and $\sim 0.005\%$ for PDMS with thickness of t=$\sim 1$ μm, t=$\sim 200$ μm, respectively, far less than the elastic limit ($\sim 10\%$) of PDMS films.

Finite element analysis. Finite element analysis (FEA) (ABAQUS/standard package, Dassault Systémes) was conducted to simulate the capillary transfer process of film. In FEA (FIG. 14A), the plane strain model was employed to simulate the transfer experiments and the film was considered to be elastic and meshed with 4-node bi-linear plane strain elements. The elastic modulus (E) was obtained from the tensile experiments described above (FIG. 13). The substrate and liquid surface were modeled as rigid. Convergence of mesh size and number was tested to ensure computational accuracy. The interaction between film and substrate was modeled using a cohesive zone model with parameters obtained from the peeling test (FIG. 13). In the FEA model, a constant velocity was applied to the free end of the substrate exposed to air in an either upward or downward direction to simulate the pull-up or push-down transfer, meanwhile the liquid surface was fixed. The capillary constraint through a cohesive interaction was applied between film and liquid surface to ensure the film always moved along the liquid surface. Distributed forces were applied to the other end of film and substrate opposite to the moving direction to simulate the capillary interactions between film and liquid, and between substrate and liquid, respectively. The resultant force F and displacement d to the substrate in both pull-up and push-down transfer simulations were extracted to compare with those in the experiments. The agreement of F between simulation and experimental results (FIG. 14B) validated the FEA model. The maximum deformation strain in the film during the transfer process was also obtained from the simulations (FIG. 14C).

Additional Examples

Example 1. A transfer printing method for adhering a film onto a substrate, comprising:
　placing said film on the surface of a liquid so that said film floats or otherwise rests on the surface of said liquid, said film including a proximal edge and a distal edge;
　wherein the y-axis is defined as perpendicular to the plane of said surface of said liquid, wherein below the plane of said surface of said liquid is the negative y-axis and above the plane of said surface of said liquid is the positive y-axis;
　moving said film and said substrate relative to one another until said proximal edge of said film makes contact with said substrate across a transfer front (P) of said substrate;
　advancing or retracting said substrate at a specified velocity (U), with a specified force (F), relative to the location of said liquid and at a specified substrate angle (α) relative to the negative y-axis so that said film elastically deforms onto said advancing or retracting substrate due to capillary force between said liquid and said film; and
　detaching said film from said liquid and adhering said film onto said advancing or retracting substrate along said transfer front, wherein said film gradually transits across the transfer front among said advancing or retracting substrate, wherein said transfer front is defined as a single line segment or arc wherein said substrate, said film, and said liquid all simultaneously intersect one another and physically contact one another.

Example 2. The method of example 1, wherein said specified velocity of advancing or retracting substrate is a constant velocity.

Example 3. The method of example 1 (as well as subject matter in whole or in part of example 2), wherein said specified velocity of advancing or retracting substrate is a variable velocity.

Example 4. The method of example 1 (as well as subject matter of one or more of any combination of examples 2-3, in whole or in part), wherein said specified force of advancing or retracting substrate is a constant force.

Example 5. The method of example 1 (as well as subject matter of one or more of any combination of examples 2-4, in whole or in part), wherein said specified force of advancing or retracting substrate is a variable force.

Example 6. The method of example 1 (as well as subject matter of one or more of any combination of examples 2-5 in whole or in part), wherein said liquid is a liquid.

Example 7. The method of example 1 (as well as subject matter of one or more of any combination of examples 2-6, in whole or in part), wherein said liquid is a gas.

Example 8. The method of example 1 (as well as subject matter of one or more of any combination of examples 2-7, in whole or in part), wherein said film is a flexible material defined as a material having a Young's modulus equal to any one of the following:
   range of about 0.1 kPa to about 1 MPa;
   range about 1 kPa to about 1 MPa;
   range about 1 kPa to about 1 GPa;
   range about 1 kPa to about 1 TPa; or
   about 2 MPa. In an embodiment, the Young's modulus may be less than or greater than the ranges provided.

Example 9. The method of example 1 (as well as subject matter of one or more of any combination of examples 2-8, in whole or in part), wherein said film is a flexible material defined as a material having a bending stiffness (B) equal to any one of the following:
   a range of 0 to about 0.007 N*m;
   a range of about 0.007 N*m to about 0.014 N*m;
   a range of 0 N*m to about 0.014 N*m;
   about 0.001 N*m;
   about 0.01 N*m; or
   about 0.014 N*m. In an embodiment, the bending stiffness (B) may be less than or greater than the ranges provided.

Example 10. The method of example 1 (as well as subject matter of one or more of any combination of examples 2-9, in whole or in part), wherein said specified substrate angle ($\alpha$) of advancing or retracting substrate is a variable angle.

Example 11. The method of example 1 (as well as subject matter of one or more of any combination of examples 2-10, in whole or in part), wherein said specified substrate angle ($\alpha$) of advancing or retracting substrate is a constant angle.

Example 12. The method of example 1 (as well as subject matter of one or more of any combination of examples 2-11, in whole or in part), wherein said film is in a shape of a geometric pattern.

Example 13. The method of example 1 (as well as subject matter of one or more of any combination of examples 2-12, in whole or in part), wherein said film is an electrical or electro-mechanical device.

Example 14. The method of example 1 (as well as subject matter of one or more of any combination of examples 2-13, in whole or in part), wherein said film has two-dimensional or three-dimensional designs.

Example 15. The method of example 1 (as well as subject matter of one or more of any combination of examples 2-14, in whole or in part), wherein said one or more two-dimensional or three-dimensional designs comprises any one or more of the following: logo, letters, numbers, kirigami, or other specified pattern.

Example 16. The method of example 15, wherein said specified pattern comprises any one or more of the following: electrical pattern, electronic pattern, electrical circuit, electronic circuit, or electro-mechanical feature.

Example 17. The method of example 1 (as well as subject matter of one or more of any combination of examples 2-16, in whole or in part), wherein said film includes one or more voids or is otherwise missing material.

Example 18. The method of example 17, wherein the volume of said one or more voids relative to the volume of said film has a void to film ratio of any one of the following:
   range of about 0.1% to about 40%;
   range of about 1% to about 20%;
   range of about 1% to about 10%; or
   about 10%. In an embodiment, the void to film ratio may be less than or greater than the ranges provided.

Example 19. The method of example 17 (as well as subject matter in whole or in part of example 18), wherein said one or more voids comprises any one or more of the following: recess, aperture, trough, pocket, channel, groove, bubble, hollowed-out portion, hollowed-out chamber.

Example 20. The method of example 1 (as well as subject matter of one or more of any combination of examples 2-20, in whole or in part), wherein said film is a composite material including two or more distinct materials as part of its composition.

Example 21. The method of example 1 (as well as subject matter of one or more of any combination of examples 2-20, in whole or in part), wherein said substrate has a flat surface.

Example 22. The method of example 1 (as well as subject matter of one or more of any combination of examples 2-21, in whole or in part), wherein said substrate has a convex, concave, or otherwise irregular or non-flat surface.

Example 23. The method of example 1 (as well as subject matter of one or more of any combination of examples 2-22, in whole or in part), wherein said substrate is a flexible material defined as a material having a Young's modulus equal to any one of the following:
   range of about 0.1 kPa to about 1 MPa;
   range of about 1 kPa to about 1 MPa;
   range of about 1 kPa to about 1 GPa;
   range of about 1 kPa to about 1 TPa; or
   range of about 2 MPa to about 3 MPa. In an embodiment, the Young's modulus may be less than or greater than the ranges provided.

Example 24. The method of example 1 (as well as subject matter of one or more of any combination of examples 2-23, in whole or in part), wherein said substrate is a rigid material defined as a material having a Young's modulus equal to any one of the following:
   greater than 3 MPa to about 1 TPa;
   range about 1 TPa to about 1.2 TPa; or
   range about 1 TPa to about 2 TPa. In an embodiment, the Young's modulus may be less than or greater than the ranges provided.

Example 25. The method of example 1 (as well as subject matter of one or more of any combination of examples 2-24, in whole or in part), wherein a specified static contact angle ($\theta_{si}^s$) between said liquid and said substrate is a value for said advancing substrate that is between about 450 and about 180

Example 26. The method of example 1 (as well as subject matter of one or more of any combination of examples 2-25, in whole or in part), wherein a specified static contact angle ($\theta_{si}^s$) between said liquid and said substrate is a value for said retracting substrate that is between about 0° and about 130°.

Example 27. The method of example 1 (as well as subject matter of one or more of any combination of examples 2-26, in whole or in part), wherein said specified substrate angle ($\alpha$) is between about −90° and about 90° relative to the negative y-axis.

Example 28. The method of example 1 (as well as subject matter of one or more of any combination of examples 2-27, in whole or in part), wherein said film is a solid film.

Example 29. The method of example 1 (as well as subject matter of one or more of any combination of examples 2-28, in whole or in part), wherein said film is a liquid film.

Example 30. The method of example 1 (as well as subject matter of one or more of any combination of examples 2-29, in whole or in part), wherein said film is placed on said liquid while adhered to a tape.

Example 31. The method of example 30 (as well as subject matter of one or more of any combination of examples 2-30, in whole or in part), further comprising: dissolving or removing said tape.

Example 32. The method of example 1 (as well as subject matter of one or more of any combination of examples 2-31, in whole or in part), wherein said substrate is a composite material including two or more distinct materials as part of its composition.

Example 33. The method of example 1 (as well as subject matter of one or more of any combination of examples 2-32, in whole or in part), wherein said film which has been adhered onto said substrate defines a transfer printed substrate, and wherein said method adhering a subsequent film or separation layer onto the film side of said transfer printed substrate, wherein said method further comprises the following steps:
 a) placing said subsequent film or separation layer on the surface of said liquid so that said subsequent film floats or otherwise rests on the surface of said liquid, said subsequent film including a proximal edge and a distal edge;
 b) moving said subsequent film or separation layer and said transfer printed substrate relative to one another until said proximal edge of said subsequent film makes contact with said transfer printed substrate across a transfer front of said transfer printed substrate;
 c) advancing or retracting said transfer printed substrate at a specified velocity, with specified force, relative to the location of said liquid and at a specified transfer printed substrate angle with the surface of said liquid; so that said subsequent film elastically deforms onto said advancing or retracting transfer printed substrate due to capillary force between said liquid and said subsequent film; and
 d) detaching said subsequent film or separation layer from said liquid and adhering said subsequent film or separation layer onto said advancing or retracting transfer printed substrate along said transfer front, wherein said subsequent film gradually transits across the transfer front among said advancing or retracting transfer printed substrate, wherein said transfer front is defined as a single line segment or arc wherein said transfer printed substrate, said subsequent film or separation layer, and said liquid all simultaneously intersect one another and physically contact one another.

Example 34. The method of example 33, wherein said subsequent film or separation layer has one or more of any one of the following features:
 flat surface;
 convex, concave, or otherwise irregular or non-flat surface;
 shape of a geometric pattern;
 electro-mechanical feature;
 electronic or electrical pattern;
 electronic or electrical circuit;
 one or more two-dimensional or three-dimensional designs;
 inclusion of one or more voids or is otherwise missing material; or
 a composite material including two or more distinct materials as part of its composition.

Example 35. The method of example 33 (as well as subject matter in whole or in part of example 34), wherein said film is located between said substrate and said subsequent film or separation layer.

Example 36. The method of example 33 (as well as subject matter of one or more of any combination of examples 34-35, in whole or in part), further comprising: removing said substrate from said film.

Example 37. The method of example 33 (as well as subject matter of one or more of any combination of examples 34-36, in whole or in part), further comprising: repeating steps 'a' through 'd'.

Example 38. The method of example 37, further comprising:
 removing said substrate from said film.

Example 39. A transfer printed film disposed on said substrate prepared by the method of example 1.

Example 41. A transfer printed separation layer disposed on said transfer printed substrate prepared by the method of example 33.

Example 42. A transfer printed subsequent film disposed on said transfer printed substrate prepared by the method of example 33.

Example 43. A transfer printed separation layer and subsequent film disposed on said transfer printed substrate prepared by the method of example 37.

Example 44. A transfer printed separation layer and subsequent film disposed on said transfer printed substrate prepared by the method of example 38.

Example 45. A system configured to manufacture the printed film layer and components by the method disclosed in one or more of any combination of examples 1-38, in whole or in part.

Example 46. An article of manufacture produced by the method disclosed in one or more of any combination of examples 1-38, in whole or in part.

Example 47. The method of example 1, wherein said film is a flexible material defined as a material having a Young's modulus that is within any one of the following ranges:
 about 0.1 kPa to 1 kPa;
 1 kPa to 1 MPa;
 1 MPa to 1 GPa; or
 1 GPa to about 1 TPa.

Example 48. The method of example 1, wherein said film is a flexible material defined as a material having a bending stiffness (B) that is within any one of the following ranges:
0 N*m to 0.007 N*m; or
0.007 N*m to 0.014 N*m.

Example 49. The method of example 1, wherein said substrate is a flexible material defined as a material having a Young's modulus that is within any one of the following ranges:
about 0.1 kPa to 1 kPa;
1 kPa to 1 MPa;
1 MPa to about 1 GPa; or
1 GPa to about 1 TPa Example 50. The method of example 1, wherein said substrate is a rigid material defined as a material having a Young's modulus is within any one of the following ranges:
greater than about 3 MPa to 1 TPa;
1 TPa to 1.2 TPa; or
1.2 TPa to about 2 TPa.

Example 51. The method of example 1, wherein said film is a flexible material defined as a material having a Young's modulus of about 2 MPa.

Example 52. The method of example 1, wherein said film is a flexible material defined as a material having a bending stiffness (B) of about 0.001 N*m.

Example 53. The method of example 1, wherein said film is a flexible material defined as a material having a bending stiffness (B) of about 0.01 N*m.

Example 54. The method of example 1, wherein said film is a flexible material defined as a material having a bending stiffness (B) of about 0.014 N*m.

Example 55. The method of example 1, wherein said substrate is a flexible material defined as a material having a Young's modulus of about 2 MPa.

Example 56. The method of example 1, wherein said substrate is a flexible material defined as a material having a Young's modulus of about 3 MPa.

REFERENCES

The devices, systems, apparatuses, modules, compositions, materials, computer program products, non-transitory computer readable medium, and methods of various embodiments of the invention disclosed herein may utilize aspects (such as devices, apparatuses, modules, systems, compositions, materials, computer program products, non-transitory computer readable medium, and methods) disclosed in the following references, applications, publications and patents and which are hereby incorporated by reference herein in their entirety (and which are not admitted to be prior art with respect to the present invention by inclusion in this section).

1. D.-Y. Khang, H. Jiang, Y. Huang, J. A. Rogers, A stretchable form of single-crystal silicon for high-performance electronics on rubber substrates. Science 311, 208-212 (2006).
2. N. K. Mahenderkar et al., Epitaxial lift-off of electrodeposited single-crystal gold foils for flexible electronics. Science 355, 1203-1206 (2017).
3. D.-H. Kim et al., Epidermal electronics. science 333, 838-843 (2011).
4. C. Larson et al., Highly stretchable electroluminescent skin for optical signaling and tactile sensing. Science 351, 1071-1074 (2016).
5. B. Tian et al., Macroporous nanowire nanoelectronic scaffolds for synthetic tissues. Nature materials 11, 986 (2012).
6. A. D. Mickle et al., A wireless closed-loop system for optogenetic peripheral neuromodulation. Nature 565, 361 (2019).
7. H. Jinno et al., Stretchable and waterproof elastomer-coated organic photovoltaics for washable electronic textile applications. Nature Energy 2, 780 (2017).
8. J. Zhao et al., Air-stable and freestanding lithium alloy/graphene foil as an alternative to lithium metal anodes. Nature nanotechnology 12, 993 (2017).
9. W. Wu et al., Piezoelectricity of single-atomic-layer MoS 2 for energy conversion and piezotronics. Nature 514, 470 (2014).
10. M. Li, H. X. Tang, M. L. Roukes, Ultra-sensitive NEMS-based cantilevers for sensing, scanned probe and very high-frequency applications. Nature nanotechnology 2, 114 (2007).
11. X. Chen, L. Mahadevan, A. Driks, O. Sahin, Bacillus spores as building blocks for stimuli-responsive materials and nanogenerators. Nature nanotechnology 9, 137 (2014).
12. A. Carlson, A. M. Bowen, Y. Huang, R. G. Nuzzo, J. A. Rogers, Transfer printing techniques for materials assembly and micro/nanodevice fabrication. Advanced Materials 24, 5284-5318 (2012).
13. J.-K. Chang et al., Materials and processing approaches for foundry-compatible transient electronics. Proceedings of the National Academy of Sciences 114, E5522-E5529 (2017).
14. A. Pirkle et al., The effect of chemical residues on the physical and electrical properties of chemical vapor deposited graphene transferred to SiO2. Applied Physics Letters 99, 122108 (2011).
15. J. W. Suk et al., Transfer of CVD-grown monolayer graphene onto arbitrary substrates. ACS nano 5, 6916-6924 (2011).
16. I. Jeon et al., Janus Graphene: Scalable Self-Assembly and Solution-Phase Orthogonal Functionalization. Advanced Materials 31, 1900438 (2019).
17. P. Xiao et al., Hydrophilic/Hydrophobic Interphase-Mediated Bubble-like Stretchable Janus Ultrathin Films toward Self-Adaptive and Pneumatic Multifunctional Electronics. ACS nano 13, 4368-4378 (2019).
18. J. Yan et al., Bacterial biofilm material properties enable removal and transfer by capillary peeling. Advanced Materials 30, 1804153 (2018).
19. R. L. Hoffman, A study of the advancing interface. I. Interface shape in liquid gas systems. Journal of colloid and interface science 50, 228-241 (1975).
20. J. Park et al., Tactile-direction-sensitive and stretchable electronic skins based on human-skin-inspired interlocked microstructures. ACS nano 8, 12020-12029 (2014).
21. K.-S. Koh, J. Chin, J. Chia, C.-L. Chiang, Quantitative studies on PDMS-PDMS interface bonding with piranha solution and its swelling effect. Micromachines 3, 427-441 (2012).
22. M. Miyama, Y. Yang, T. Yasuda, T. Okuno, H. K. Yasuda, Static and dynamic contact angles of water on polymeric surfaces. Langmuir 13, 5494-5503 (1997).
23. K. Kendall, Thin-film peeling-the elastic term. Journal of Physics D: Applied Physics 8, 1449 (1975).
24. R. Masurel, M. Roche, L. Limat, I. Ionescu, J. Dervaux, Elastocapillary Ridge as a Noninteger Disclination. Physical Review Letters 122, 248004 (2019).
25. M. Zhao et al., Geometrical control of dissipation during the spreading of liquids on soft solids. Proceedings of the National Academy of Sciences 115, 1748-1753 (2018).

26. S. Karpitschka et al., Droplets move over viscoelastic substrates by surfing a ridge. Nature communications 6, 7891 (2015).
27. E. R. Jerison, Y. Xu, L. A. Wilen, E. R. Dufresne, Deformation of an elastic substrate by a three-phase contact line. Physical review letters 106, 186103 (2011).
28. S. Khodaparast, F. Boulogne, C. Poulard, H. A. Stone, Water-based peeling of thin hydrophobic films. Physical review letters 119, 154502 (2017).
29. Z. Peng, C. Wang, L. Chen, S. Chen, Peeling behavior of a viscoelastic thin-film on a rigid substrate. *International Journal of Solids and Structures* 51, 4596-4603 (2014).
30. Y. Wang et al., Electrochemical delamination of CVD-grown graphene film: toward the recyclable use of copper catalyst. *ACS nano* 5, 9927-9933 (2011).
31. H. Jeong et al., Highly uniform monolayer graphene synthesis via a facile pretreatment of copper catalyst substrates using an ammonium persulfate solution. *RSC advances* 9, 20871-20878 (2019).
32. British Patent No. GB 202,835, Valentine, et al., "An Improved Process for Imparting to Paper and Other Surfaces an Iridescent Coating", Aug. 27, 1923.
32. U.S. Pat. No. 4,436,571, Nakanishi, "Printing Apparatus", Mar. 13, 1984.
34. U.S. Pat. No. 4,010,057, Nakanishi, "Printing Apparatus", Mar. 1, 1977.
35. U.S. Patent Appl. Publ. No. US 2011/0265953 A1, Kroell, "Kit for Transferring an Image onto an Object", Nov. 3, 2011.
36. Japanese Patent Appl. Publ. No. JP 2010/076269A, Fujii, "Transfer Method and Transfer Jig", Apr. 8, 2010.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the disclosure including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence of such activities, any particular size, speed, material, dimension or frequency, or any particular interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

What is claimed is:

1. A transfer printing method for adhering a film onto a substrate, comprising:
    placing said film on the surface of a liquid so that said film floats or otherwise rests on the surface of the liquid, said film including a proximal edge and a distal edge;
    wherein the y-axis is defined as perpendicular to the plane of the surface of the liquid, wherein below the plane of the surface of the liquid is the negative y-axis and above the plane of the surface of the liquid is the positive y-axis;
    moving said film and said substrate relative to one another until at initial contact said proximal edge of said film makes contact with said substrate across a transfer front (P) of said substrate;
    advancing or retracting said substrate at a specified velocity (U), with a specified force (F), relative to the location of the liquid and at a specified substrate angle (a) relative to the negative y-axis so that said film elastically deforms onto said advancing or retracting substrate due to capillary force between the liquid and said film; and
    detaching said film from the surface of the liquid and adhering said film onto said advancing or retracting substrate along said transfer front P, wherein said film gradually transits across the transfer front (P) among said advancing or retracting substrate, wherein said transfer front (P) is defined as a single line segment or arc wherein said substrate, said film, and the surface of the liquid all simultaneously intersect one another and physically contact one another.

2. The method of claim 1, wherein said specified velocity of advancing or retracting said substrate is a constant velocity.

3. The method of claim 1, wherein said specified velocity of advancing or retracting said substrate is a variable velocity.

4. The method of claim 1, wherein said specified force of advancing or retracting said substrate is a constant force.

5. The method of claim 1, wherein said specified force of advancing or retracting said substrate is a variable force.

6. The method of claim 1, wherein said film is a flexible material defined as a material having a Young's modulus that is within any one of the following ranges:
    about 0.1 kPa to 1 Pa;
    1 kPa to 1 MPa;
    1 MPa to 1 GPa; or
    1 Pa to about 1 TPa.

7. The method of claim 1, wherein said film is a flexible material defined as a material having a Young's modulus of about 2 MPa.

8. The method of claim 1, wherein said film is a flexible material defined as a material having a bending stiffness (B) that is within any one of the following ranges:
0 N*m to 0.007 N*m; or
0.007 N*m to 0.014 N*m.

9. The method of claim 1, wherein said film is a flexible material defined as a material having a bending stiffness (B) of about 0.001 N*m.

10. The method of claim 1, wherein said film is a flexible material defined as a material having a bending stiffness (B) of about 0.01 N*m.

11. The method of claim 1, wherein said film is a flexible material defined as a material having a bending stiffness (B) of about 0.014 N*m.

12. The method of claim 1, wherein said specified substrate angle ($\alpha$) of advancing or retracting substrate is a variable angle.

13. The method of claim 1, wherein said specified substrate angle ($\alpha$) of advancing or retracting substrate is a constant angle.

14. The method of claim 1, wherein said film is in a shape of a geometric pattern.

15. The method of claim 1, wherein said film is an electrical or electro-mechanical device.

16. The method of claim 1, wherein said film has two-dimensional or three-dimensional designs.

17. The method of claim 16, wherein said one or more two-dimensional or three-dimensional designs comprises any one or more of the following:
logo, letters, numbers, kirigami, or other specified pattern.

18. The method of claim 17, wherein said specified pattern comprises any one or more of the following: electrical pattern, electronic pattern, electrical circuit, electronic circuit, or electro-mechanical feature.

19. The method of claim 1, wherein said film includes one or more voids or is otherwise missing material.

20. The method of claim 19, wherein the volume of said one or more voids relative to the volume of said film has a void to film ratio of any one of the following:
range of about 0.1% to about 40%;
range of about 1% to about 20%;
range of about 1% to about 10%; or
about 10%.

21. The method of claim 19, wherein said one or more voids comprises any one or more of the following: recess, aperture, trough, pocket, channel, groove, bubble, hollowed-out portion, hollowed-out chamber.

22. The method of claim 1, wherein said film is a composite material including two or more distinct materials as part of its composition.

23. The method of claim 1, wherein said substrate has a flat surface.

24. The method of claim 1, wherein said substrate has a convex, concave, or otherwise irregular or non-flat surface.

25. The method of claim 1, wherein said substrate is a flexible material defined as a material having a Young's modulus that is within any one of the following ranges:
about 0.1 kPa to 1 Pa;
1 kPa to 1 MPa;
1 MPa to about 1 GPa; or
1 GPa to about 1 TPa.

26. The method of claim 1, wherein said substrate is a flexible material defined as a material having a Young's modulus of about 2 MPa.

27. The method of claim 1, wherein said substrate is a flexible material defined as a material having a Young's modulus of about 3 MPa.

28. The method of claim 1, wherein said substrate is a rigid material defined as a material having a Young's modulus is within any one of the following ranges:
greater than about 3 MPa to 1 TPa;
1 TPa to 1.2 TPa; or
1.2 TPa to about 2 TPa.

29. The method of claim 1, wherein a specified static contact angle ($\theta_{sl}^s$) between the liquid and said substrate is a value for said advancing said substrate that is between about 450 and about 180°.

30. The method of claim 1, wherein a specified static contact angle ($\theta_{sl}^s$) between the liquid and said substrate is a value for said retracting substrate that is between about 0° and about 130°.

31. The method of claim 1, wherein said specified substrate angle ($\alpha$) is between about −90° and about 90° relative to the negative y-axis.

32. The method of claim 1, wherein said film is a solid film.

33. The method of claim 1, wherein said film is placed on the liquid while adhered to a tape.

34. The method of claim 33, further comprising:
dissolving or removing said tape.

35. The method of claim 1, wherein said substrate is a composite material including two or more distinct materials as part of its composition.

36. A transfer printed film disposed on said substrate prepared by the method of claim 1.

* * * * *